US006795352B2

United States Patent
Tanzawa et al.

(10) Patent No.: US 6,795,352 B2
(45) Date of Patent: Sep. 21, 2004

(54) NONVOLATILE SEMICONDUCTOR MEMORY HAVING PAGE MODE WITH A PLURALITY OF BANKS

(75) Inventors: Toru Tanzawa, Ebina (JP); Shigeru Atsumi, Yokohama (JP); Akira Umezawa, Yokohama (JP); Tadayuki Taura, Zushi (JP); Hitoshi Shiga, Yokohama (JP); Yoshinori Takano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/703,005

(22) Filed: Nov. 5, 2003

(65) Prior Publication Data

US 2004/0090851 A1 May 13, 2004

Related U.S. Application Data

(63) Continuation of application No. 10/233,133, filed on Aug. 30, 2002, now Pat. No. 6,671,203.

(30) Foreign Application Priority Data

Aug. 31, 2001 (JP) ........................................ 2001-265022

(51) Int. Cl.[7] .............................................. G11C 16/04
(52) U.S. Cl. .................... 365/189.09; 365/63
(58) Field of Search ...................... 365/230.03, 185.12, 365/185.13, 189.09, 63, 205, 207, 208

(56) References Cited

U.S. PATENT DOCUMENTS

| 5,581,503 | A | | 12/1996 | Matsubara et al. ..... | 365/185.33 |
| 5,790,453 | A | * | 8/1998 | Chevallier .............. | 365/185.03 |
| 5,847,998 | A | | 12/1998 | Van Buskirk .......... | 365/185.33 |
| 5,867,430 | A | | 2/1999 | Chen et al. ............ | 365/189.04 |
| 6,084,818 | A | | 7/2000 | Ooishi ................... | 365/230.03 |
| 6,282,145 | B1 | | 8/2001 | Tran et al. ............. | 365/230.06 |

OTHER PUBLICATIONS

Pathak et al., *A 1.8V 64Mb 100MHz Flexible Read While Write Flash Memory*, 2001 ISCC, pp. 32–33, Feb. 2001.

* cited by examiner

*Primary Examiner*—Vu A Le
(74) *Attorney, Agent, or Firm*—Frommer Lawrence & Haug LLP

(57) ABSTRACT

The semiconductor memory comprises a reference current generator, first and second current converters, sense amplifiers for read, and sense amplifiers for verify. The reference current generator generates a first voltage dependent upon the current flowing through a reference cell. The first current converters, to which the first voltage is input, each generate a second voltage. The second current converters, to which the first voltage is input, each generate a third voltage. The sense amplifiers for read output data of a selection memory cell, comparing the voltage of the data-line for read with the second voltage. The sense amplifiers for verify output verify data of the selection memory cell, comparing the voltage of the data-lines for verify and the third voltage.

10 Claims, 60 Drawing Sheets

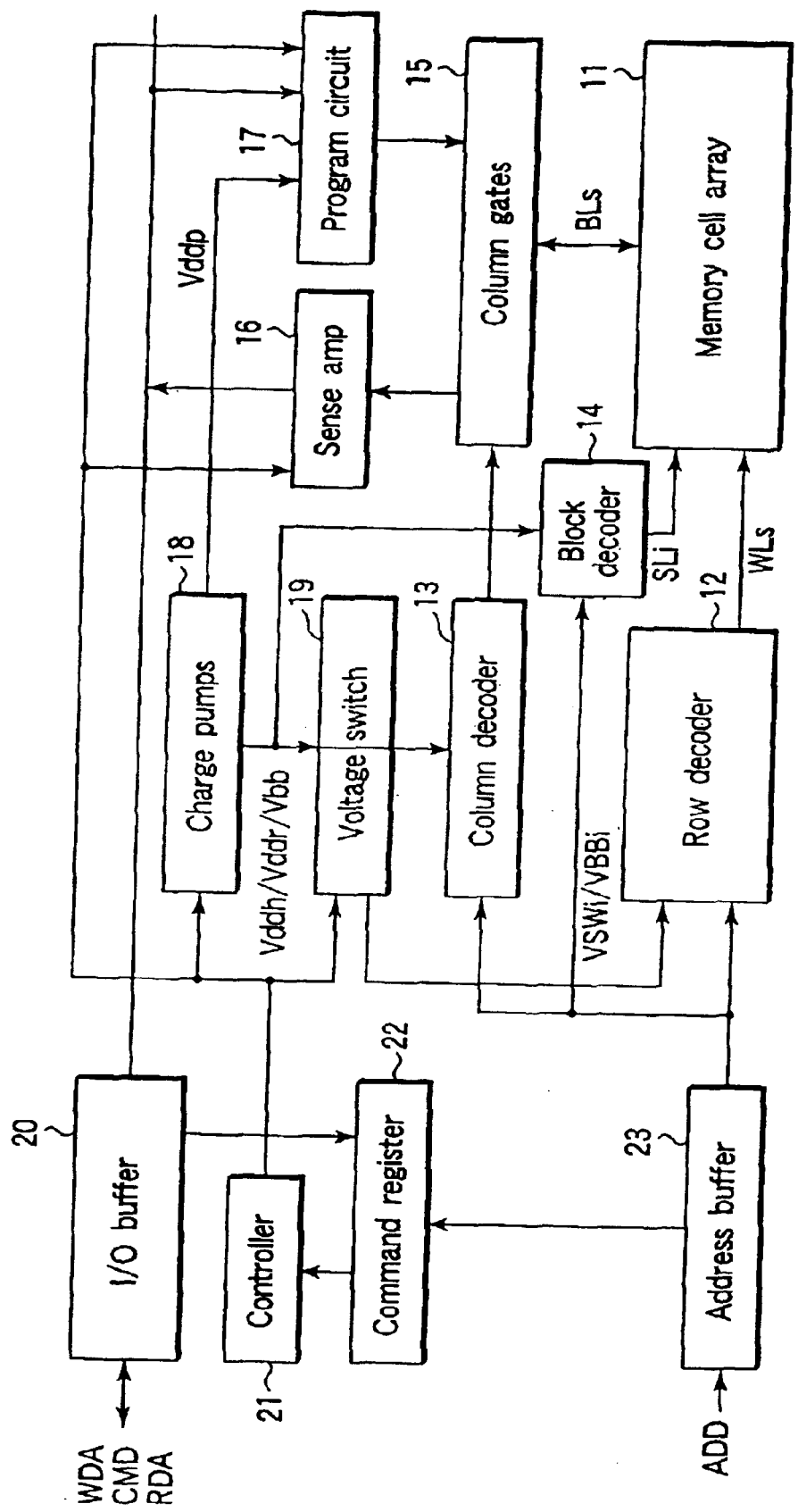
F I G. 16

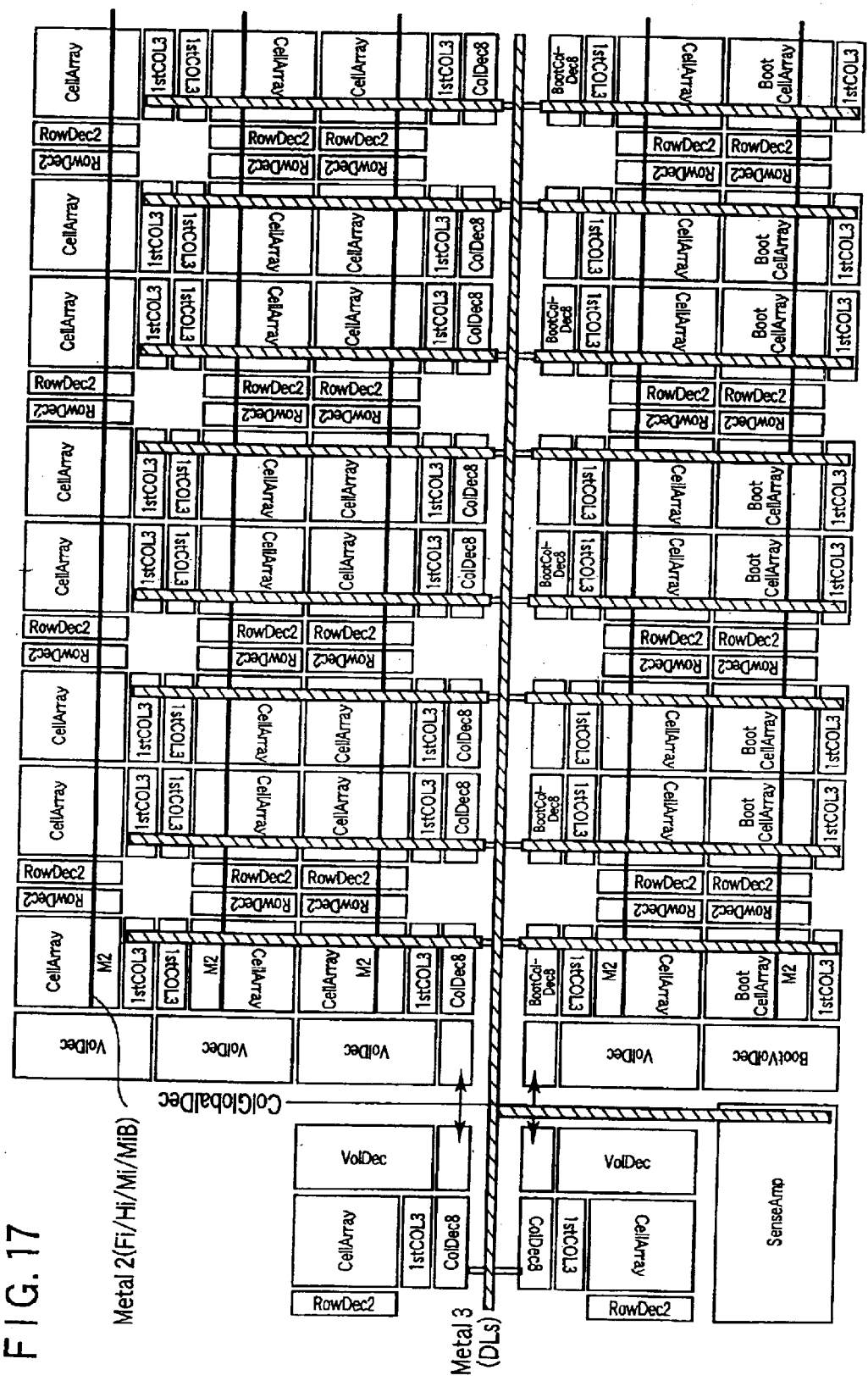
F I G. 17

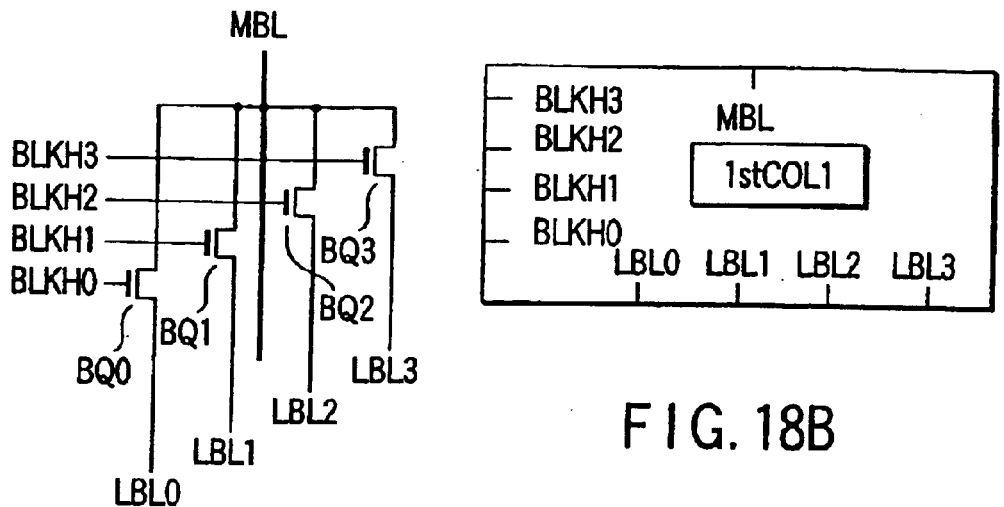
FIG. 18A
FIG. 18B
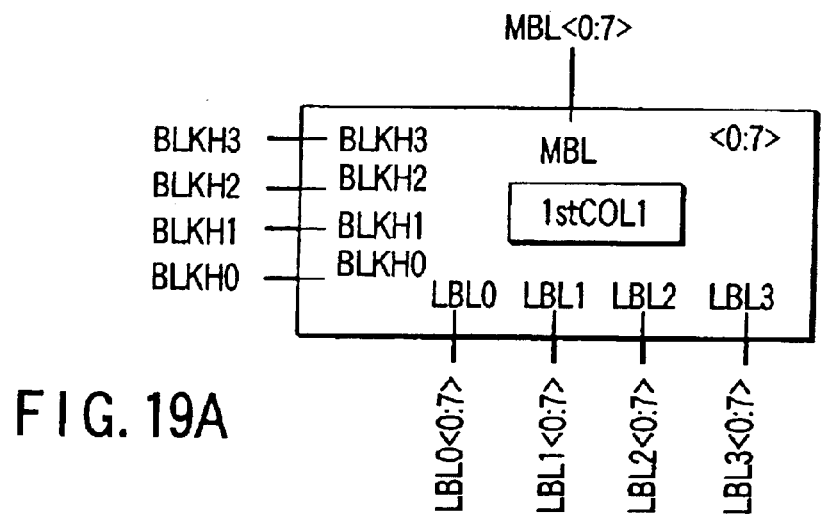
FIG. 19A
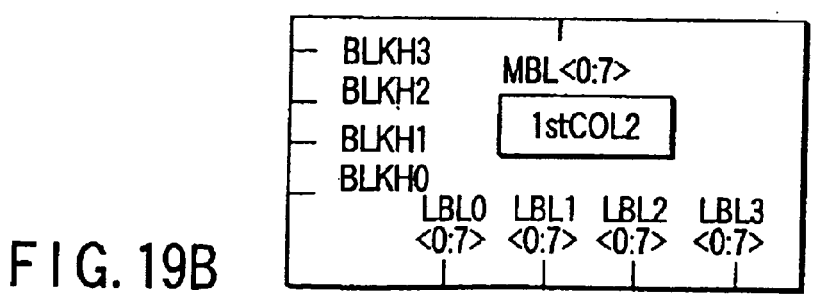
FIG. 19B

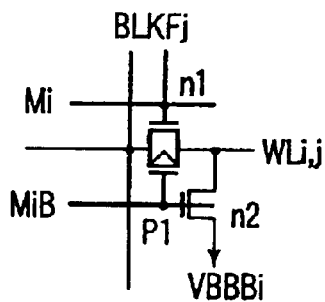 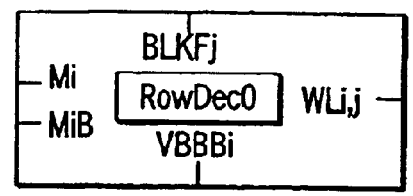
FIG. 23A    FIG. 23B
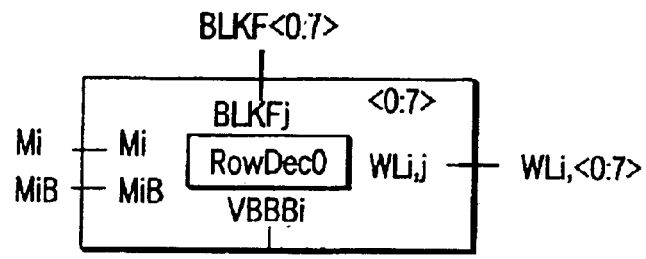
FIG. 24A
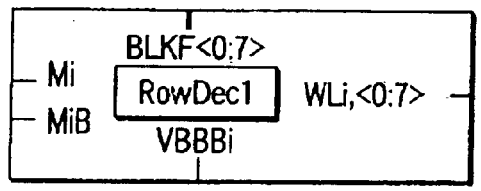
FIG. 24B
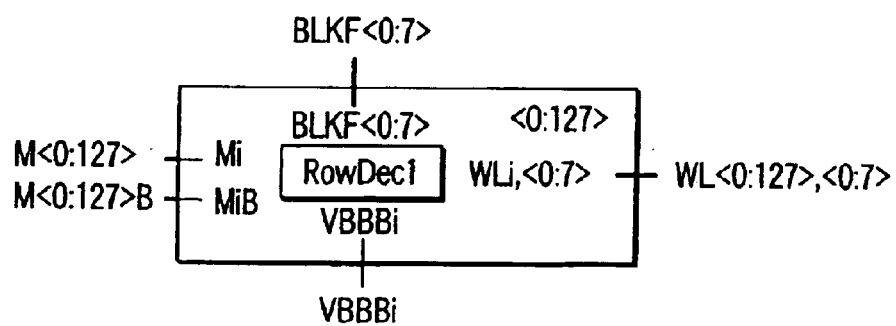
FIG. 25

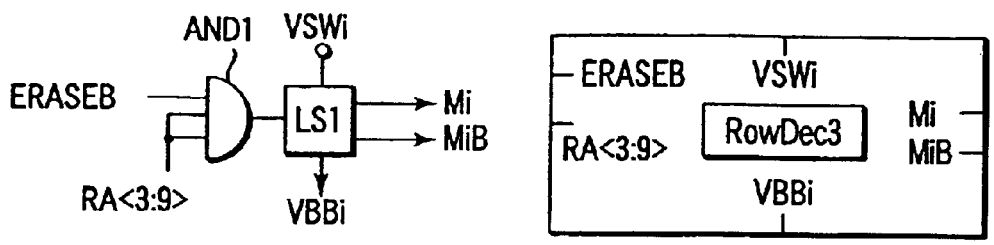
FIG. 26A   FIG. 26B
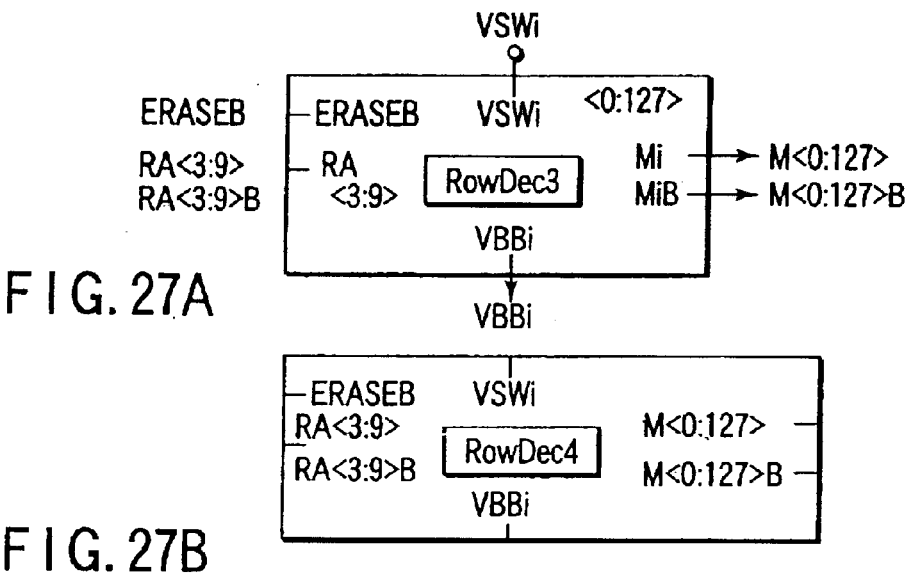
FIG. 27A
FIG. 27B
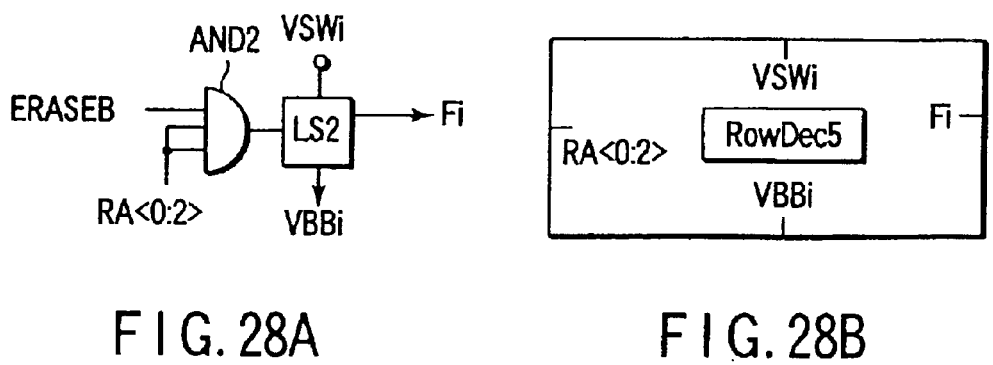
FIG. 28A   FIG. 28B

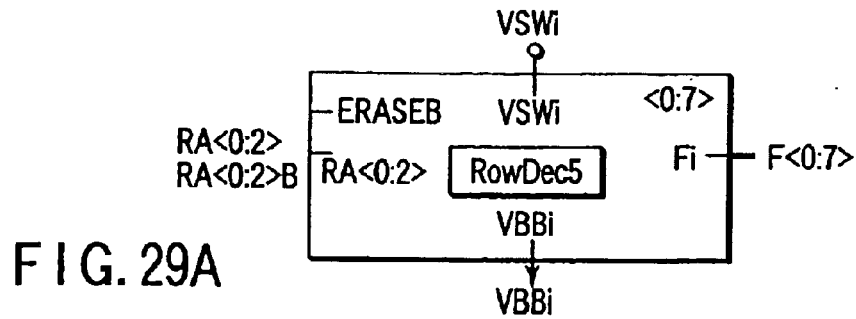
F I G. 29A
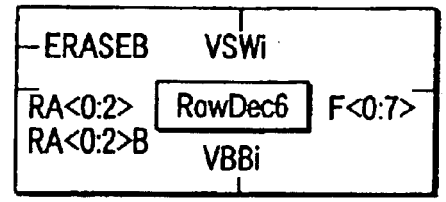
F I G. 29B
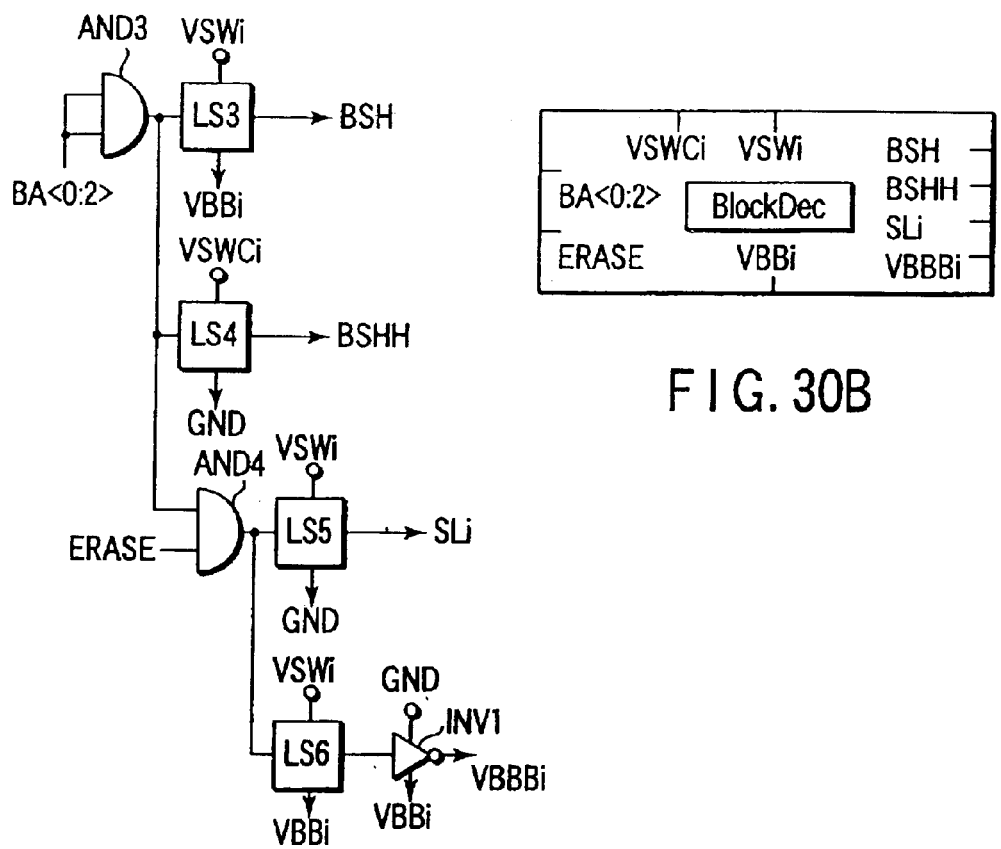
F I G. 30A
F I G. 30B

MBL<0:7>
MBL<8:15>
...
MBL<120:127>

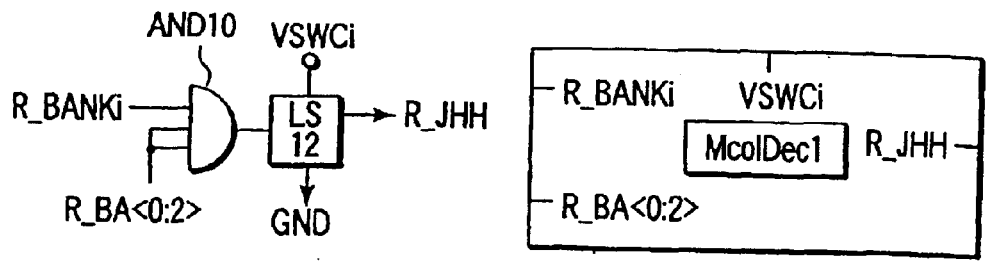
F I G. 42A          F I G. 42B
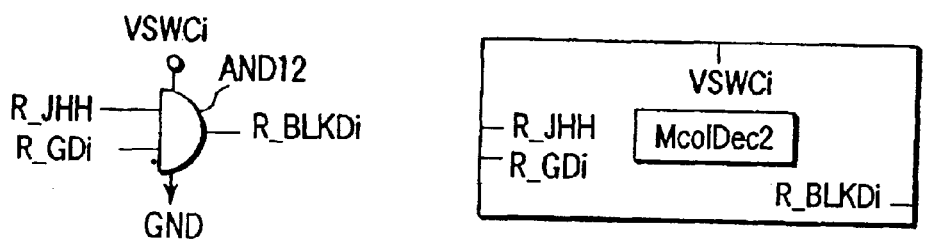
F I G. 43A          F I G. 43B
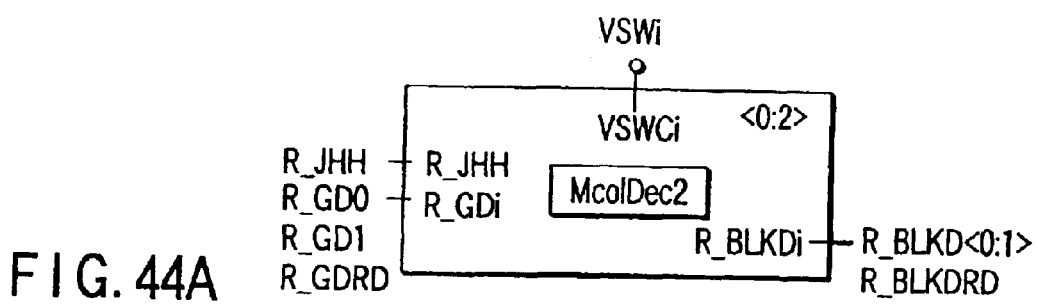
F I G. 44A
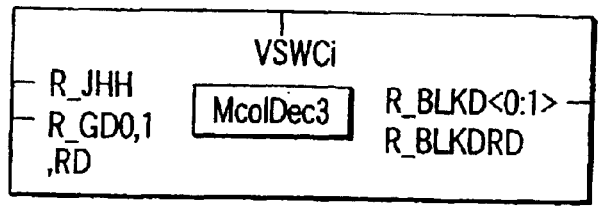
F I G. 44B

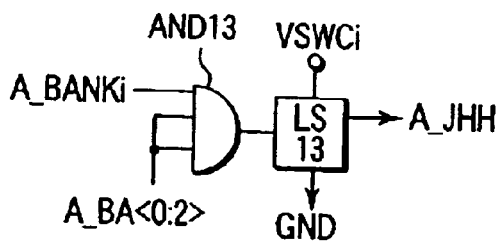 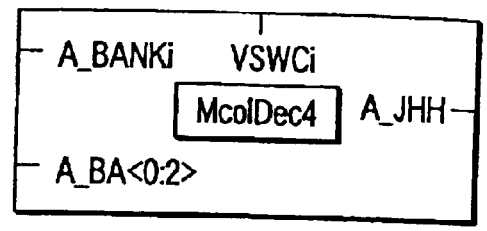
FIG. 45A   FIG. 45B
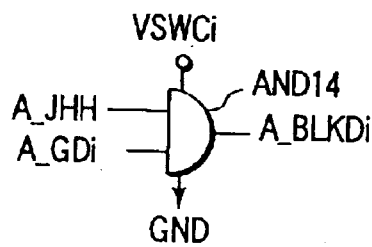 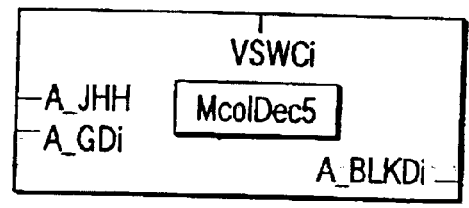
FIG. 46A   FIG. 46B
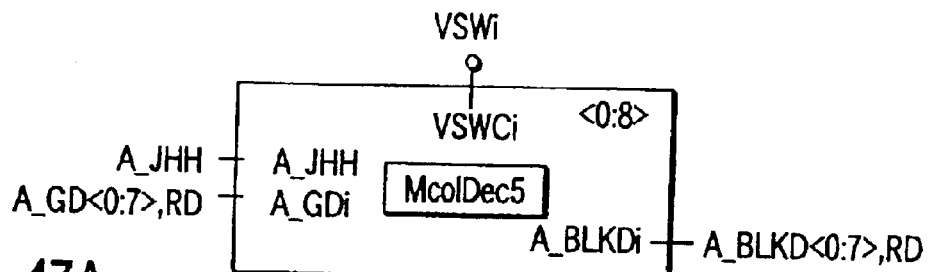
FIG. 47A
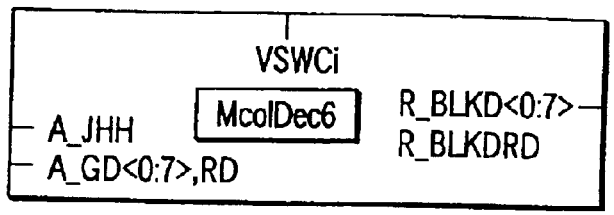
FIG. 47B

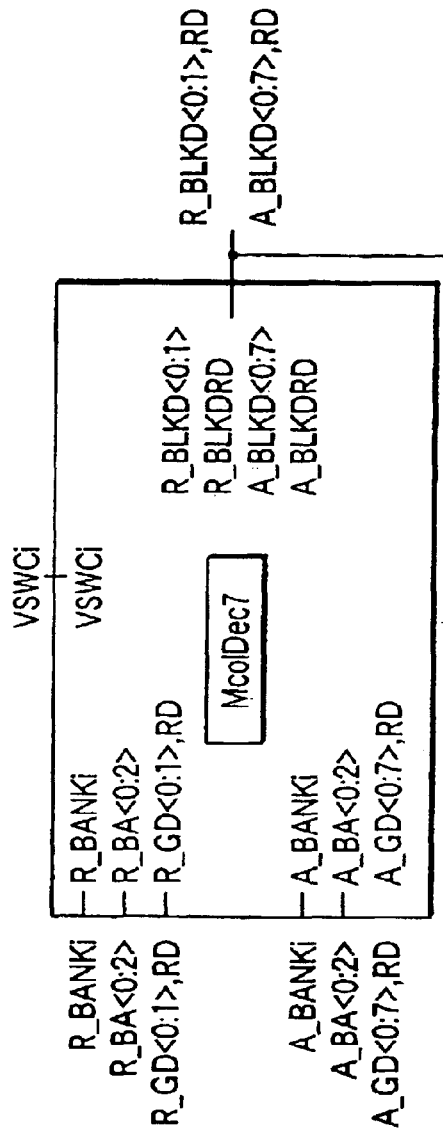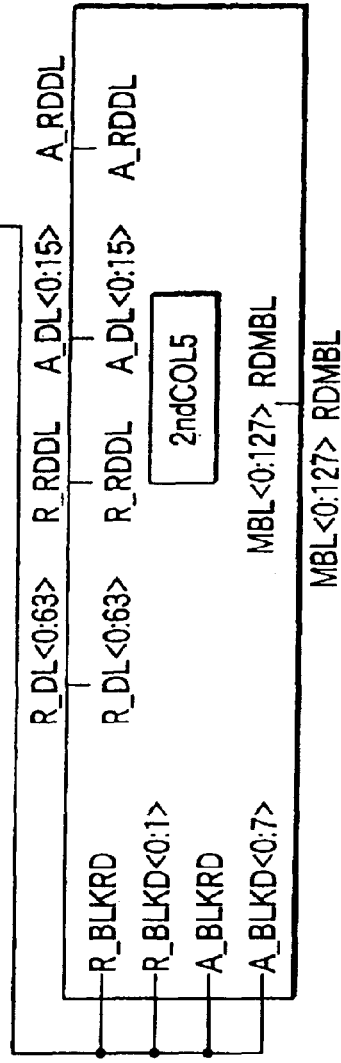
FIG. 52A
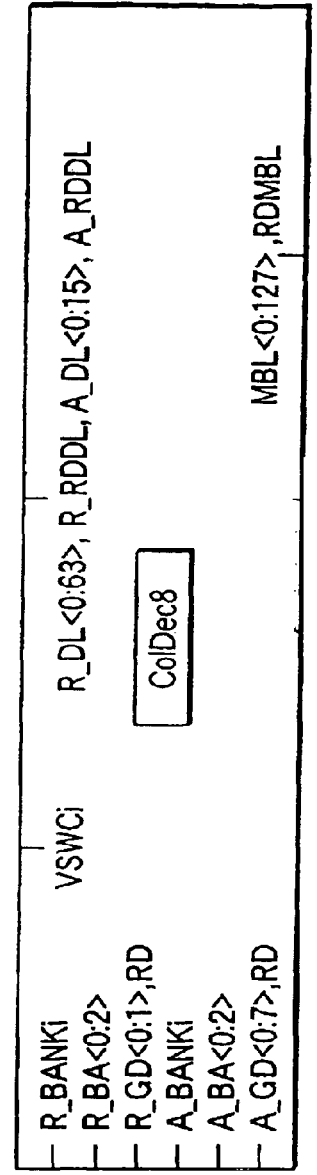
FIG. 52B

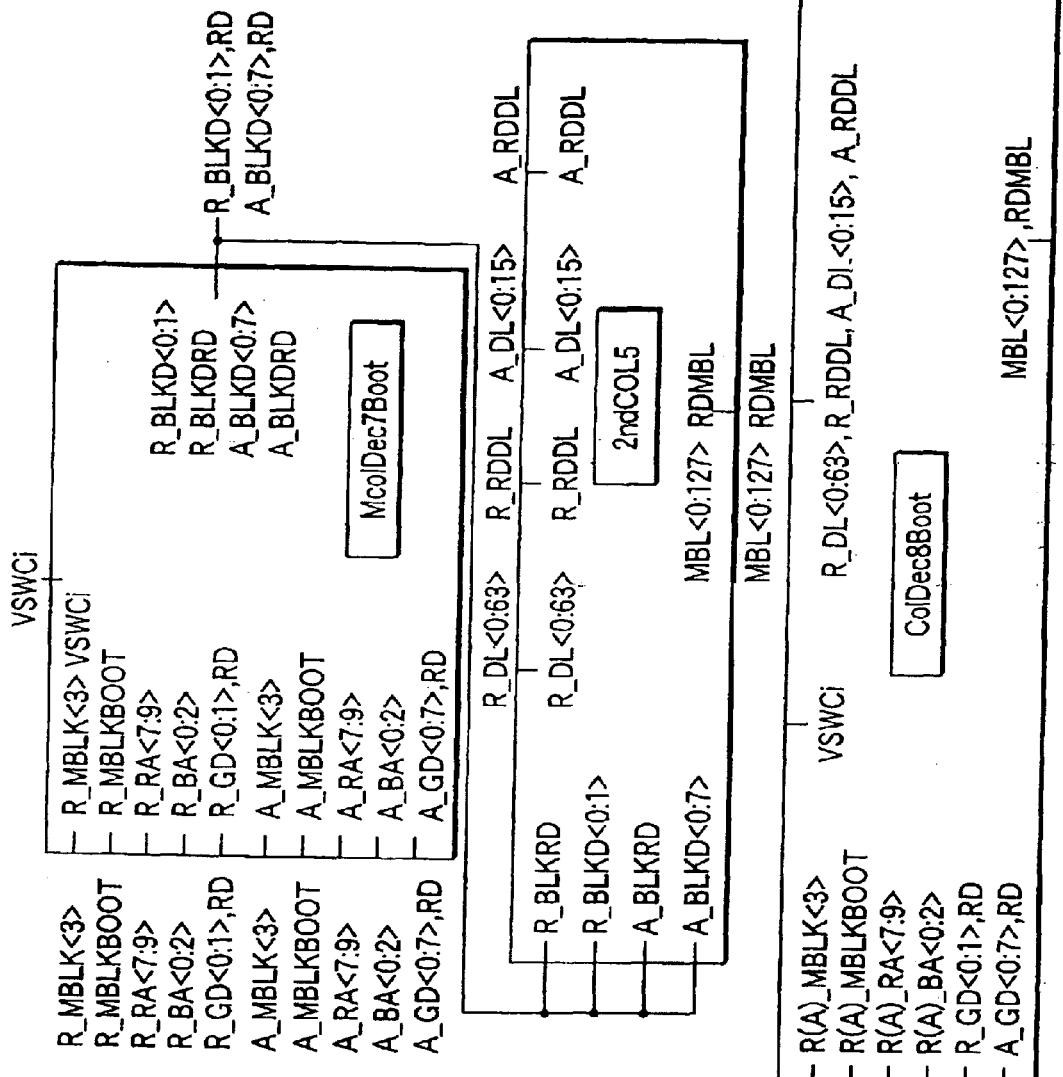
F I G. 53A
F I G. 53B

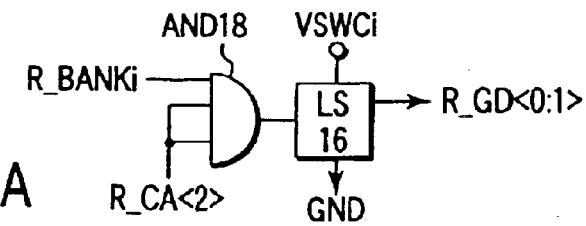
FIG. 54A
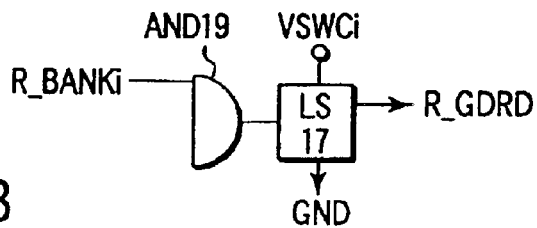
FIG. 54B
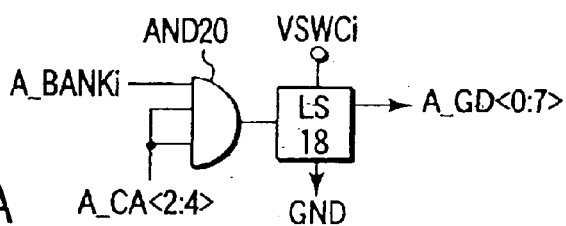
FIG. 55A
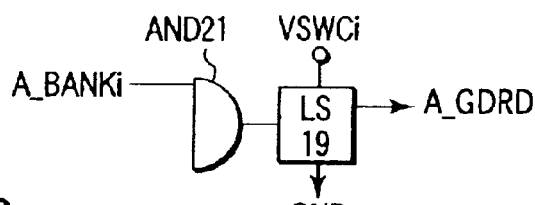
FIG. 55B
FIG. 56

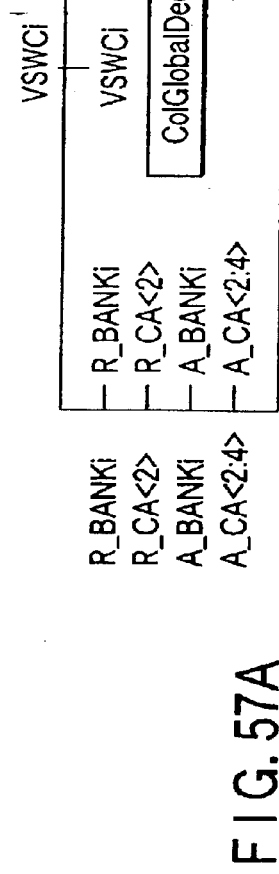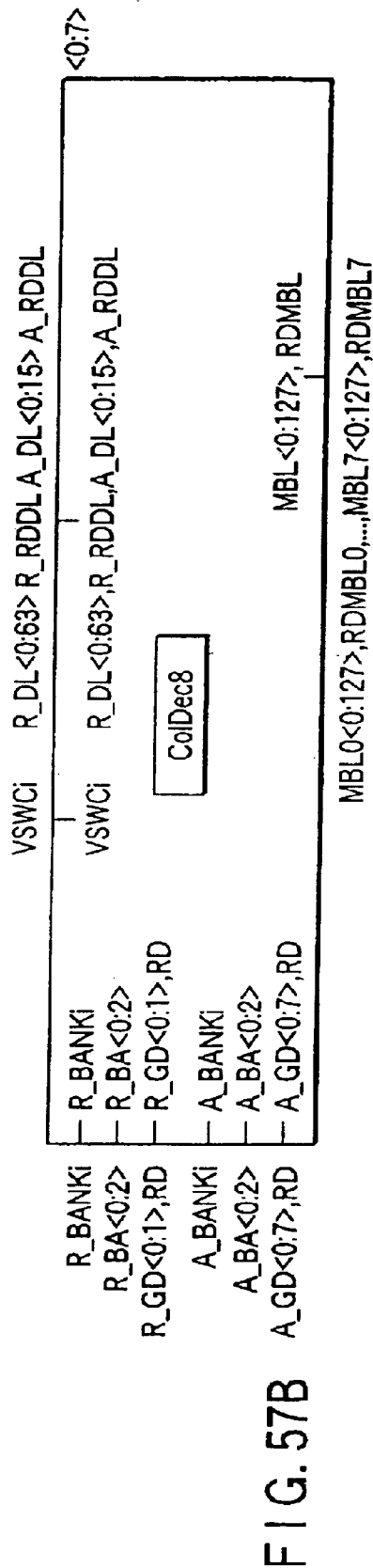
F I G. 57A
F I G. 57B
F I G. 57C

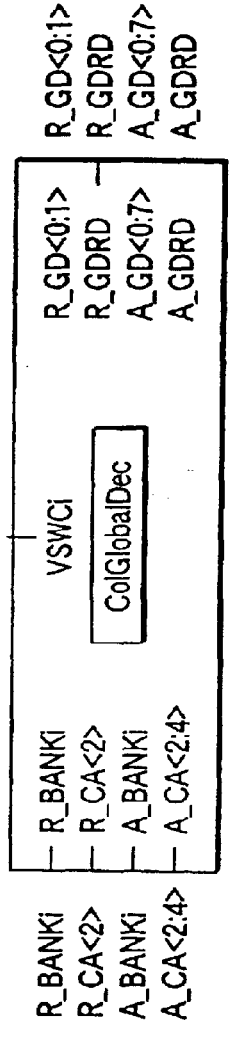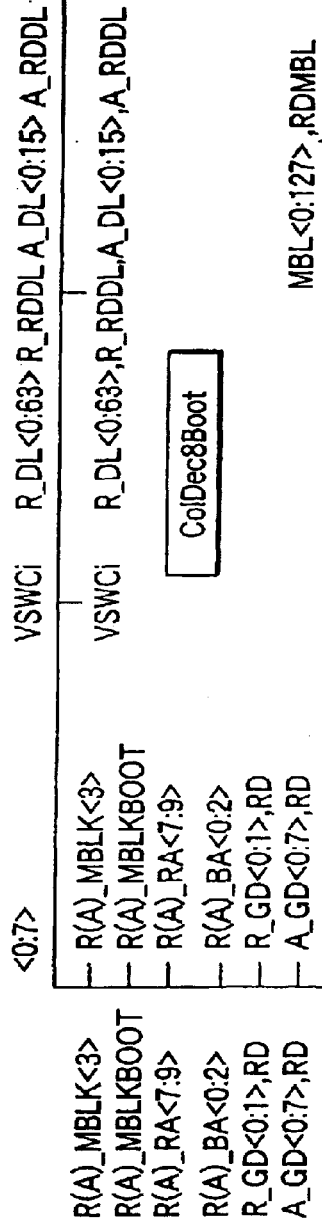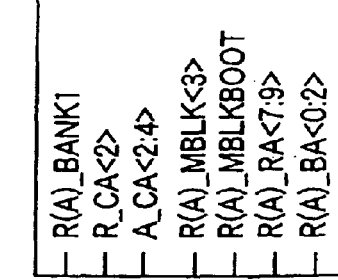
FIG. 58A
FIG. 58B
FIG. 58C

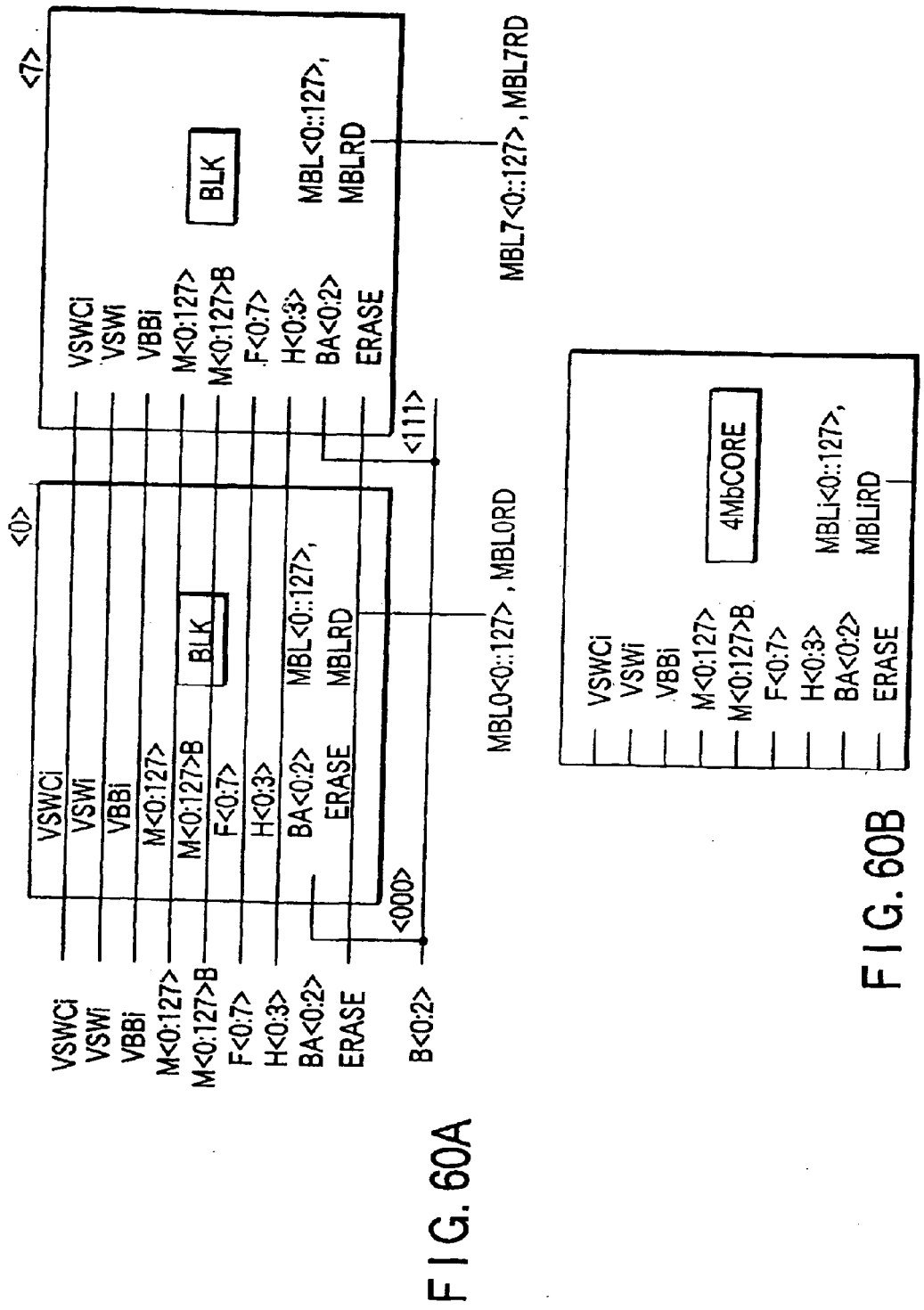
F I G. 60A
F I G. 60B

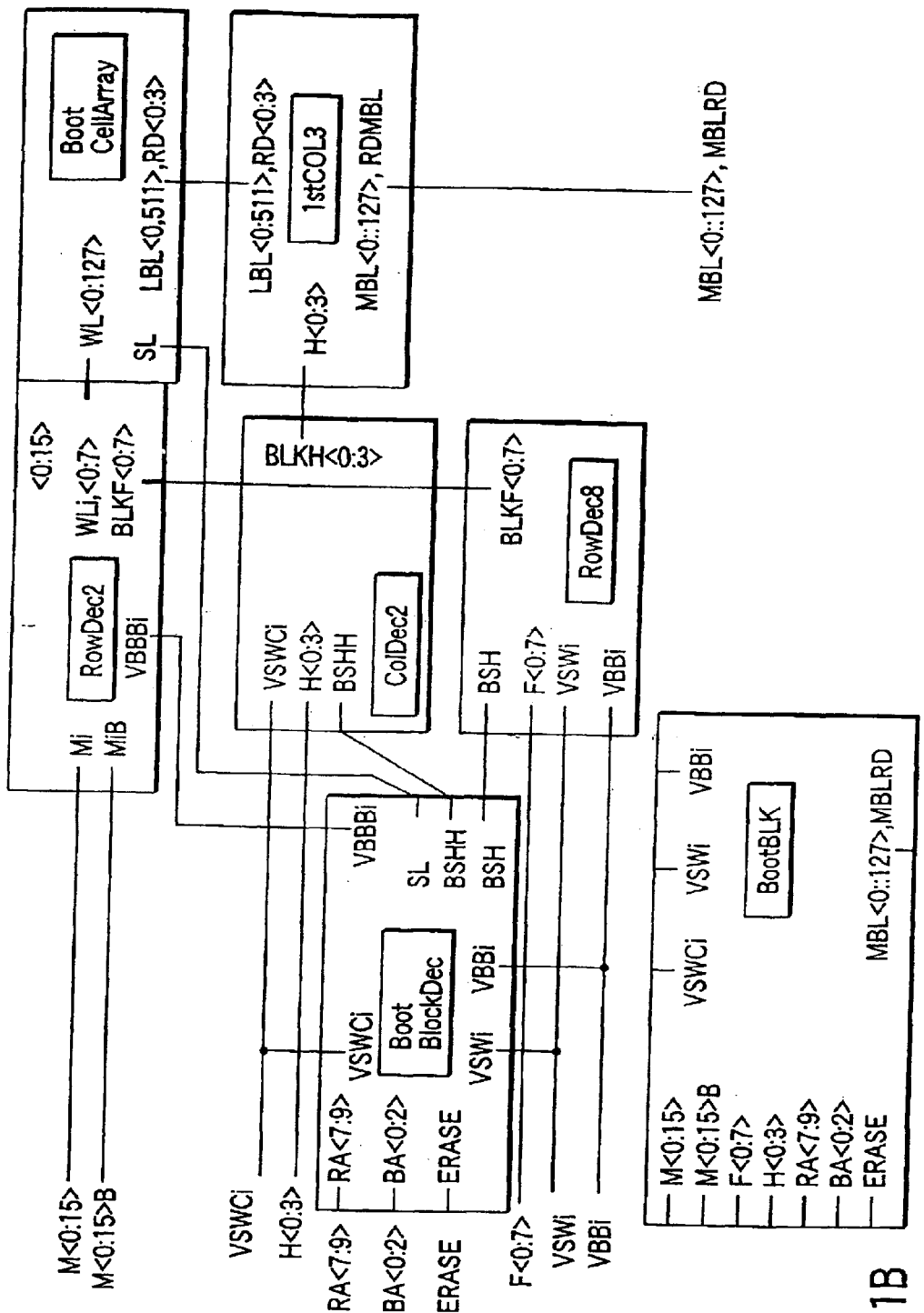
F I G. 61A    F I G. 61B

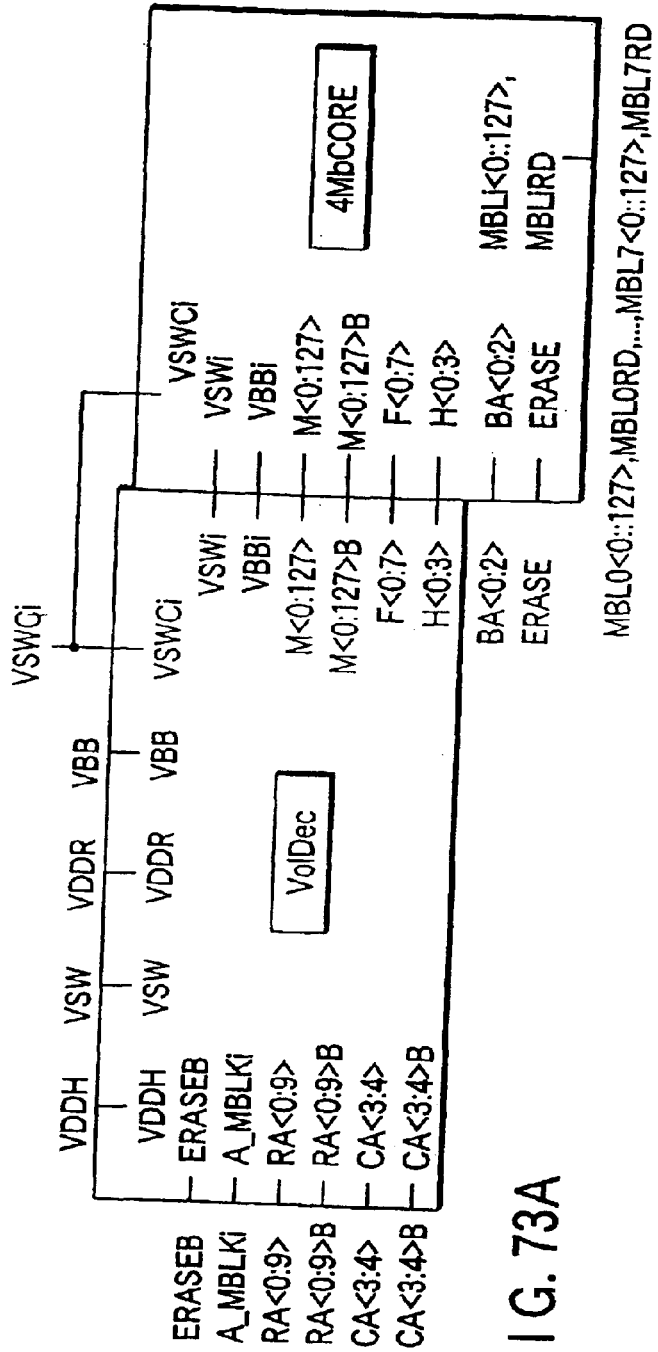
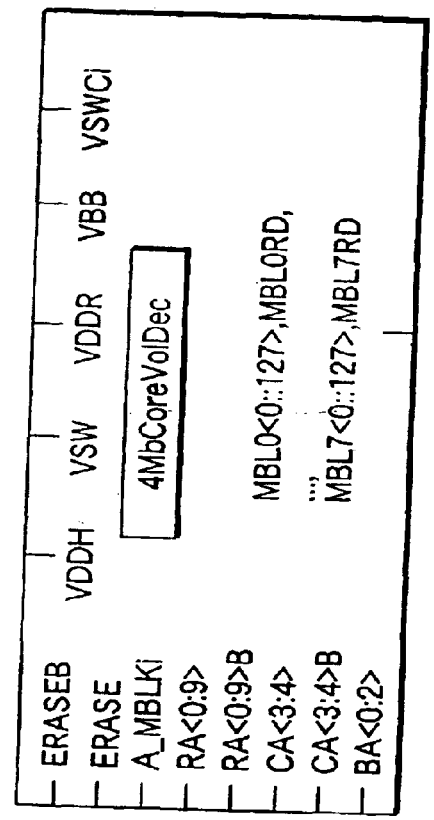
F I G. 73A
F I G. 73B

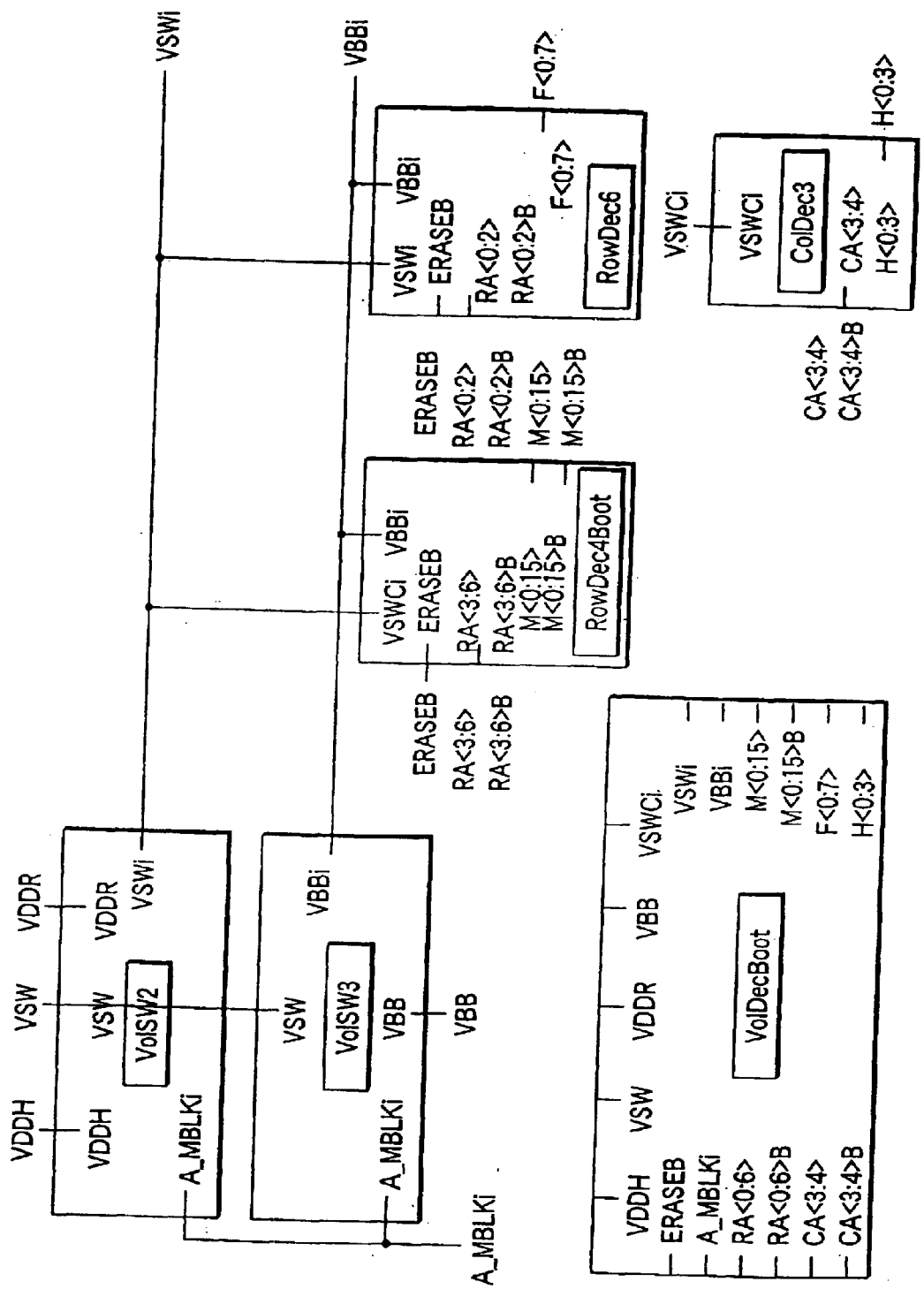
F I G. 74A   F I G. 74B

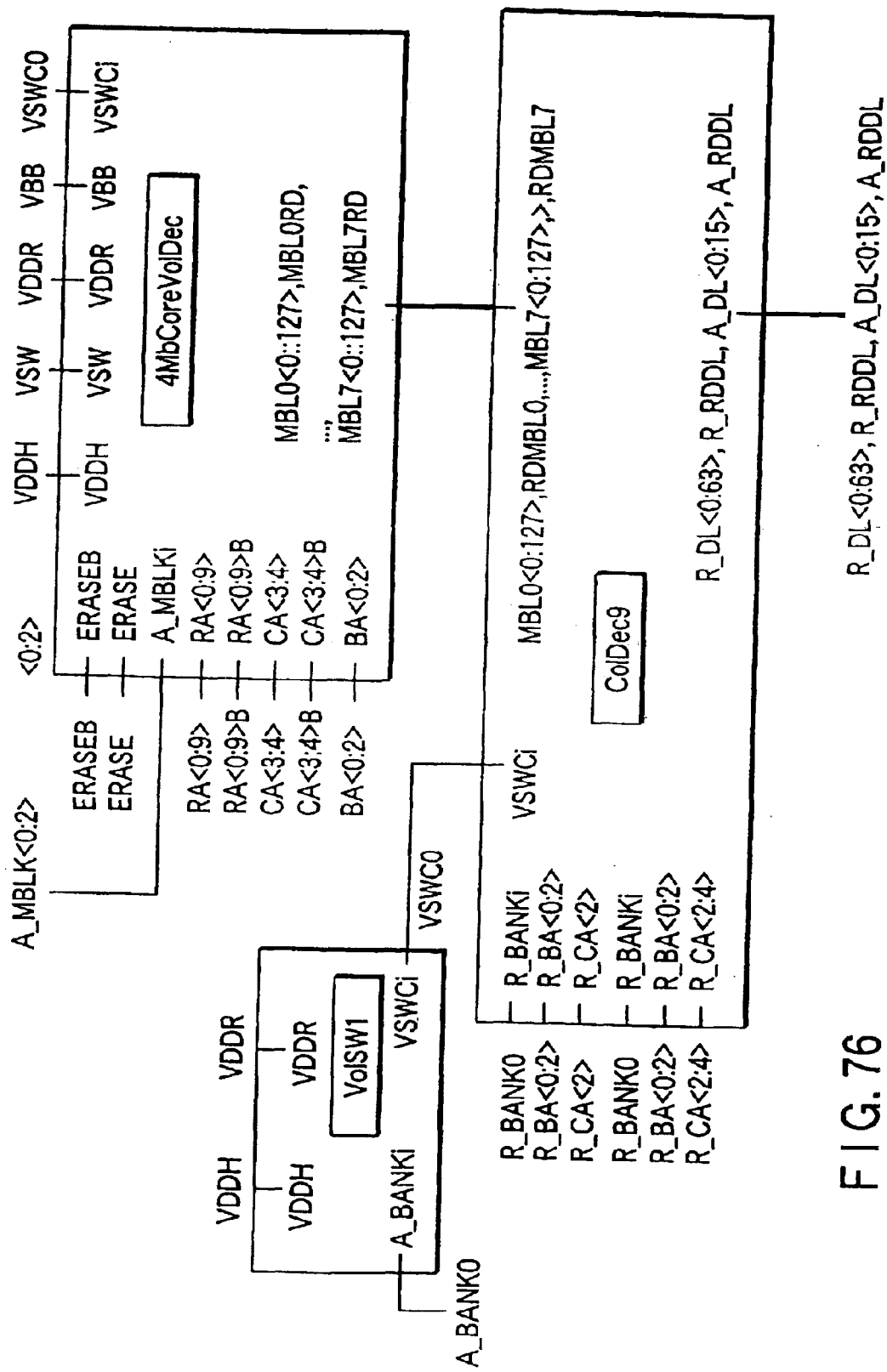
F I G. 76

```
┌─────────────────────────────────────────────┐
│ ─ ERASEB      VDDH   VSW   VDDR   VBB       │
│ ─ ERASE                                     │
│ ─ A_MBLK<0:2>                               │
│ ─ RA<0:9>                                   │
│ ─ RA<0:9>B                                  │
│ ─ CA<3:4>              ┌──────────┐         │
│ ─ CA<3:4>B             │ BANK0BLK │         │
│   BA<0:2>              └──────────┘         │
│ ─ R(A)_BANK0                                │
│ ─ R(A)_BA<0:2>                              │
│ ─ R_CA<2>                                   │
│                        R_DL<0:63>, R_RDDL,  │
│ ─ A_CA<2:4>            A_DL<0:15>, A_RDDL   │
│ ─ A_BANK0                                   │
└─────────────────────────┬───────────────────┘
```

F I G. 77

```
┌─────────────────────────────────────────────┐
│ ─ ERASEB      VDDH   VSW   VDDR   VBB       │
│ ─ ERASE                                     │
│ ─ R(A)_MBLK<3>                              │
│ ─ R(A)_MBLKBOOT                             │
│ ─ RA<0:9>                                   │
│ ─ RA<0:9>B             ┌──────────┐         │
│ ─ CA<3:4>              │ BANK1BLK │         │
│ ─ CA<3:4>B             └──────────┘         │
│ ─ BA<0:2>                                   │
│ ─ R(A)_BANK0                                │
│ ─ R(A)_BA<0:2>                              │
│ ─ R(A)_RA<7:9>                              │
│ ─ R_CA<2>                                   │
│ ─ A_CA<2:4>            R_DL<0:63>, R_RDDL,  │
│ ─ R(A)_BANK1           A_DL<0:15>, A_RDDL   │
└─────────────────────────┬───────────────────┘
```

F I G. 80

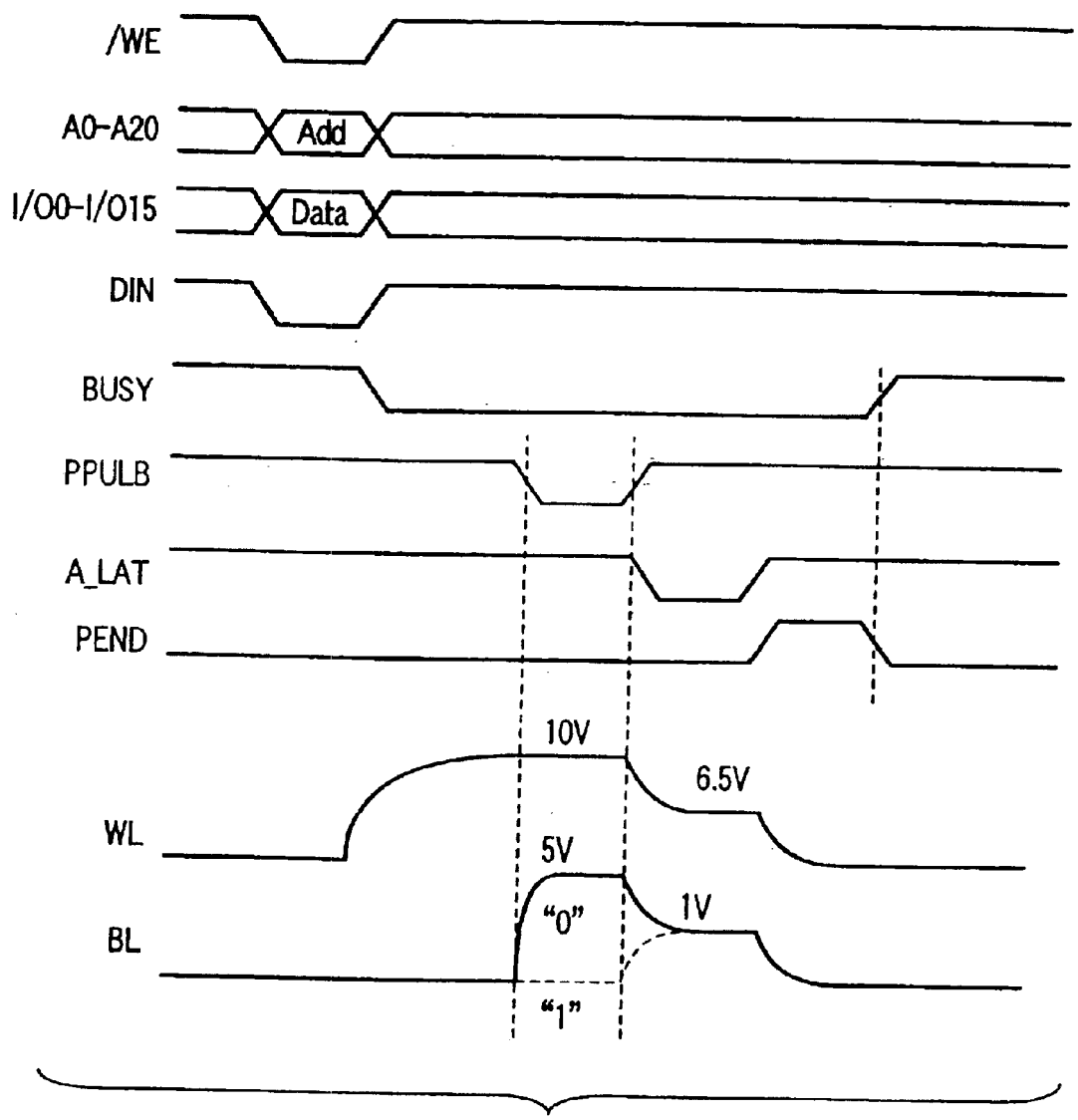
F I G. 101

NONVOLATILE SEMICONDUCTOR MEMORY HAVING PAGE MODE WITH A PLURALITY OF BANKS

CROSS-REFERENCE TO RELATED APPLICATIONS

This application is a continuation of U.S. patent application Ser. No. 10/233,133, filed Aug. 30, 2002, now U.S. Pat. No. 6,671,203 the entire contents of which are incorporated by reference, and which is based upon and claims the benefit of priority from prior Japanese Patent Application No. 2001-265022, filed Aug. 31, 2001, the entire contents of which are incorporated by reference.

BACKGROUND OF THE INVENTION

1. Field of the Invention

The present invention relates to a nonvolatile semiconductor memory such as a flash memory and, more particularly, to a nonvolatile semiconductor memory having a page mode (page read function) with a plurality of banks.

2. Description of the Related Art

A flash memory is known as one of nonvolatile semiconductor memories. FIG. 1 is a sectional view showing the memory cell of the flash memory. This memory cell (memory cell transistor) is constituted by a MOSFET (Metal Oxide Semiconductor Field Effect Transistor) having a so-called stacked gate structure in which a floating gate FG and control gate CG are stacked via an insulating film. In this example, an N-well 101 is formed in a P-semiconductor substrate (P-substrate) 100, and a P-well 102 is formed in the N-well 101. An $N^+$-impurity diffusion region 103 serving as the drain region of the MOSFET, and an $N^+$-impurity diffusion region 104 and $P^+$-impurity diffusion region 105 serving as the source region of the MOSFET are formed in the surface region of the P-well 102. A gate insulating film 106, floating gate FG, insulating film 107, and control gate CG are stacked on the substrate 100 between the impurity diffusion regions 103 and 104. An $N^+$-impurity diffusion region 108 is formed in the surface region of the N-well 101. The impurity diffusion region 108 is connected to the impurity diffusion regions 104 and 105. A $P^+$-impurity diffusion region 109 is formed in the major surface of the substrate 100, and grounded.

The memory cell transistor changes (or shifts) the threshold voltage viewed from the control gate CG in accordance with the number of electrons accumulated in the floating gate FG. The memory cell transistor stores data "0" or "1" in accordance with a change in threshold voltage.

FIG. 2 shows part of a memory cell array in which memory cell transistors are arrayed in a matrix. The control gates of memory cell transistors MC on respective rows are connected to word-lines WL0 to WLn. The drains of the memory cell transistors MC on respective columns are connected to bit-lines BL0 to BLm, and their sources are commonly connected to a ground point Vss (source-line).

FIG. 3 shows the relationship between the control gate voltage (gate voltage) and drain current of the memory cell transistor shown in FIG. 1. In FIG. 3, a state in which the number of electrons accumulated in the floating gate FG is relatively large (i.e., a threshold voltage Vt of the memory cell transistor is high) is defined as "0" data, and a state in which the threshold voltage Vt is low is defined as "1" data. Data read, erase, and program bias conditions are shown in Table 1.

TABLE 1

|     | Read | Program   | Erase    |
| --- | ---- | --------- | -------- |
| Vg  | 5 V  | 9 V       | −7 V     |
| Vd  | 1 V  | 5 ("0")   | Floating |
|     |      | 0 ("1")   |          |
| Vs  | 0 V  | 0 V       | 10 V     |

Data is read by applying the voltage Vd (=1 V) to the drain of the memory cell transistor, the voltage Vs (=0 V) to the source, and the voltage Vg (=5 V) to the control gate. Whether stored data is "1" or "0" is determined by whether a cell current Icell flows.

Erase is executed at once for a plurality of memory cells which share the source and P-well 102. The drain is changed to the floating state, and the source voltage Vs=10 V and the control gate voltage Vg=−7 V are set. Then, electrons flow from the floating gate FG to the substrate by the F-N tunnel phenomenon, and all the memory cells subjected to erase are set to "1" data.

To the contrary, program is done every bit. While the source voltage Vs=0 V and the control gate voltage Vg=9 V are set, 5 V is biased (drain voltage Vd=5 V) to the bit-line of cells in which "0" is to be written. High-energy electrons generated by the channel hot electron phenomenon are injected into the floating gate. At this time, by setting the bit-line of cells kept at "1" to 0 V (drain voltage Vd=0 V), no electron injection occurs and the threshold voltage Vt does not change.

In order to confirm program or erase, program verify or erase verify is performed. Program verify performs "0" read by setting the control gate voltage Vg to a voltage Vpv higher than the read voltage. Program and program verify are alternately executed, and when all cells to be programmed change to "0", program operation ends. Similarly, during erase, a voltage Vev lower than the read voltage is applied to the control gate CG to execute erase verify which performs "1" read, and a sufficient cell current Icell is ensured. In this manner, the word-line voltage of the cell changes depending on the operation mode.

The reprogram time of the flash memory is longer than the read time by several orders of magnitude. To solve this problem, a so-called dual operation function has been introduced (e.g., U.S. Pat. No. 5,867,430 and U.S. Pat. No. 5,847,998). According to this function, the flash memory is divided into two banks or more. Even if a given bank undergoes reprogram, cell data can be read out from another bank. With the improvement of the MPU (Micro Processing Unit) performance, a higher read rate of the flash memory becomes important. Under these circumstances, a technique of greatly shortening the average access time by using page and burst modes has been available.

A 64-Mbit flash memory described in B. Pathank et al., "A 1.8V 64 Mb 100 MHz Flexible Read While Write Flash Memory", ISSCC2001 DIGEST OF TECHNICAL PAPERS pp. 32–33, February, 2001 comprises 16 4-Mbit banks, and has a 4-word page-length page access function. This flash memory adopts row decoders for respective banks in order to enable the banks to independently operate.

This arrangement means a large-size decoder area overhead, resulting in high chip cost.

As described above, the conventional nonvolatile semiconductor memory suffers a longer reprogram time than the read time by several orders of magnitude. Increasing the reprogram time leads to a large-size decoder area overhead and high chip cost.

BRIEF SUMMARY OF THE INVENTION

According to one aspect of the present invention, there is provided a reference current generator configured to generate a first voltage dependent upon a current flowing through a reference cell; first current converters to which the first voltage is input, each configured to generate a second voltage; second current converters to which the first voltage is input, each configured to generate a third voltage; sense amplifiers for read, first terminals respectively being connected to a data-line for read, and second terminals respectively being applied with the second voltage each generated by said first current converters, configured to output data of a selection memory cell comparing a voltage of the a data-line for read with the second voltage; and sense amplifiers for verify, first terminals respectively being connected to verify data lines, and second terminals respectively being applied with the third voltage generated by said plurality of second current converters, configured to output verify data of the selection memory cell, comparing a voltage of the data-line for program and verify with the third voltage.

BRIEF DESCRIPTION OF THE SEVERAL VIEWS OF THE DRAWING

FIG. 16 is a block diagram showing the schematic arrangement of a nonvolatile semiconductor memory according to an embodiment of the present invention;

FIG. 17 is a block diagram showing the layout image of a 2-bank 16-Mbit flash memory having two redundancy blocks;

FIG. 18A is a circuit diagram showing the arrangement of a column gate for selectively connecting the local bit-line of a block that is formed from a first-level metal layer to a main bit-line formed from a third-level metal layer;

FIG. 18B is a symbolic view of the column gate shown in FIG. 18A;

FIG. 19A is a block diagram of a column gate having eight column gates shown in FIGS. 18A and 18B;

FIG. 19B is a symbolic view of the column gate shown in FIG. 19A;

FIG. 23A is a circuit diagram showing a row decoder connected to each word-line;

FIG. 23B is a symbolic view of the row decoder shown in FIG. 23A;

FIG. 24A is a block diagram showing a row decoder controlled by a pre-decode signal pair;

FIG. 24B is a symbolic view of the row decoder shown in FIG. 24A;

FIG. 25 is a block diagram showing a row decoder having 128 row decoders shown in FIGS. 24A and 24B;

FIG. 26A is a circuit diagram showing a pre-decoder which outputs a pre-decode signal pair;

FIG. 26B is a symbolic view of the pre-decoder shown in FIG. 26A;

FIG. 27A is a block diagram showing a row decoder having 128 pairs of pre-decoders shown in FIGS. 26A and 26B;

FIG. 27B is a symbolic view of the row decoder shown in FIG. 27A;

FIG. 28A is a circuit diagram showing a row decoder which drives a selected word-line;

FIG. 28B is a symbolic view of the row decoder shown in FIG. 28A;

FIG. 29A is a block diagram showing a row decoder constituted by eight row decoders shown in FIGS. 28A and 28B;

FIG. 29B is a symbolic view of the row decoder shown in FIG. 29A;

FIG. 30A is a circuit diagram showing a block decoder;

FIG. 30B is a symbolic view of the block decoder shown in FIG. 30A;

FIG. 42A is a circuit diagram showing a decoder which outputs a signal R_JHH;

FIG. 42B is a symbolic view of the decoder shown in FIG. 42A;

FIG. 43A is a circuit diagram showing a decoder which outputs a read column gate selection signal;

FIG. 43B is a symbolic view of the decoder shown in FIG. 43A;

FIG. 44A is a block diagram showing a decoder having three decoders shown in FIGS. 43A and 43B;

FIG. 44B is a symbolic view of the decoder shown in FIG. 44A;

FIG. 45A is a circuit diagram showing an auto column gate signal decoder;

FIG. 45B is a symbolic view of the decoder shown in FIG. 45A;

FIG. 46A is a circuit diagram showing another auto column gate signal decoder;

FIG. 46B is a symbolic view of the decoder shown in FIG. 46A;

FIG. 47A is a circuit diagram showing still another auto column gate signal decoder;

FIG. 47B is a symbolic view of the decoder shown in FIG. 47A;

FIG. 52A is a block diagram showing the connection between a column gate signal output and a decoder column gate for a bank including no boot block;

FIG. 52B is a symbolic view of the circuit shown in FIG. 52A;

FIG. 53A is a block diagram showing the connection between a column gate signal output and a decoder column gate for a bank including a boot block;

FIG. 53B is a symbolic view of the circuit shown in FIG. 53A;

FIGS. 54A and 54B are circuit diagrams showing a global decoder for a column gate selection signal;

FIGS. 55A and 55B are circuit diagrams showing the global decoder for the column gate selection signal;

FIG. 56 is a symbolic view showing the global decoder for the column gate selection signal;

FIG. 57A is a block diagram showing a global decoder for explaining the connection between a global column gate signal output and a column decoder for a bank including no boot block;

FIG. 57B is a block diagram showing a column decoder for explaining the connection between a global column gate signal output and a column decoder for a bank including no boot block;

FIG. 57C is a symbolic view of a decoder formed by the global decoder shown in FIG. 57A and the column decoder shown in FIG. 57B;

FIG. 58A is a block diagram showing a global decoder for explaining the connection between a global column gate signal output and a column decoder for a bank including a boot block;

FIG. 58B is a block diagram showing a column decoder for explaining the connection between a global column gate signal output and a column decoder for a bank including a boot block;

FIG. 58C is a symbolic view of a decoder formed by the global decoder shown in FIG. 58A and the column decoder shown in FIG. 58B;

FIG. 60A is a block diagram showing a 4-Mbit core 4 MbCORE constituted by eight 512-Kbit blocks shown in FIGS. 59A and 59B;

FIG. 60B is a symbolic view of the core 4 MbCORE shown in FIG. 60A;

FIG. 61A is a block diagram showing the block arrangement of a boot block;

FIG. 61B is a symbolic view of the block arrangement shown in FIG. 61A;

FIG. 71 is a circuit diagram showing a circuit which generates a main block address;

FIG. 72A is a block diagram showing an arrangement of a power switch & decoder arranged for each 4-Mbit core;

FIG. 72B is a symbolic view of the power switch & decoder shown in FIG. 72A;

FIG. 73A is a block diagram shows a 4-Mbit power switch & decoder constituted by the 4-Mbit core and power switch & decoder;

FIG. 73B is a symbolic view of the power switch & decoder shown in FIG. 73A;

FIG. 74A is a block diagram showing a boot core power switch & decoder;

FIG. 74B is a symbolic view of the power switch & decoder shown in FIG. 74A;

FIG. 75A is a block diagram showing a boot core power switch & decoder constituted by a boot core and the boot core power switch & decoder;

FIG. 75B is a symbolic view of the power switch & decoder shown in FIG. 75A;

FIG. 76 is a block diagram showing the decoder arrangement of a bank BANK0;

FIG. 77 is a symbolic view of the decoder of the bank BANK0 shown in FIG. 76;

FIG. 78A is a block diagram showing the power switch & decoder of a bank BANK1;

Figure 78A:
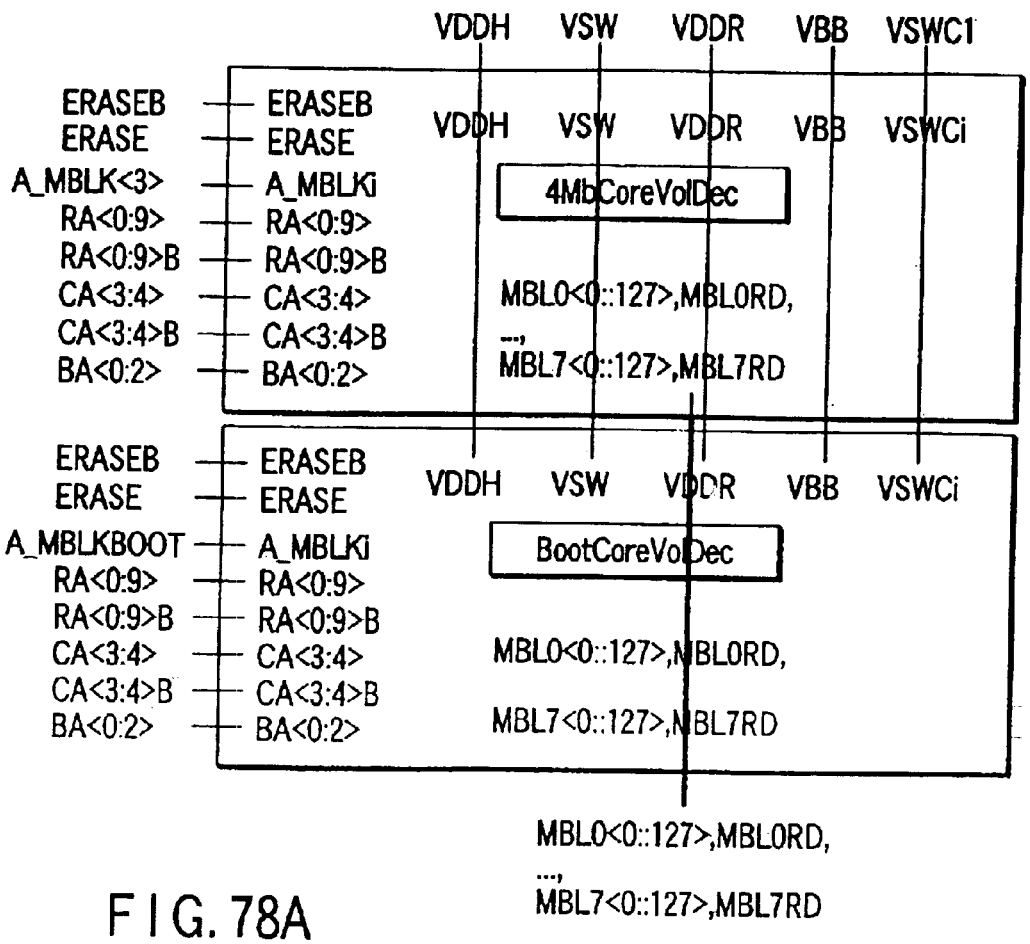
Figure 78B:
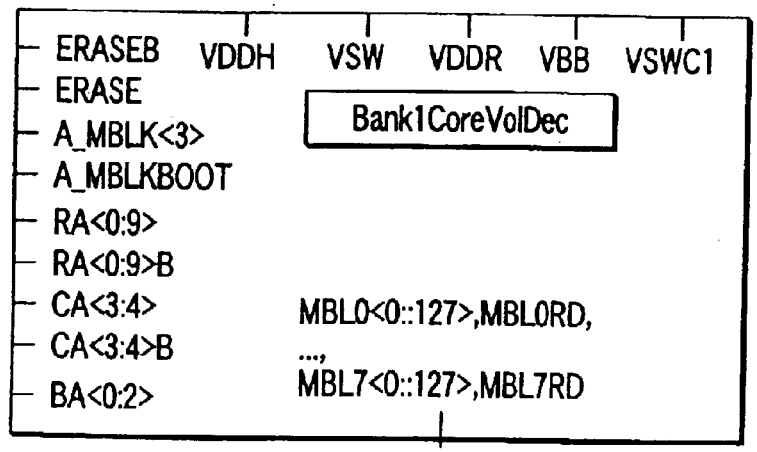
Figure 79:
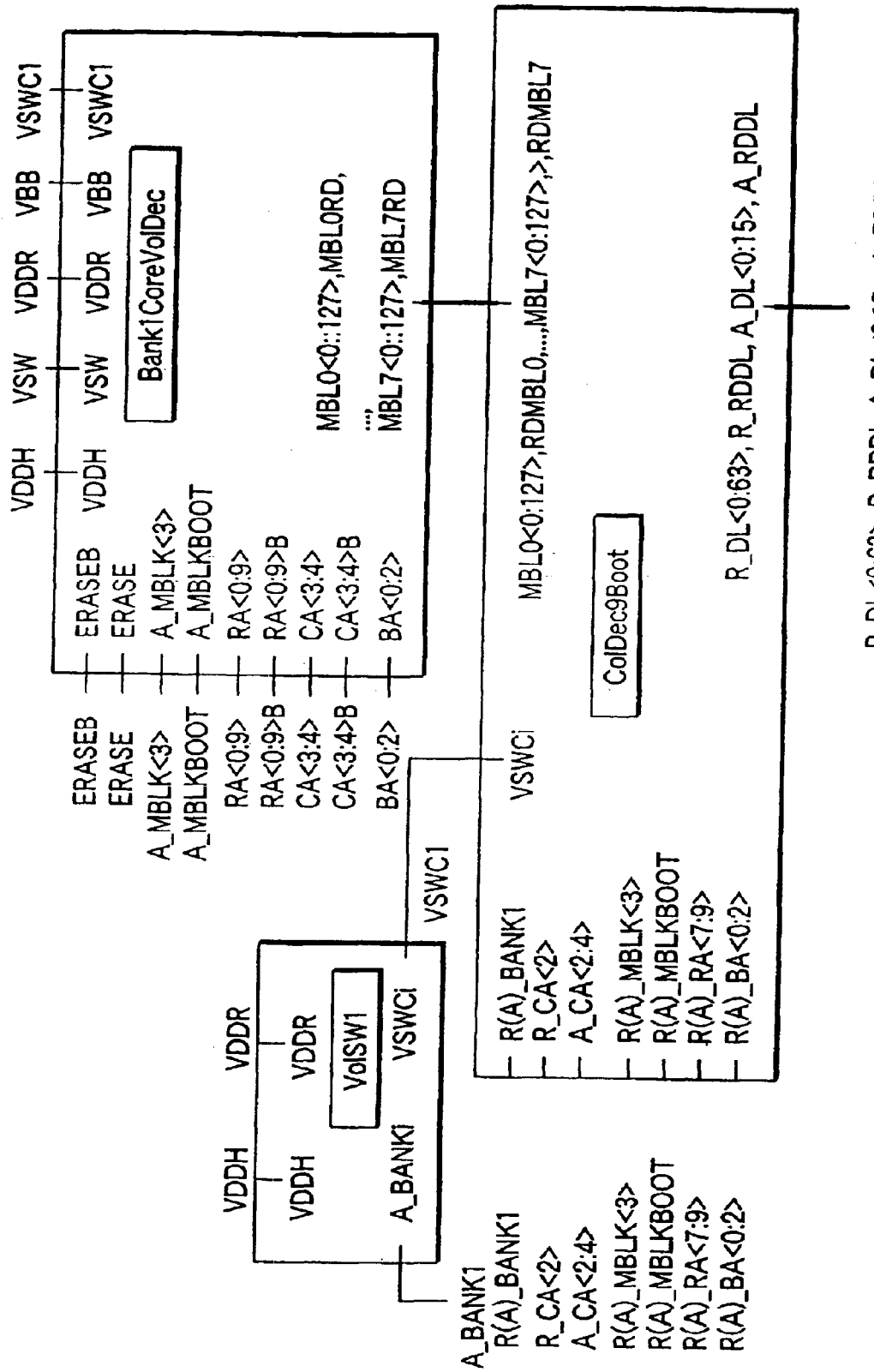
Figure 81A:
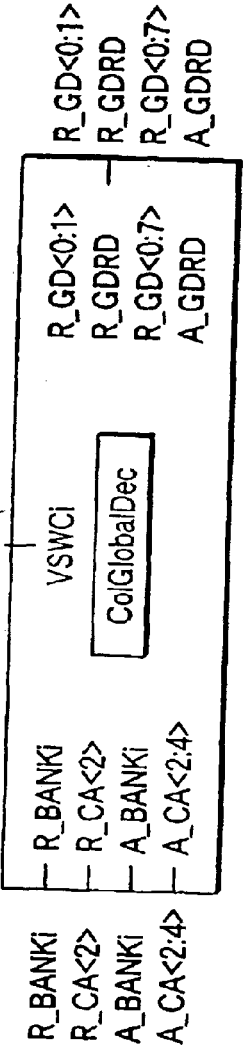
Figure 81B:
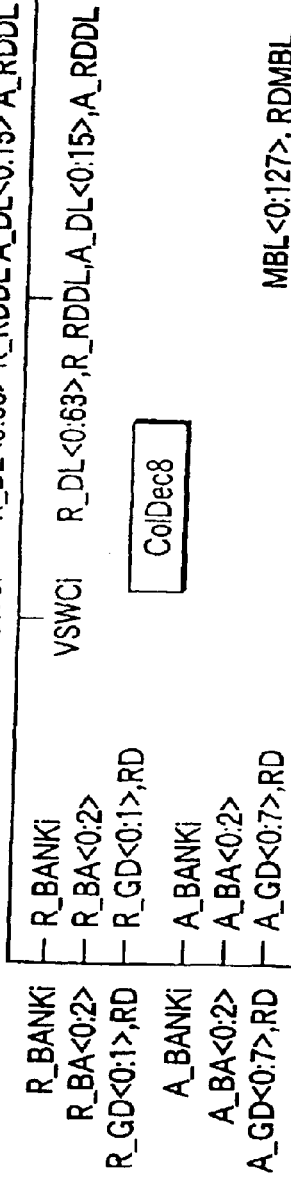
Figure 81C:
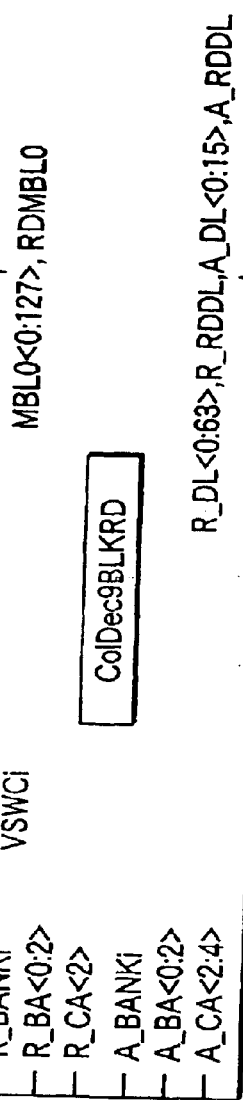
Figure 82A:
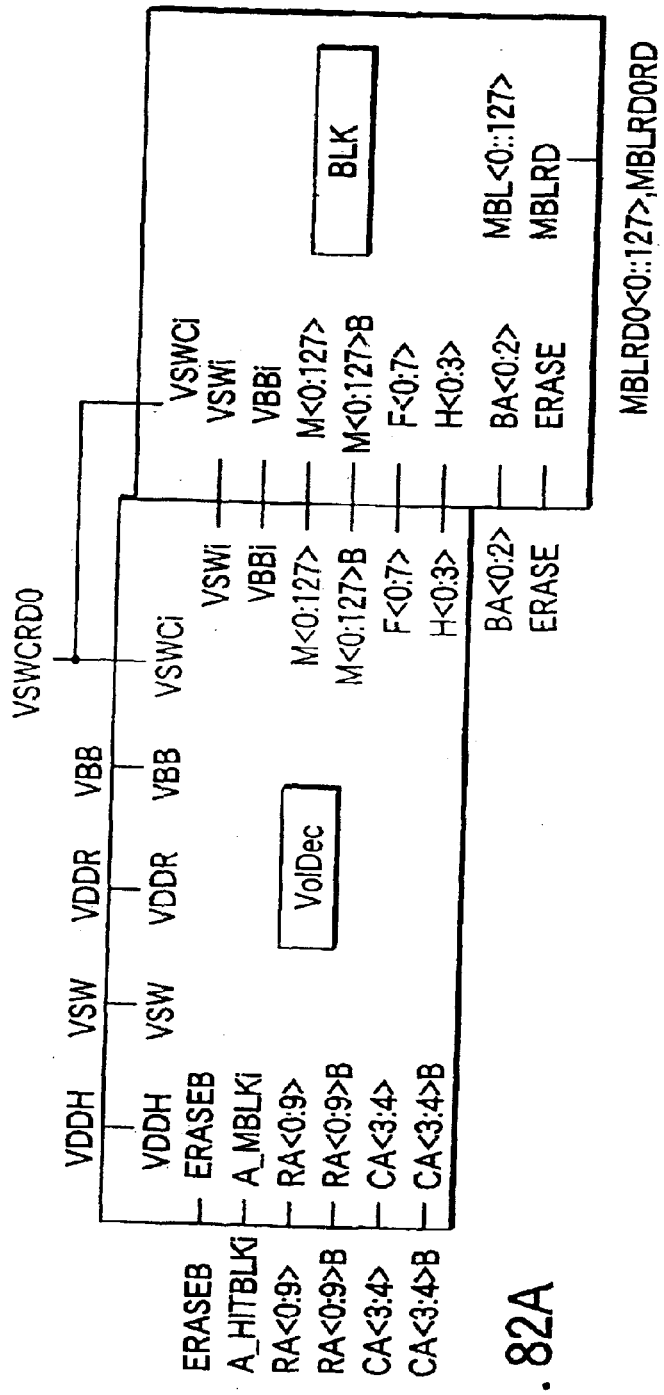
Figure 82B:
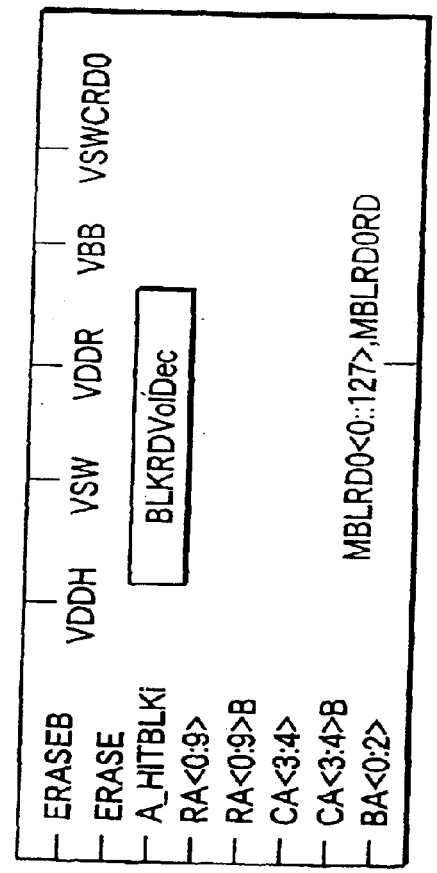
Figure 83:
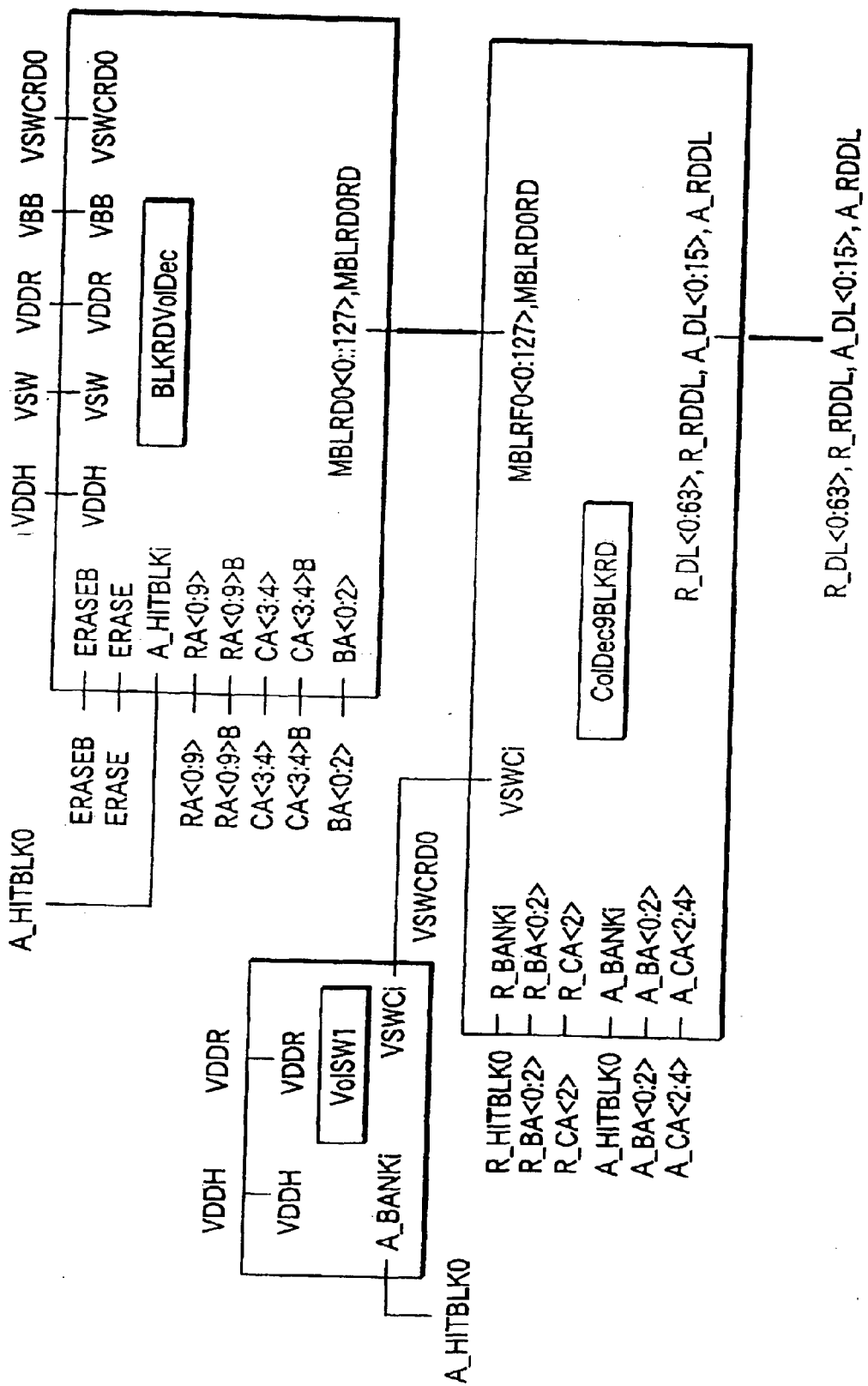
Figure 84:
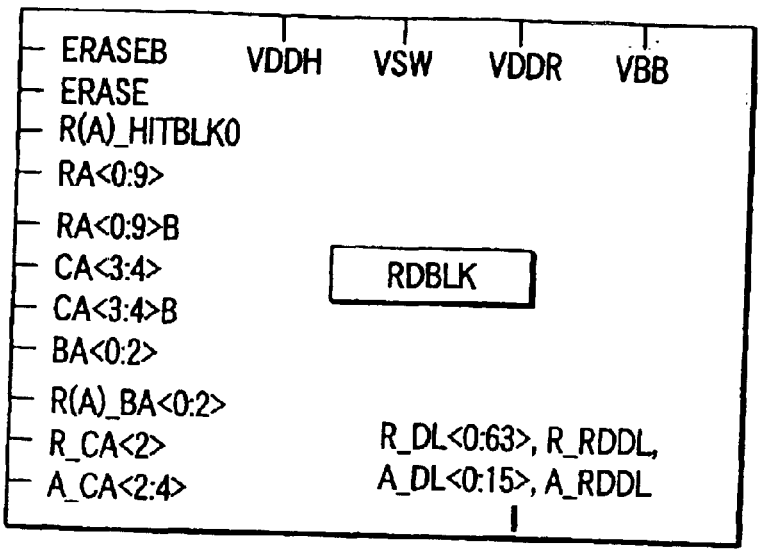
Figure 86:
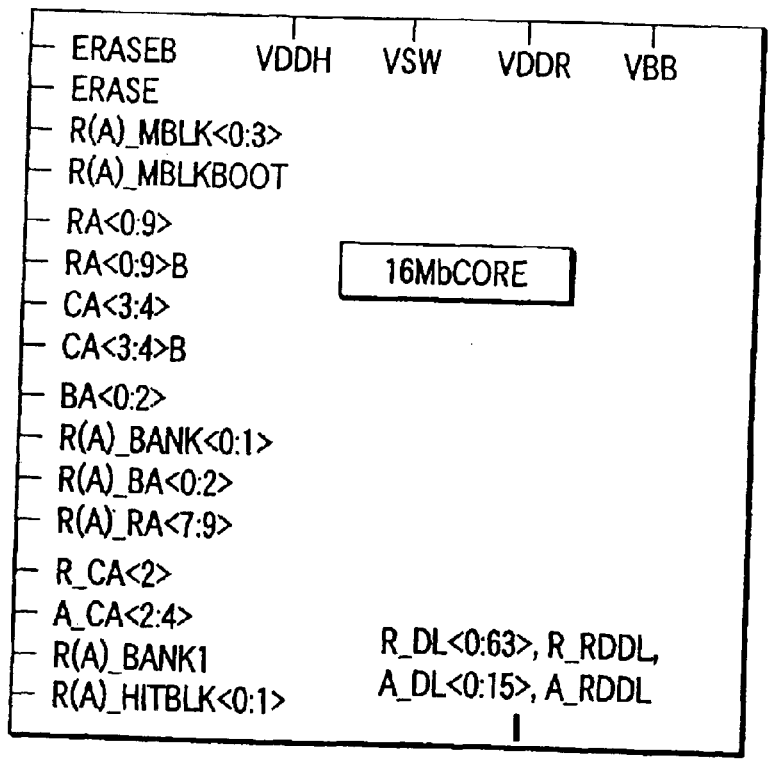
Figure 85C:
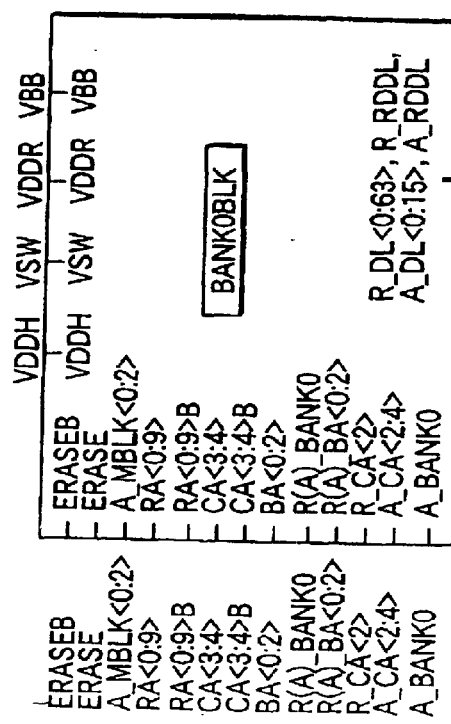
Figure 85D:
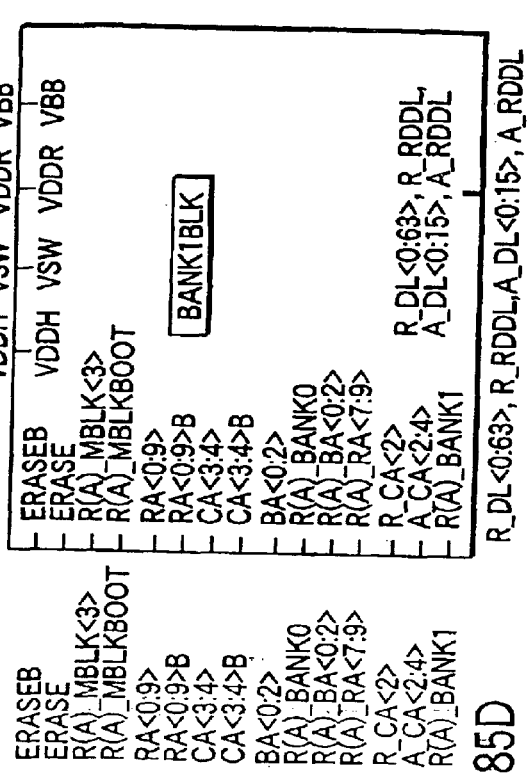
Figure 85A:
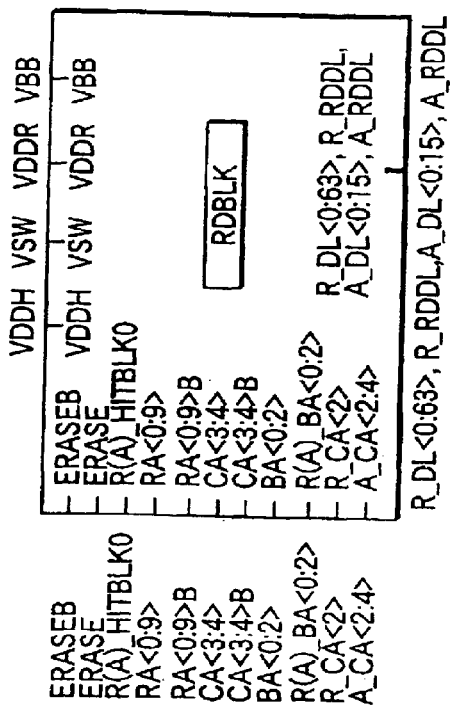
Figure 85B:
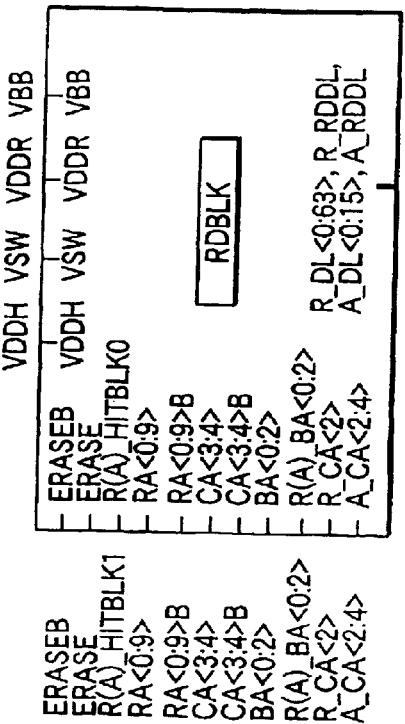
Figure 87:
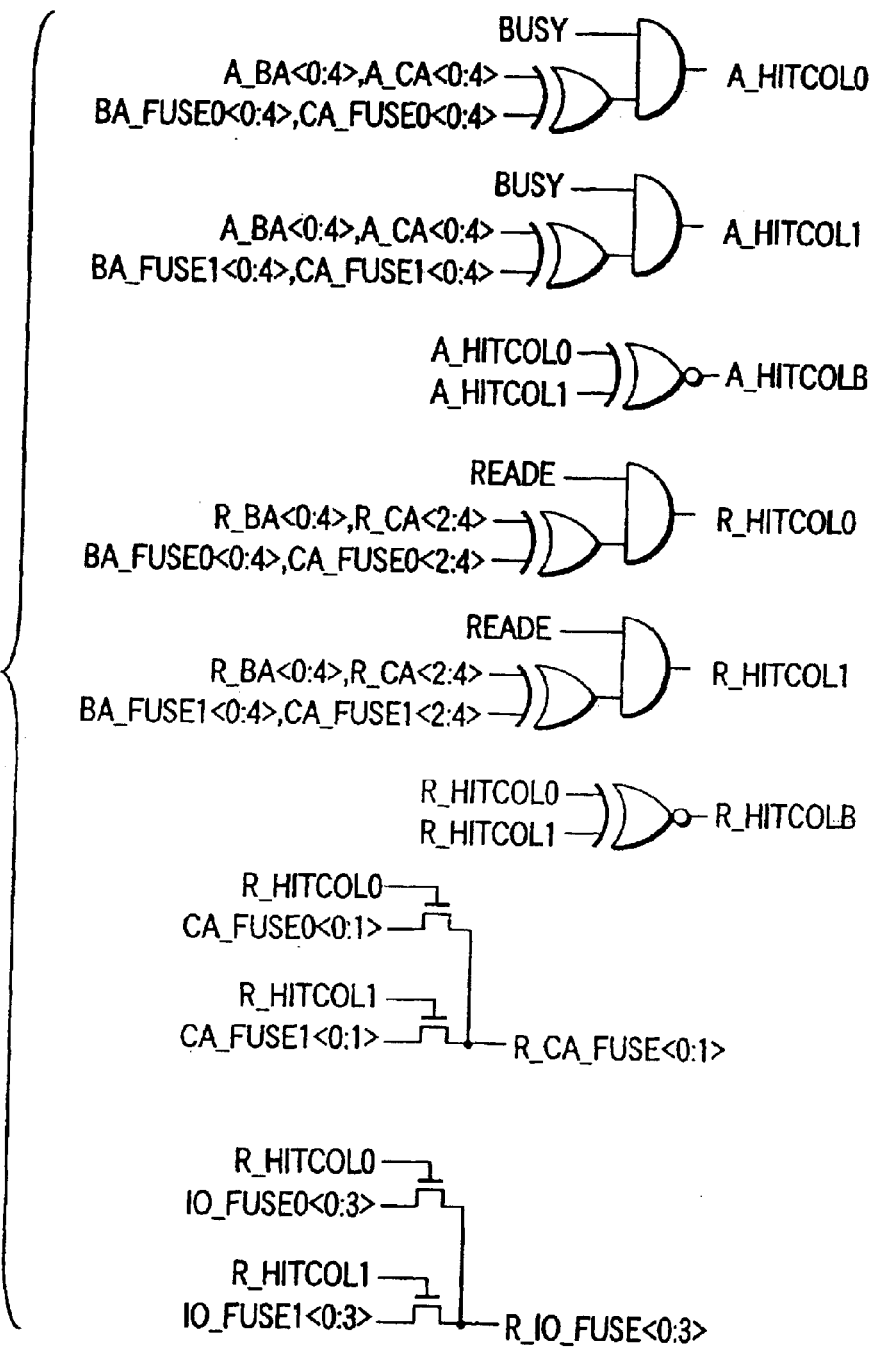
Figure 88:
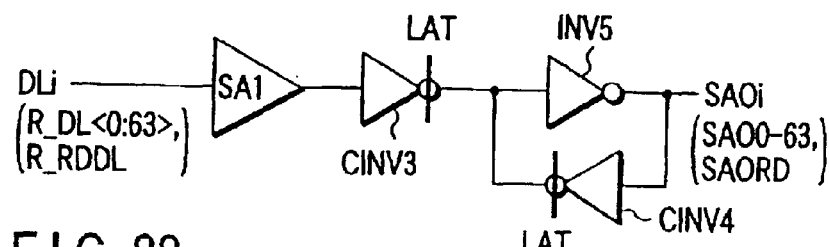
Figure 89:
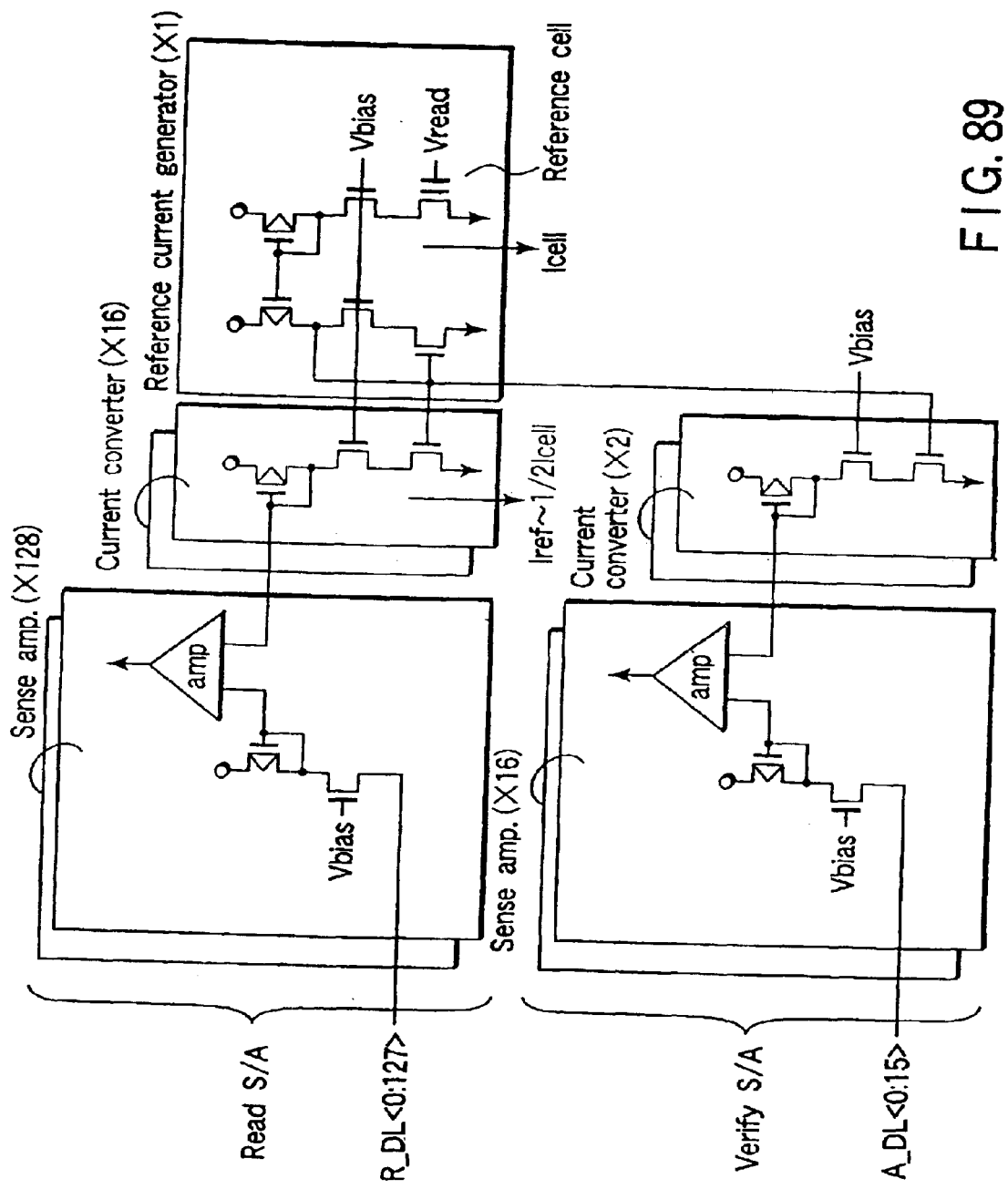
Figure 90:
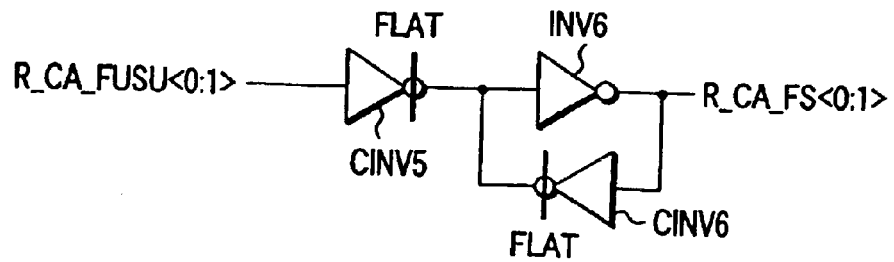
Figure 91:
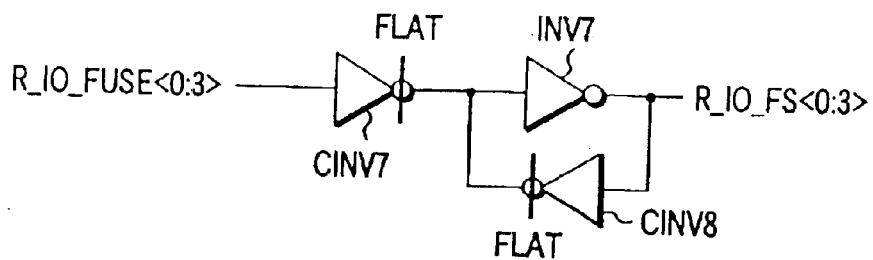
Figure 92:
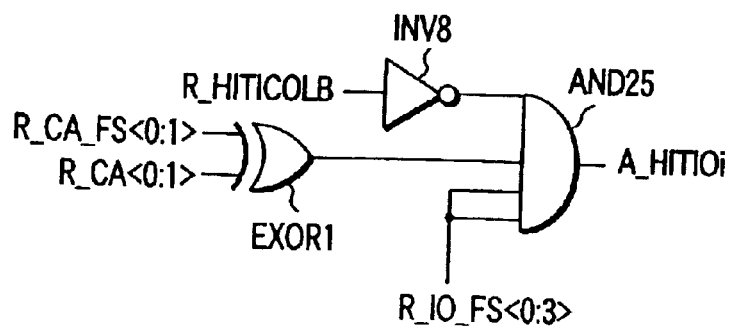
Figure 93:
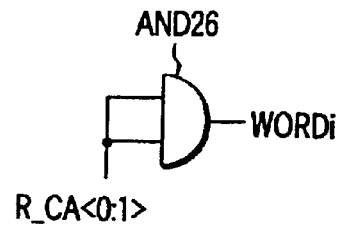
Figure 94:
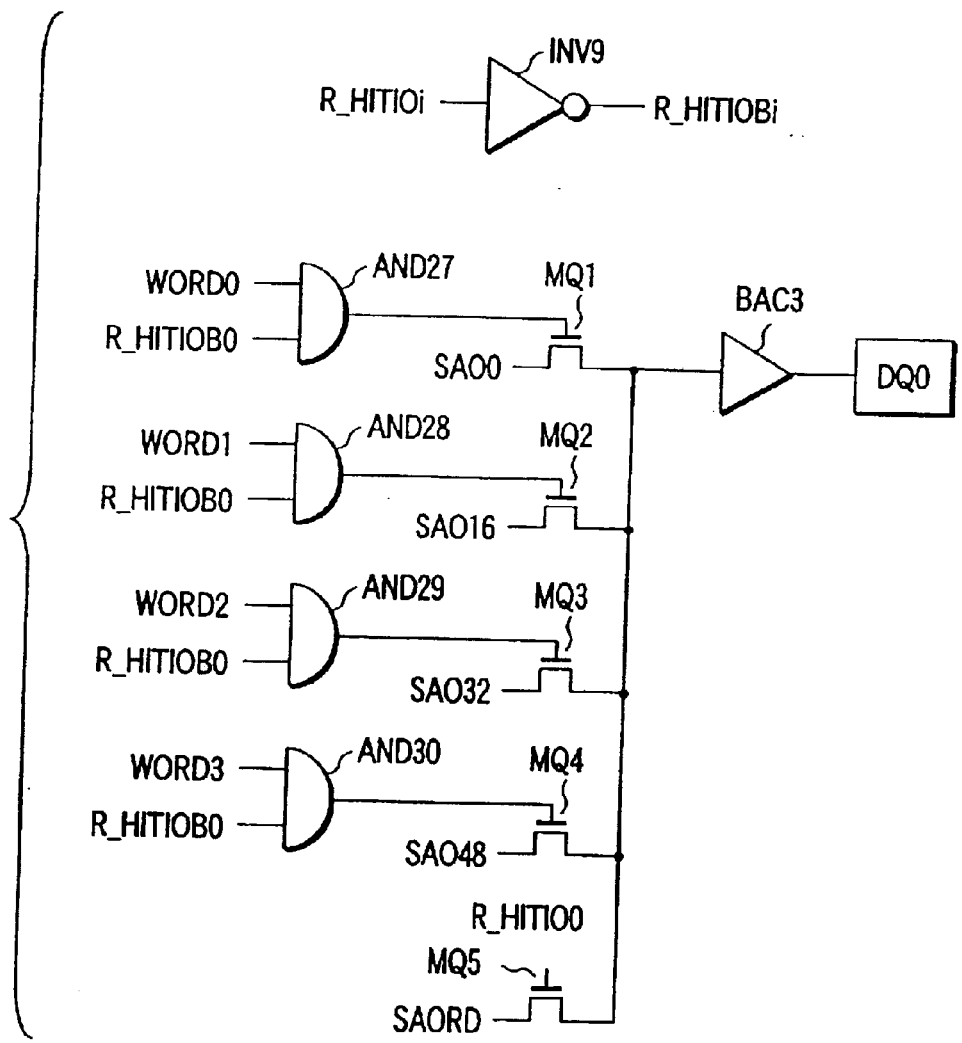
Figure 95:
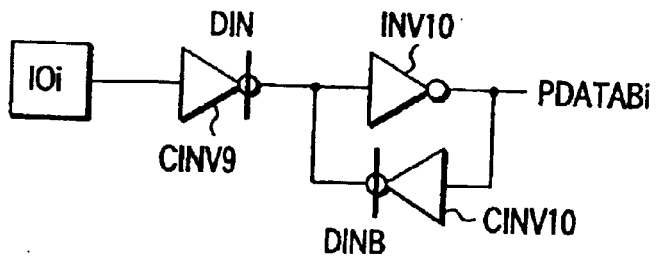
Figure 96:
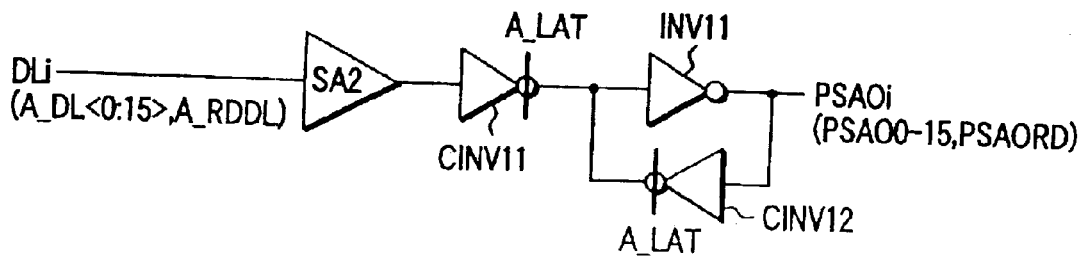
Figure 97:
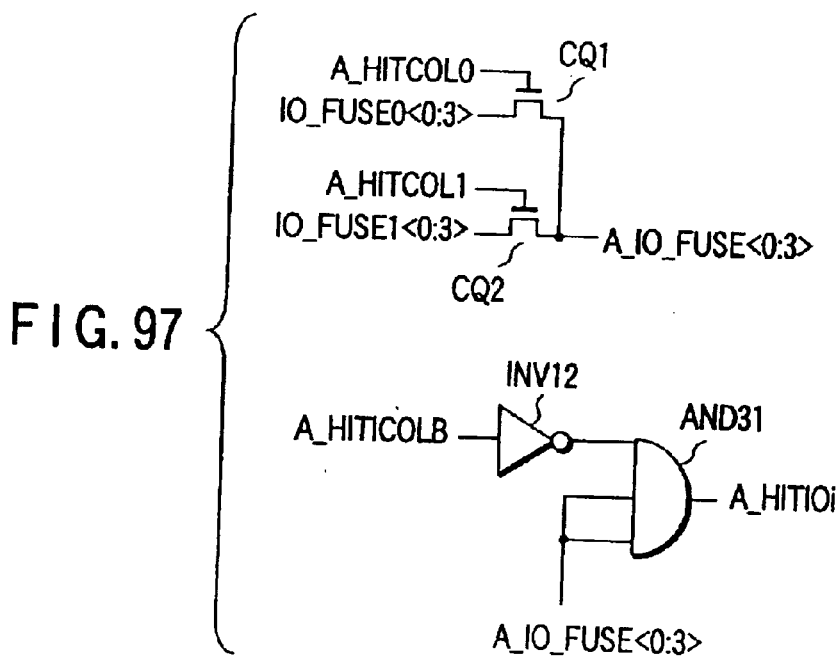
Figure 98:
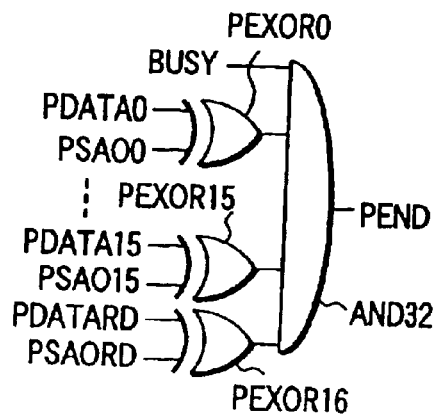
Figure 99:
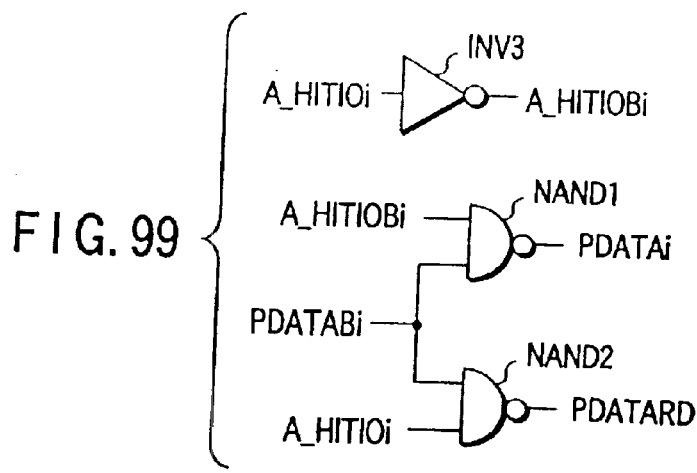
Figure 100:
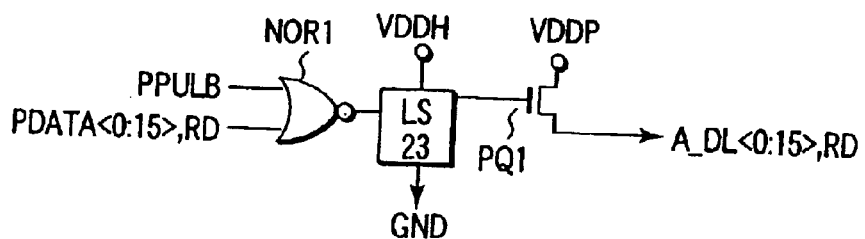
Figure 102:
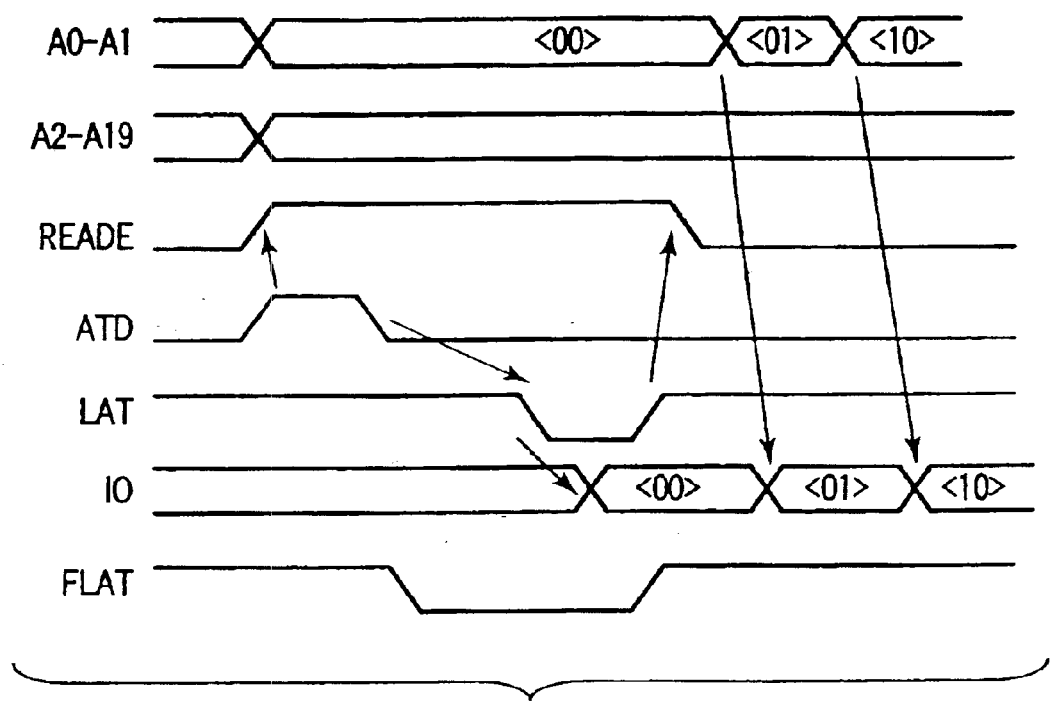

FIG. 78B is a symbolic view of the power switch & decoder shown in FIG. 78A;

FIG. 79 is a block diagram showing the decoder arrangement of the bank BANK1;

FIG. 80 is a symbolic view of the decoder of the bank BANK1 shown in FIG. 79;

FIG. 81A is a block diagram of a global decoder showing a block redundancy column decoder;

FIG. 81B is a block diagram of a decoder showing the block redundancy column decoder;

FIG. 81C is a symbolic view of a block redundancy decoder showing the block redundancy column decoder;

FIG. 82A is a block diagram showing the connection between a block and the power switch & decoder of a redundancy block;

FIG. 82B is a symbolic view of the circuit shown in FIG. 82A;

FIG. 83 is a block diagram showing the arrangement of the decoder of the redundancy block;

FIG. 84 is a symbolic view of the decoder of the redundancy block shown in FIG. 83;

FIGS. 85A to 85D are block diagrams showing the arrangement of a 16-Mbit flash memory core with a 4-Mbit+ 12-Mbit 2-bank structure having two redundancy blocks;

FIG. 86 is a symbolic view of the 16-Mbit flash memory core shown in FIGS. 85A to 85D;

FIG. 87 is a circuit diagram showing an arrangement of a column redundancy circuit;

FIG. 88 is a circuit diagram showing a sense amplifier and a circuit which latches sensed data;

FIG. 89 is a circuit diagram showing a sense amplifier for read and a sense amplifier for program and verify;

FIG. 90 is a circuit diagram showing a circuit which latches column redundancy fuse data;

FIG. 91 is a circuit diagram showing another circuit which latches column redundancy fuse data;

FIG. 92 is a circuit diagram showing a circuit which generates a signal for replacing I/O data by a multiplexer when outputting a word whose page offset address and fuse data coincide with each other;

FIG. 93 is a circuit diagram showing a multiplexer;

FIG. 94 is a circuit diagram showing another multiplexer;

FIG. 95 is a circuit diagram showing an arrangement of a data latch circuit which latches program data;

FIG. 96 is a circuit diagram showing an arrangement of a sense latch circuit which performs program or erase verify;

FIG. 97 is a circuit diagram showing an arrangement of a circuit which performs column redundancy in auto operation;

FIG. 98 is a circuit diagram showing a circuit which outputs an end signal for designating the end of program when program data and a verify result completely coincide with each other;

FIG. 99 is a circuit diagram showing a circuit which transfers target I/O data to PDATARD upon column redundancy replacement;

FIG. 100 is a circuit diagram showing an arrangement of a program load circuit connected to an auto data-line;

FIG. 101 is a timing chart showing operation waveforms representing program operation; and FIG. 102 is a timing chart showing operation waveforms representing read operation.

DETAILED DESCRIPTION OF THE INVENTION

A nonvolatile semiconductor memory according to embodiments of the present invention will be roughly described first, and then a concrete example will be exampled.

[First Embodiment]

Figure 1:
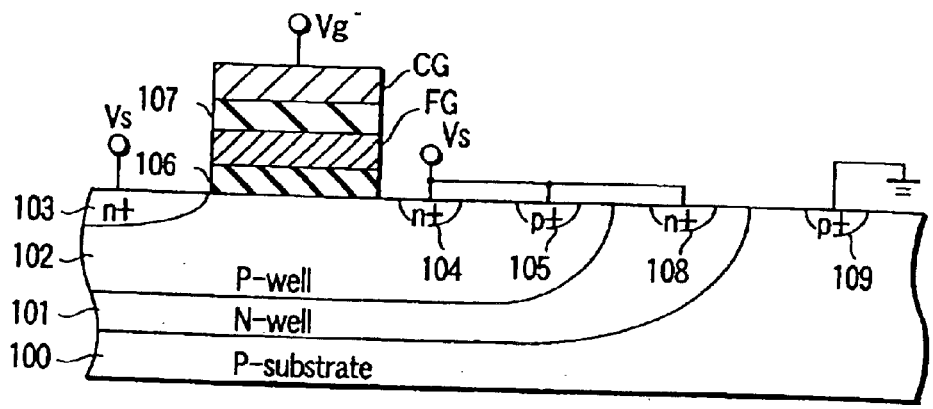
FIG. 1 is a sectional view showing the memory cell of a flash memory for explaining a conventional nonvolatile semiconductor memory.
Figure 2:
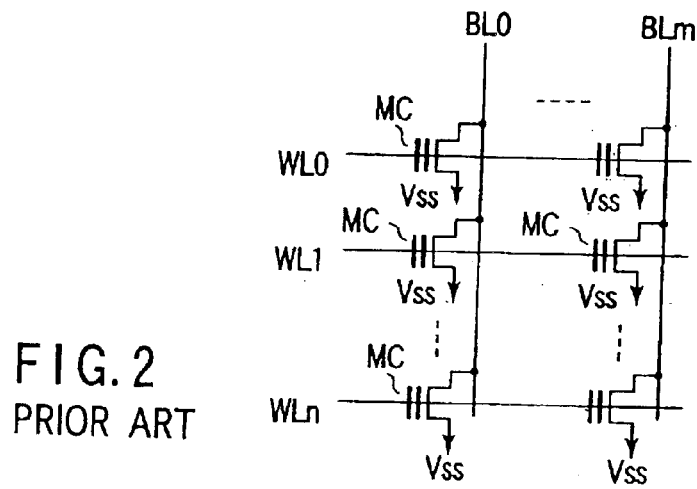
FIG. 2 is a circuit diagram showing part of a memory cell array obtained by arraying memory cell transistors shown in FIG. 1 in a matrix for explaining the conventional nonvolatile semiconductor memory.
Figure 3:
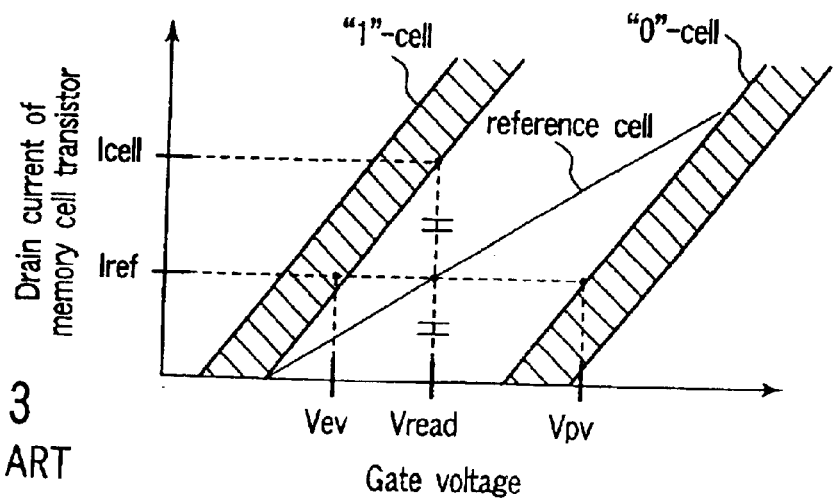
FIG. 3 is a graph showing the relationship between the control gate voltage and drain current of the memory cell transistor shown in FIG. 1.
Figure 4:
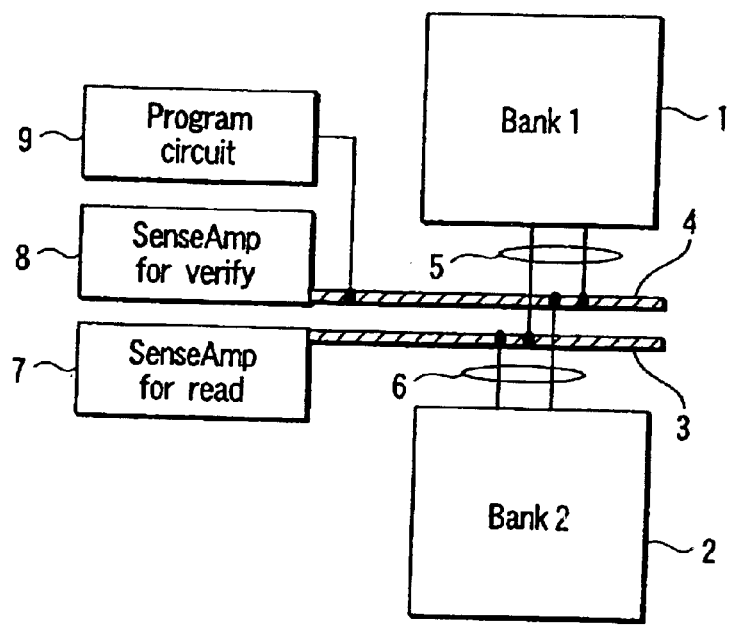
FIG. 4 is a block diagram showing only a main part for explaining a nonvolatile semiconductor memory according to the first embodiment of the present invention.

FIG. 4 shows only a main part for explaining a nonvolatile semiconductor memory according to the first embodiment of the present invention. This nonvolatile semiconductor memory has two banks. A data-line 3 for read and a data-line 4 for program and verify are arranged between a first bank (Bank 1) 1 and a second bank (Bank 2) 2. A bit-line 5 for the first bank 1 and a bit-line 6 for the second bank 2 are selectively connected to the data-line 3 for read and the data-line 4 for program and verify. The data-line 3 for read is connected to a sense amplifier (SenseAmp) 7 for read, whereas the data-line 4 for program and verify is connected to a sense amplifier (SenseAmp) 8 for program and verify and a program circuit 9.

In this arrangement, the first and second banks 1 and 2 can share the data-lines 3 and 4, and thus their pattern-occupied area can be reduced to decrease the chip cost.

[Second Embodiment]

Figure 5:
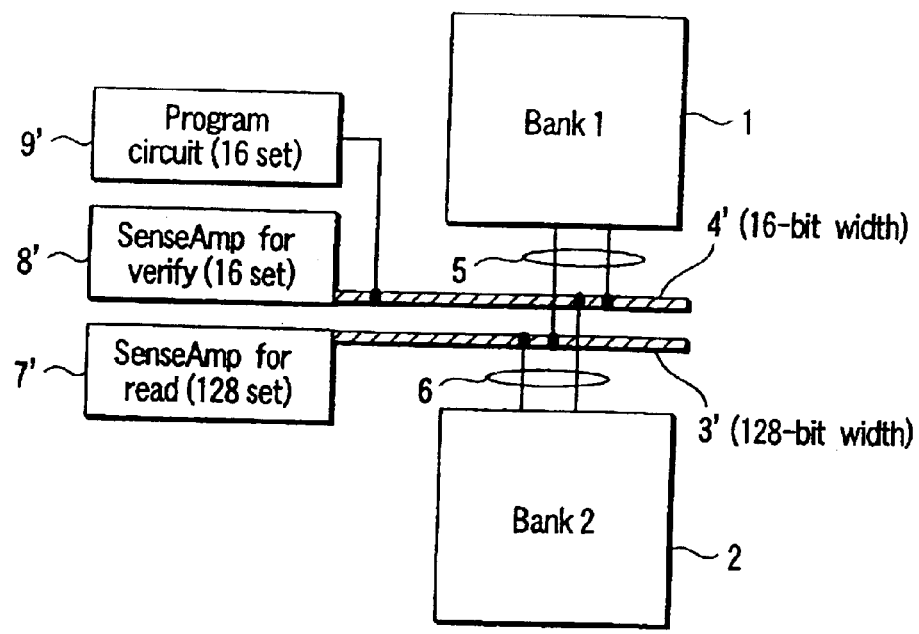
FIG. 5 is a block diagram showing only a main part for explaining a nonvolatile semiconductor memory according to the second embodiment of the present invention.

FIG. 5 shows only a main part for explaining a nonvolatile semiconductor memory according to the second embodiment of the present invention. This nonvolatile semiconductor memory assumes page read, and is formed from basically the same circuit as that of the first embodiment. A 128-bit data-line 3' for read and a 16-bit data-line 4' for program and verify are arranged between first and second banks 1 and 2. A bit-line 5 for the first bank 1 and a bit-line 6 for the second bank 2 are selectively connected to the data-line 3' for read and the data-line 4' for program and verify. The data-line 3' for read is connected to 128 sets of sense amplifiers (SenseAmp) 7' for read, whereas the data-line 4' for program and verify is connected to 16 sets of sense amplifiers (SenseAmp) 8' for program and verify and 16 sets of program circuits 9'.

In page read, the data-line 3' for read and the SenseAmp 7' for read are equal to the page size, while the data-line 4' for program and verify, the SenseAmp 8' for program and verify, and the program circuit 9' are smaller than the page size.

This can reduce the pattern-occupied areas of the data-line 4' for program and verify, the SenseAmp 8' for program and verify, and the program circuit 9', thereby decreasing the chip cost.

[Third Embodiment]

Figure 6:
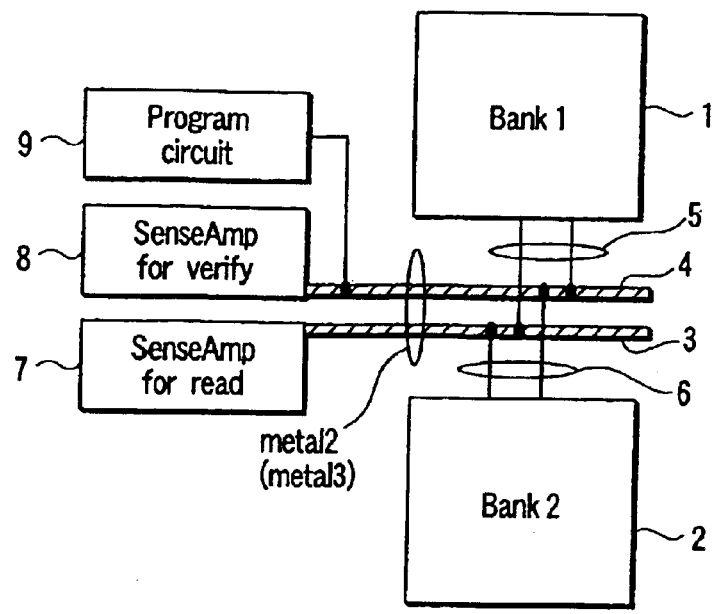
FIG. 6 is a block diagram showing only a main part for explaining a nonvolatile semiconductor memory according to the third embodiment of the present invention.

FIG. 6 shows only a main part for explaining a nonvolatile semiconductor memory according to the third embodiment of the present invention. This nonvolatile semiconductor memory has two banks. The drain wiring lines of memory cell transistors in first and second banks 1 and 2 are formed from a first-level metal layer. A data-line 3 for read and a data-line 4 for program and verify that are formed from a second-level metal layer are arranged between the first and second banks 1 and 2. A bit-line 5 for the first bank 1 and a bit-line 6 for the second bank are formed from the first-level metal layer (metal1), and selectively connected to the data-line 3 for read and the data-line 4 for program and verify. The data-line 3 for read is connected to a sense amplifier 7 for read, whereas the data-line 4 for program and verify is connected to a sense amplifier 8 for program and verify and a program circuit 9.

Figure 7:
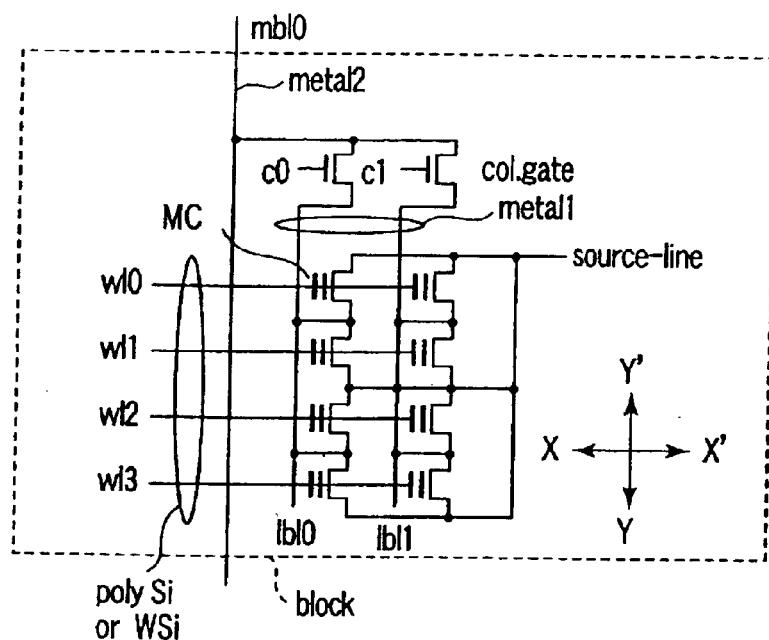
FIG. 7 is a circuit diagram showing part of one block for explaining an arrangement of the first and second banks in the circuit shown in FIG. 6.
Figure 8:
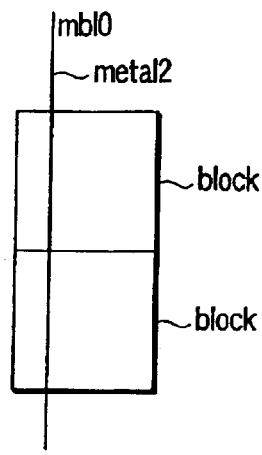
FIG. 8 is a block diagram showing the bit-lines of the first and second banks that are connected to a read data-line or a program & verify data-line for explaining the arrangement of the first and second banks in the circuit shown in FIG. 6.
Figure 9:
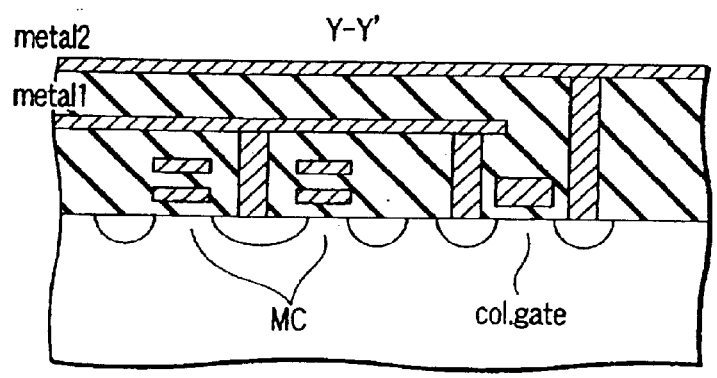
FIG. 9 is a sectional view of the block shown in FIG. 7 taken along the bit-line direction for explaining the arrangement of the first and second banks in the circuit shown in FIG. 6.
Figure 10:
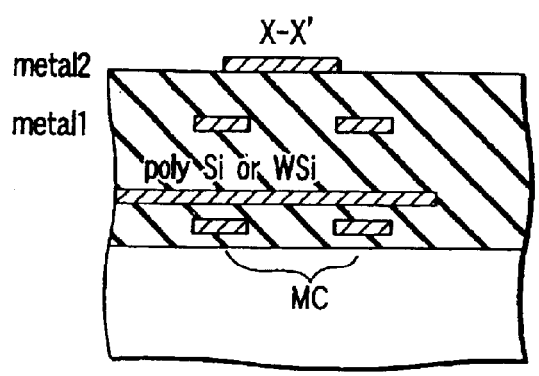
FIG. 10 is a sectional view of the block shown in FIG. 7 taken along the word-line direction for explaining the arrangement of the first and second banks in the circuit shown in FIG. 6.

FIGS. 7 to 10 explain an arrangement of the first and second banks 1 and 2 in the circuit shown in FIG. 6. FIG. 7 is a circuit diagram showing part of one block. FIG. 8 is a block diagram showing the bit-lines of the first and second banks 1 and 2 that are connected to the data-line 3 for read or the data-line 4 for program and verify. FIG. 9 is a sectional view of the block shown in FIG. 7 taken along the bit-line direction (line Y–Y'). FIG. 10 is a sectional view of the block shown in FIG. 7 taken along the word-line direction (line X–X').

In the block shown in FIG. 7, memory cell transistors MC are arrayed in a matrix. The control gates of the memory cell transistors MC on respective rows are connected to word-lines w10 to w13 made of poly-silicon or tungsten silicon (poly Si or WSi). The drains of the memory cell transistors MC on respective columns are connected to local bit-lines lb10, lb11, . . . formed from a first-level metal layer (metal1). The sources are commonly connected to a source-line. The local bit-lines lb10, lb11, . . . are commonly connected via a column gate (col.gate) to a main bit-line mb10 formed from a second-level metal layer.

As shown in FIGS. 8 to 10, the main bit-line mb10 runs through a plurality of blocks over the local bit-lines lb10, lb11, . . . .

Since the main bit-line mb10 can be arranged on the local bit-line lb10, lb11, . . . and run through a plurality of blocks, this arrangement can reduce the pattern-occupied area and chip cost.

In the circuit shown in FIG. 6, it is also possible to form the drain wiring lines of the memory cell transistors in the first and second banks 1 and 2 from a first-level metal layer (metal1) or the bit-lines of the first and second banks 1 and 2, the data-line 3 for read, and the data-line 4 for program and verify from a second-level metal layer (metal2).

Figure 11:
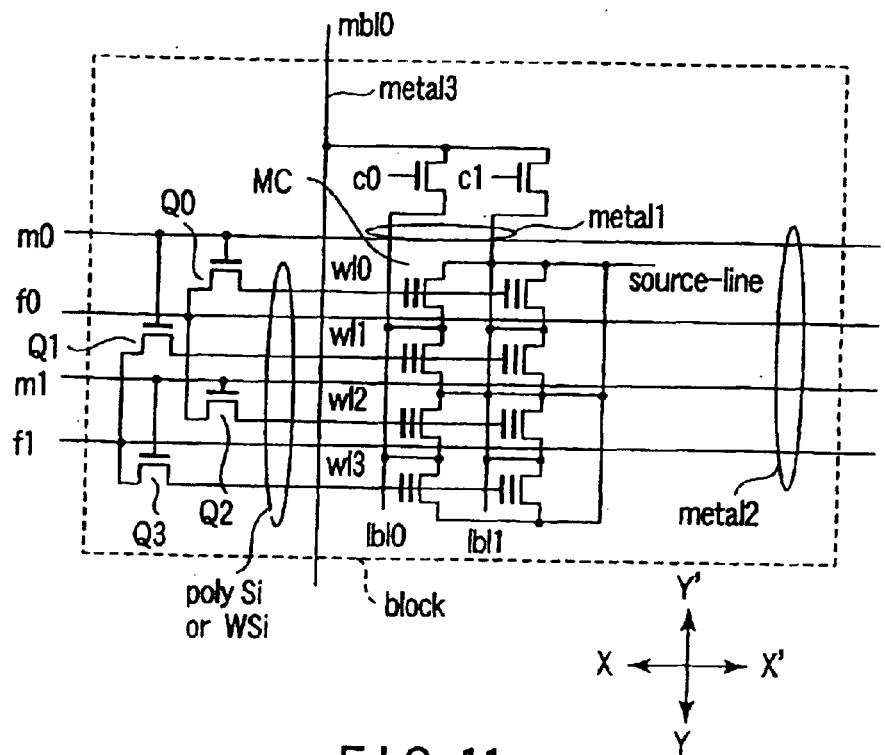
FIG. 11 is a circuit diagram showing part of one block for explaining another arrangement of the first and second banks in the circuit shown in FIG. 6.
Figure 12:
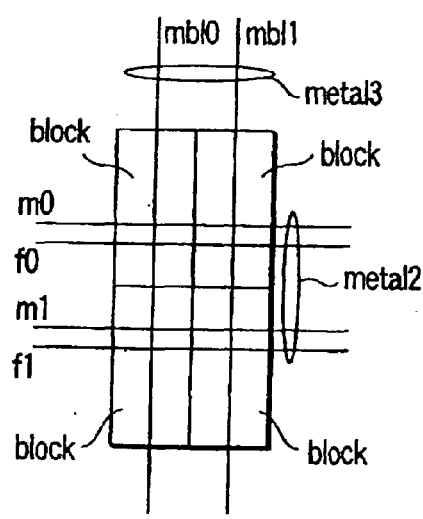
FIG. 12 is a block diagram showing the bit-lines of the first and second banks that are connected to the read data-line or the program & verify data-line for explaining the arrangement of the first and second banks in the circuit shown in FIG. 6.
Figure 13:
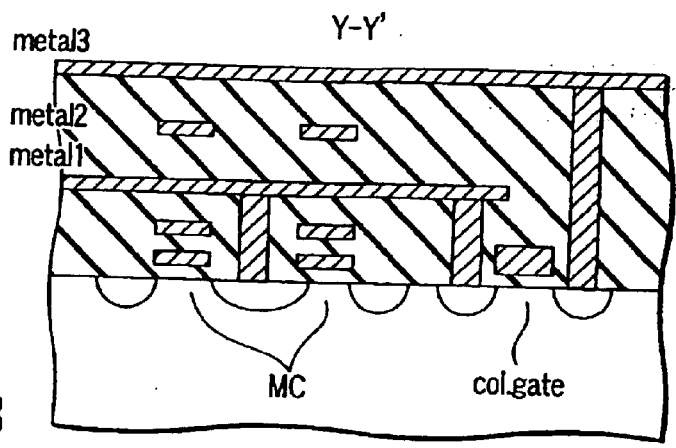
FIG. 13 is a sectional view of the block shown in FIG. 11 taken along the bit-line direction for explaining the arrangement of the first and second banks in the circuit shown in FIG. 6.
Figure 14:
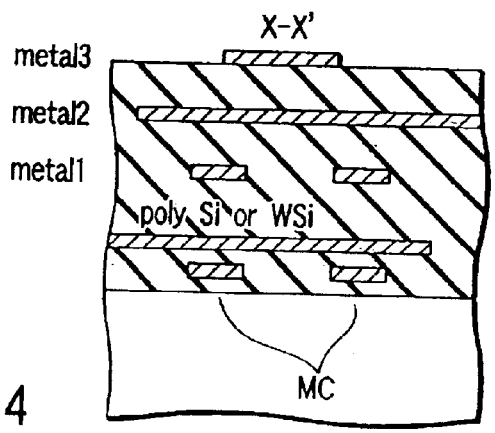
FIG. 14 is a sectional view of the block shown in FIG. 11 taken along the word-line direction for explaining the arrangement of the first and second banks in the circuit shown in FIG. 6.

FIGS. 11 to 14 explain another arrangement of the first and second banks in the circuit shown in FIG. 6. FIG. 11 is a circuit diagram showing part of one block. FIG. 12 is a block diagram showing the bit-lines of the first and second banks that are connected to the data-line for read or the data-line for program and verify. FIG. 13 is a sectional view of the block shown in FIG. 11 taken along the bit-line direction (line Y–Y'). FIG. 14 is a sectional view of the block shown in FIG. 11 taken along the word-line direction (line X–X').

In the block shown in FIG. 11, the memory cell transistors MC are arrayed in a matrix. The control gates of the memory cell transistors MC on respective rows are connected to the word-lines w10 to w13 made of poly-silicon or tungsten silicon. The word-lines w10 and w12 are commonly connected via the current paths of transistors Q0 and Q2. The common node is commonly connected to a wiring line f0 which is formed from a second-level metal layer and shared between blocks adjacent in the X–X' direction. The word-lines w11 and w13 are commonly connected via the current paths of transistors Q1 and Q3. The common node is commonly connected to a wiring line f1 which is formed from the second-level metal layer and shared between blocks adjacent in the X–X' direction. The gates of the transistors Q0 and Q1 are connected to a wiring line m0, and those of the transistors Q2 and Q3 are connected to a wiring line m1. The drains of the memory cell transistors MC on respective columns are connected to the local bit-lines lb10, lb11, . . . formed from a first-level metal layer. Their sources are commonly connected to a source-line. The local bit-lines lb10, lb11, . . . are commonly connected via the column gate to the main bit-line mb10 formed from a third-level metal layer.

As shown in FIGS. 12 to 14, the wiring lines f0, f1, . . . , m0, m1, . . . run through a plurality of blocks over the local bit-lines lb10, lb11, . . . . The main bit-line mb10 runs through a plurality of blocks in the Y–Y' direction over the local bit-lines lb10, lb11, . . . and the wiring lines f0, f1, . . . , m0, m1, . . . .

Since the main bit-line mb10 can be arranged on the wiring lines f0, f1, . . . , m0, m1, . . . and the local bit-line lb10, lb11, . . . and run through a plurality of blocks, this arrangement can reduce the pattern-occupied area and chip cost.

[Fourth Embodiment]

Figure 15:
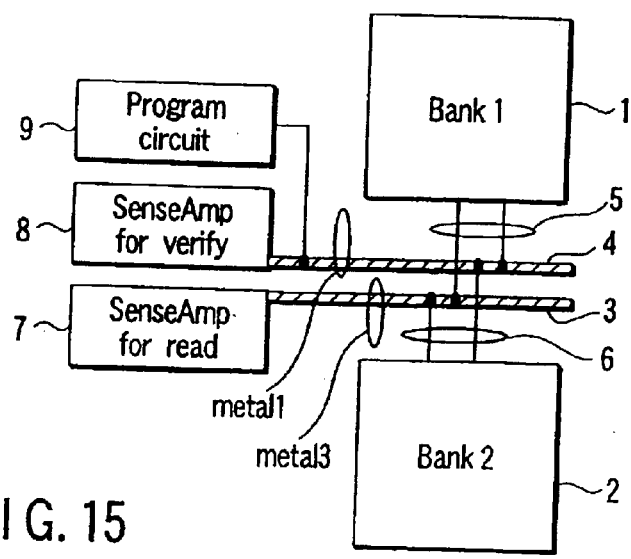
FIG. 15 is a block diagram showing only a main part for explaining a nonvolatile semiconductor memory according to the fourth embodiment of the present invention.

FIG. 15 shows only a main part for explaining a nonvolatile semiconductor memory according to the fourth embodiment of the present invention. This nonvolatile semiconductor memory has two banks. The drain wiring lines of memory cell transistors in first and second banks 1 and 2 are formed from a first-level metal layer. A data-line 3 for read formed from a third-level metal layer, and a data-line 4 for program and verify formed from the first-level metal layer are stacked and arranged (expressed flat in FIG. 15 in order to explain the connection) between the first and second banks 1 and 2. A bit-line 5 for the first bank 1 and a bit-line 6 for the second bank are formed from a second-level metal layer, and selectively connected to the data-line 3 for read and the data-line 4 for program and verify. The data-line 3 for read is connected to a sense amplifier 7 for read, whereas the data-line 4 for program and verify is connected to a sense amplifier 8 for program and verify and a program circuit 9.

The first and second banks 1 and 2 in the circuit shown in FIG. 15 are basically the same as those in FIGS. 11 to 15 except that the data-line 4 for program and verify is arranged below the data-line 3 for read.

Even in the above arrangement, the main bit-line can be arranged on the wiring lines and local bit-lines and run through a plurality of blocks. The pattern-occupied area can be reduced to decrease the chip cost.

Although the first to fourth embodiments have exemplified a 2-bank arrangement, the present invention can also be applied to an arrangement with four banks or more.

EXAMPLE

A concrete example of the nonvolatile semiconductor memory to which each of the above-described embodiments is applied will be explained in detail.

FIG. 16 is a block diagram showing the schematic arrangement of the nonvolatile semiconductor memory according to the embodiment of the present invention. The nonvolatile semiconductor memory comprises a memory cell array 11, row decoder 12, column decoder 13, block decoder 14, column gates 15, sense amplifier (amp) 16, program circuit 17, charge pumps 18, voltage switch 19, I/O buffer 20, controller 21, command register 22, and address buffer 23.

An address signal ADD input to the address buffer 23 is supplied to the row decoder 12, column decoder 13, and block decoder 14. At the same time, part of the address signal ADD is supplied to the command register 22. Write data WDA supplied to the I/O buffer 20 is supplied to the program circuit 17, and a command CMD is supplied to the command register 22. An output from the command register 22 is supplied to the controller 21 where the output is decoded. The controller 21 controls the sense amplifier 16, program circuit 17, charge pumps 18, and voltage switch 19. Output voltages Vddh, Vddr, and Vbb from the charge pumps 18 are respectively supplied to the voltage switch 19, column decoder 13, and block decoder 14. An output voltage Vddp from the charge pumps 18 is supplied to the program circuit 17. Output voltages VSWi and VBBi from the voltage switch 19 are supplied to the row decoder 12.

The write data WDA supplied from the program circuit 17 is supplied to a bit-line BLs of the memory cell array 11 via a column gate 15 selected by the column decoder 13, and written in a memory cell at the intersection between the bit-line BLs and a word-line WLs selected by the row decoder 12. At this time, a block to be programmed is designated by the block decoder 14.

Data RDA read out from a memory cell selected by the row decoder 12, column decoder 13, and block decoder 14 is supplied via the column gate 15 to the sense amplifier 16 where the data is sensed and amplified. The resultant data is read out via the I/O buffer 20.

FIG. 17 shows a more detailed arrangement of the nonvolatile semiconductor memory shown in FIG. 16. FIG. 17 shows the layout image of a 2-bank 16-Mbit flash memory having two redundancy blocks. Eight blocks are arranged from a power switch & decoder VolDec in the X direction. Signals Mi/MiB, Fi, and Hi output from the power switch & decoder VolDec are supplied via a second-level metal layer (metal2) which runs through cell arrays CellArray. A local bit-line is wired by a first-level metal layer, while a global bit-line is wired by a third-level metal layer (metal3). The global bit-line commonly connects three blocks for bank 0 from a column decoder ColDec8 on the second stage in the Y direction, and one block and two boot blocks for bank 1. A main bit-line connected to one selected column decoder ColDec8 is connected to a common data-line. The local bit-line of the redundancy block is connected to a data-line in replacement.

The arrangement of each block in the layout image shown in FIG. 17 will-be described.

FIG. 18A shows the circuit arrangement of a column gate 1stCOL1 for selectively connecting local bit-lines LBL0 to LBL3 of a block that are formed from a first-level metal layer to a main bit-line MBL formed from a third-level metal layer. FIG. 18B is a symbolic view of the column gate 1stCOL1 shown in FIG. 18A. As shown in FIG. 18A, the column gate 1stCOL1 is made up of transistors BQ0 to BQ3. In each of the transistors BQ0 to BQ3, one end of the current path is connected to a corresponding one of the local bit-lines LBL0 to LBL3, and its other end is connected to the main bit-line MBL. The gate of each transistor receives a corresponding one of decode signals BLKH0 to BLKH3 from a column decoder ColDec1.

FIGS. 19A and 19B are a block diagram and symbolic view, respectively, showing a column gate 1stCOL2 having eight column gates 1stCOL1 shown in FIGS. 18A and 18B. The column gate 1stCOL2 is arranged in correspondence with each I/O.

Figure 20B:
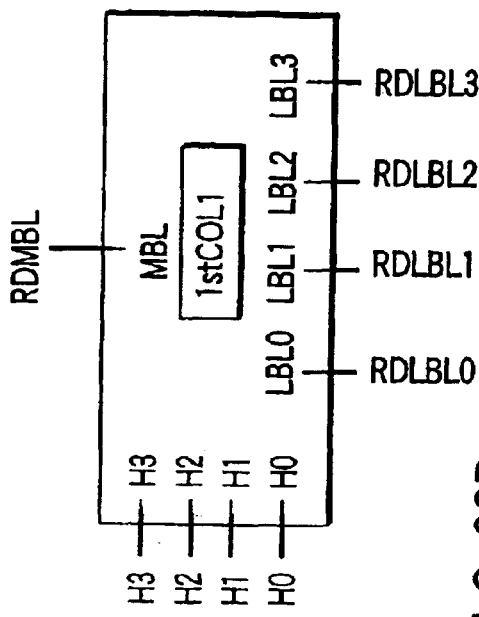
FIG. 20B is a block diagram showing a column redundancy column gate.
Figure 20A:
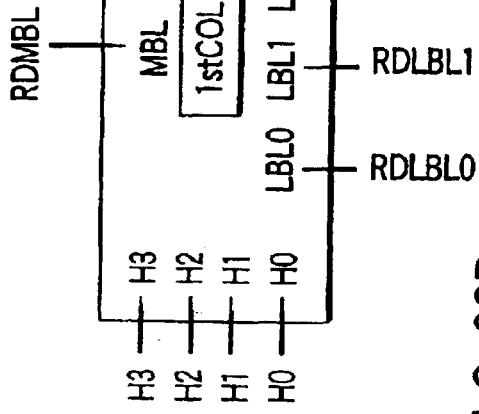
FIG. 20A is a block diagram showing a column gate.
Figure 20C:
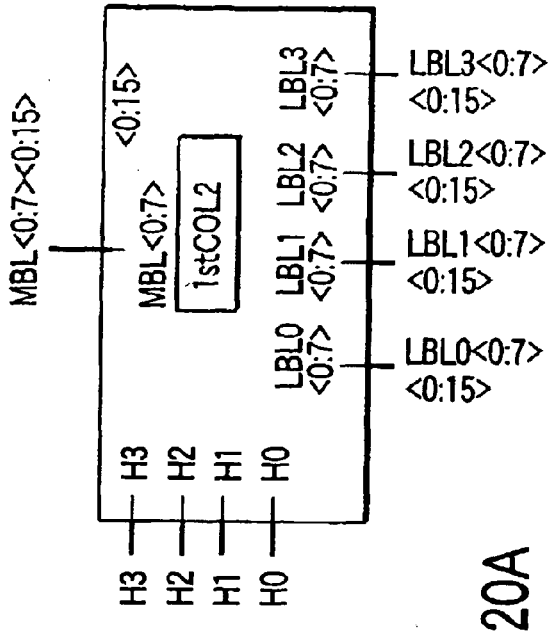
FIG. 20C is a symbolic view showing a column gate having 16 column gates shown in FIG. 20A and one column redundancy column gate shown in FIG. 20B.

FIGS. 20A to 20C show column gates, respectively. FIGS. 20A to 20C show a column gate 1stCOL3 (FIG. 20C) having 16 column gates 1stCOL2 for the word width (FIG. 20A), and one column redundancy column gate 1stCOL1 (FIG. 20B). The column redundancy column gate 1stCOL1 has four local bit-lines (RDLBL0 to RDLBL3), and one main bit-line (RDMBL), and can control a column selection signal by the same signals H0 to H3 as those of the main body. The column gate 1stCOL3 shown in FIG. 20C decodes 512 local bit-lines of the main body and four column redundancy bit-lines into 128 main bit-lines and one column redundancy bit-line.

Figures 21A, 21B:
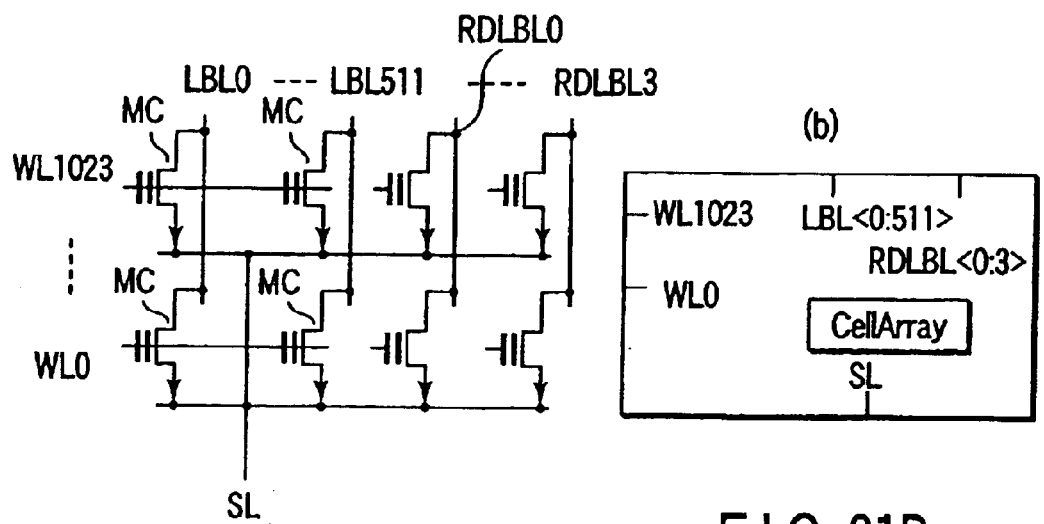
FIG. 21A is a circuit diagram showing a 512-Kbit memory cell array.
FIG. 21B is a symbolic view of the memory cell array shown in FIG. 21A.

FIGS. 21A and 21B show a 512-Kbit memory cell array CellArray. FIG. 21A is a circuit diagram, and FIG. 21B is a symbolic view. As shown in FIG. 21A, memory cell transistors MC including redundancy memory cell transistors MC are arrayed in a 516×1,024 matrix. The control gates of the memory cell transistors MC on respective rows are connected to word-lines WL0 to WL1023. Their drains on respective columns are connected to local bit-lines LBL0 to LBL511 and redundancy local bit-lines RDLBL0 to RDLBL3. Their sources are commonly connected to a source-line SL.

Figures 22A, 22B:
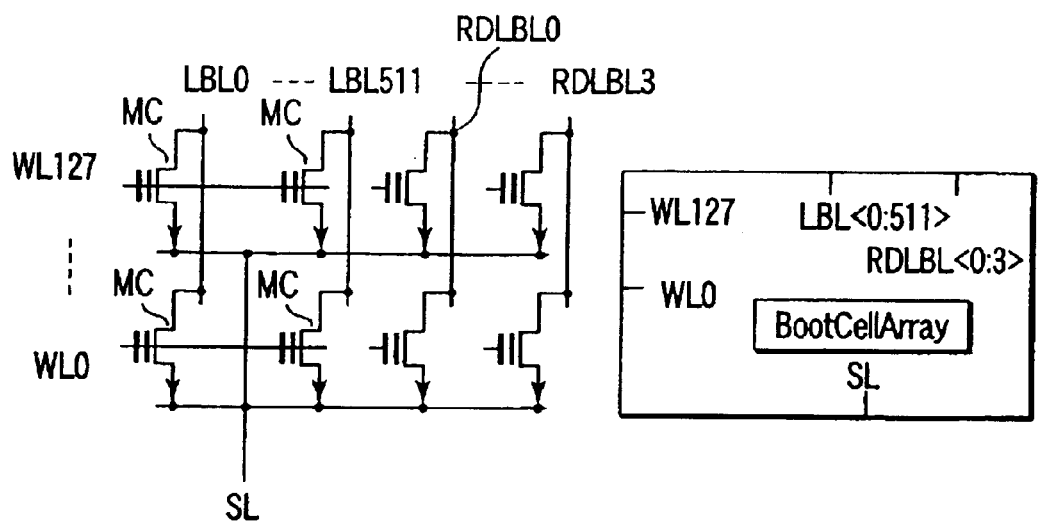
FIG. 22A is a circuit diagram showing a 64-Kbit boot block memory cell array.
FIG. 22B is a symbolic view of the boot block cell array shown in FIG. 22A.

FIGS. 22A and 22B show a 64-Kbit boot block cell array BootCellArray. FIG. 22A is a circuit diagram, and FIG. 22B is a symbolic view. As shown in FIG. 22A, the boot block cell array BootCellArray comprises 128 word-lines, and its column has the same arrangement as that of the main body. More specifically, memory cell transistors MC including redundancy memory cell transistors MC are arrayed in a 516×128 matrix. The control gates of the memory cell transistors MC on respective rows are connected to word-lines WL0 to WL1273. Their drains on respective columns are connected to local bit-lines LBL0 to LBL511 and redundancy local bit-lines RDLBL0 to RDLBL3. Their sources are commonly connected to the source-line SL.

FIGS. 23A and 23B show a row decoder RowDec0 connected to each word-line. FIG. 23A is a circuit diagram, and FIG. 23B is a symbolic view. As shown in FIG. 23A, the row decoder RowDec0 is comprised of a transfer gate made up of an N-channel transistor n1 and P-channel transistor p1, and an N-channel transistor n2. The transfer gate is controlled by a pre-decode signal pair Mi/MiB, and controls whether to supply a signal BLKFj to word-lines WLi and WLj. The gate of the transistor n2 receives the pre-decode signal MiB, and is ON/OFF-controlled. When the word-lines WLi and WLj are not selected, the N-channel transistor n2 supplies an unselected word-line potential VBBBi.

FIGS. 24A and 24B show row decoders controlled by the pre-decode signal pair Mi/MiB. A row decoder RowDec1 shown in FIG. 24B is constituted by eight row decoders RowDec0 as shown in FIG. 24A. Eight adjacent word-lines are controlled by the same pre-decode signal pair Mi/MiB.

FIG. 25 shows a row decoder RowDec2 having 128 row decoders RowDec1 shown in FIGS. 24A and 24B. In this case, 1,024 word-lines in the 512-Kbit memory cell array CellArray are decoded by a combination of eight signals BLKFi and 128 pre-decode signal pairs Mi/MiB.

FIGS. 26A and 26B show a pre-decoder RowDec3 which outputs the pre-decode signal pair Mi/Mib. FIG. 26A is a circuit diagram, and FIG. 26B is a symbolic view. As shown in FIG. 26A, the pre-decoder comprises an AND gate AND1 which receives an erase signal ERASEB and a row address RA <3:9>, and a level shifter LS1 which operates at voltages VSWi and VBBi. The pre-decoder outputs the pre-decode signal pair Mi/Mib from the level shifter LS1.

FIGS. 27A and 27B show a row decoder RowDec4 having 128 pairs of pre-decoders RowDec3 shown in FIGS. 26A and 26B (FIG. 27A). FIG. 27B is a symbolic view. In this case, 128 pairs of pre-decode signal pairs Mi/Mib are decode signals of seven row addresses RA <3:9>. In erase, an erase signal ERASEB changes to low level, and all the 128 pairs of pre-decode signal pairs Mi/Mib change to a non-selection state.

FIGS. 28A and 28B show a row decoder RowDec5 which drives a selected word-line. FIG. 28A is a circuit diagram, and FIG. 28B is a symbolic view. As shown in FIG. 28A, the row decoder RowDec5 comprises an AND gate AND2 which receives an erase signal ERASEB and a row address RA <0:2>, and a level shifter LS2 which operates at the voltages VSWi and VBBi. The row decoder RowDec5 decodes the row address RA <0:2>, and outputs a signal Fi from the level shifter LS2.

FIGS. 29A and 29B are a block diagram and symbolic view, respectively, showing a row decoder RowDec6 made up of eight row decoders RowDec5.

FIGS. 30A and 30B show a block decoder BlockDec. FIG. 30A is a circuit diagram, and FIG. 30B is a symbolic view. As shown in FIG. 30A, the block decoder 14 comprises AND gates AND3 and AND4, level shifters LS3 to LS6, and an inverter INV1. The AND gate AND3 receives a block address BA <0:2>, and an output signal from the AND gate AND3 is supplied to the level shifter LS3, the level shifter LS4, and one input terminal of the AND gate AND4. The other input terminal of the AND gate AND4 receives an erase signal ERASE (signal opposite in phase to the erase signal ERASEB). An output signal from the AND gate AND4 is supplied to the level shifters LS5 and LS6.

The level shifter LS3 operates at the voltages VSWi and VBBi, and outputs a signal BSH. The level shifter LS4 operates at voltages VSWCi and GND, and outputs a signal BSHH. The level shifter LS5 operates at the voltages VSWCi and GND, and drives a cell source-line SLi of a block i. The level shifter LS6 operates at the voltages VSWi and VBBi, and an output from the level shifter LS6 is output as the signal VBBBi via the inverter INV1 which operates at the voltages GND and VBBBi.

More specifically, the block decoder BlockDec outputs the signals BSH and BSHH at different levels that are obtained by decoding the block address BA <0:2>. In erase selection of the block i, the block decoder BlockDec applies the voltage VSWCi to the sell source-line SLi of the block i. The signal VBBBi gives a non-selection word-line potential, and changes to VBBi level in erase selection.

Figure 31A:
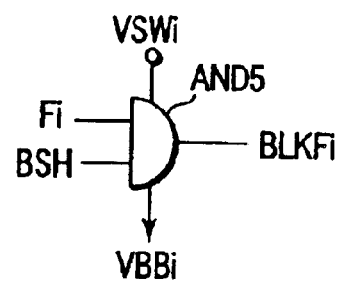
FIG. 31A is a circuit diagram showing a row decoder (signal BLKFi generation circuit)
Figure 31B:
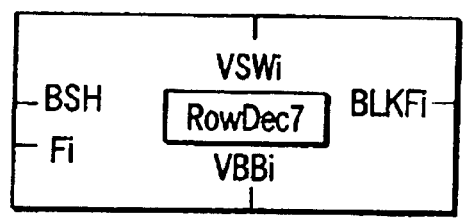
FIG. 31B is a symbolic view of the row decoder shown in FIG. 31A.

FIGS. 31A and 31B show a row decoder RowDec7 (signal BLKFi generation circuit). FIG. 31A is a circuit diagram, and FIG. 31B is a symbolic view. The row decoder RowDec7 is formed from an AND gate AND5 which operates at the voltages VSWi and VBBi. The row decoder RowDec7 generates a signal BLKFi by ANDing the signals Fi and BSH.

Figure 32A:
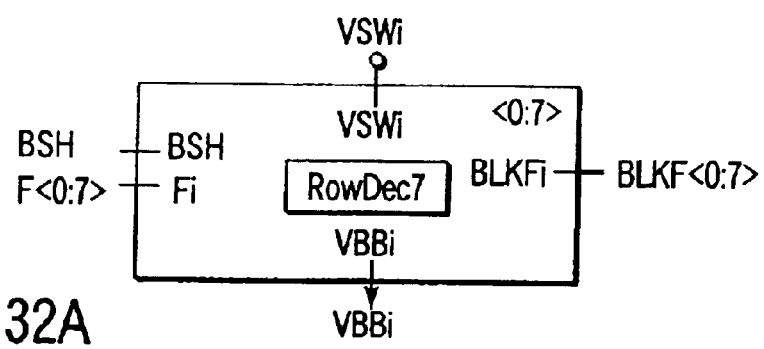
FIG. 32A is a block diagram showing a row decoder constituted by eight row decoders shown in FIGS. 31A and 31B.
Figure 32B:
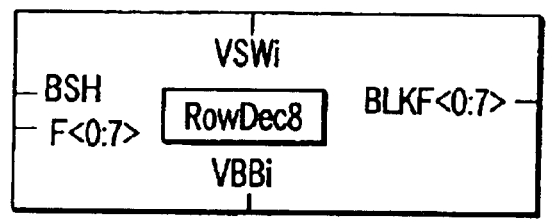
FIG. 32B is a symbolic view of the row decoder shown in FIG. 32A.

FIGS. 32A and 32B show a row decoder RowDec8 constituted by eight row decoders RowDec7 shown in FIGS. 31A and 31B. FIG. 32A is a block diagram, and FIG. 32B is a symbolic view.

Figures 33A, 33B:
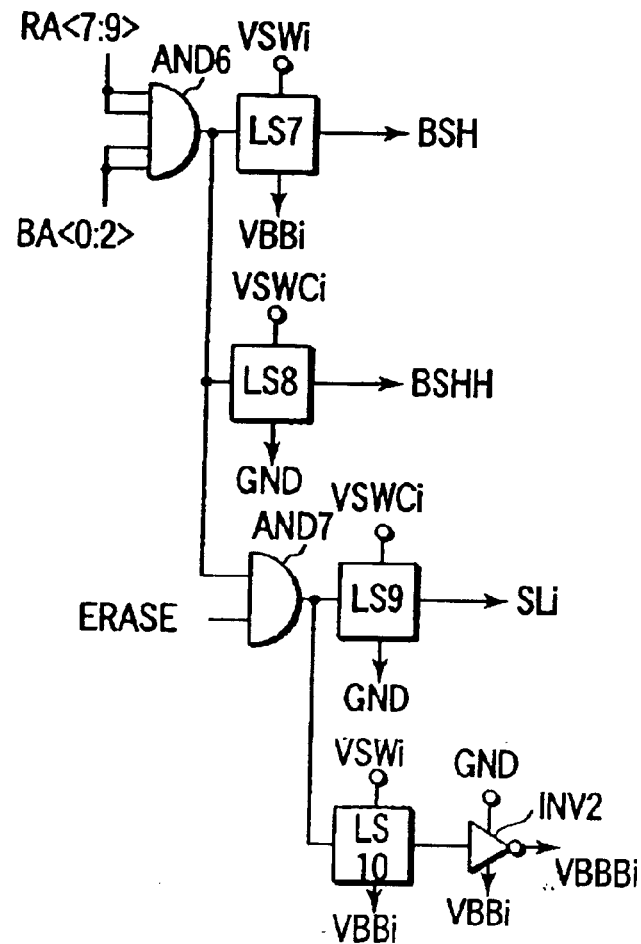
FIG. 33A is a circuit diagram showing a block decoder for a boot block.
FIG. 33B is a symbolic view of the block decoder shown in FIG. 33A.

FIGS. 33A and 33B show a block decoder BootBlockDec for a boot block. FIG. 33A is a circuit diagram, and FIG. 33B is a symbolic view. As shown in FIG. 33A, the block decoder BootBlockDec for a boot block comprises AND gates AND6 and AND7, level shifters LS7 to LS10, and an inverter INV2. The AND gate AND6 receives a row address RA <7:9> and block address BA <0:2>, and an output signal from the AND gate AND6 is supplied to the level shifter LS7, the level shifter LS8, and one input terminal of the AND gate AND7. The other input terminal of the AND gate AND7 receives the erase signal ERASE, and an output signal from the AND gate AND7 is supplied to the level shifters LS9 and LS10.

The level shifter LS7 operates at the voltages VSWi and VBBi, and outputs a signal BSH. The level shifter LS8 operates at the voltages VSWCi and GND, and outputs a signal BSHH. The level shifter LS9 operates at the VSWCi and GND, and drives the cell source-line SL. The level shifter LS10 operates at the voltages VSWi and VBBi, and an output from the level shifter LS10 is output as the signal VBBBi via the inverter INV2 which operates at the voltages GND and VBBi.

In this arrangement, when all the bits of the row address RA <7:9> change to high level, a boot block is selected. Eight boot blocks BootBLK are selected by the row address RA <7:9>.

Figure 34A:
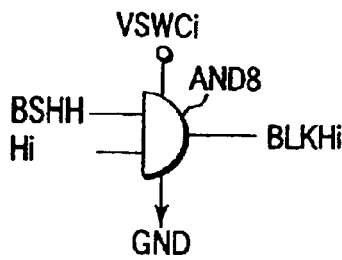
FIG. 34A is a circuit diagram showing a column decoder (signal BLKHi generation circuit)
Figure 34B:
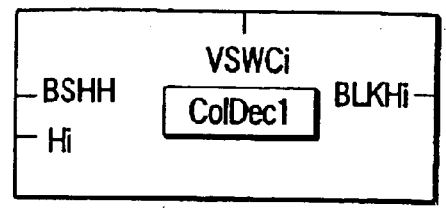
FIG. 34B is a symbolic view of the column decoder shown in FIG. 34A.

FIGS. 34A and 34B show the column decoder ColDec1 (signal BLKHi generation circuit). FIG. 34A is a circuit diagram, and FIG. 34B is a symbolic view. The column decoder ColDec1 is formed from an AND gate AND8 which operates at the voltages VSWCi and GND. The column decoder ColDec1 generates a signal BLKHi by ANDing the signals BSHH and Hi.

Figure 35A:
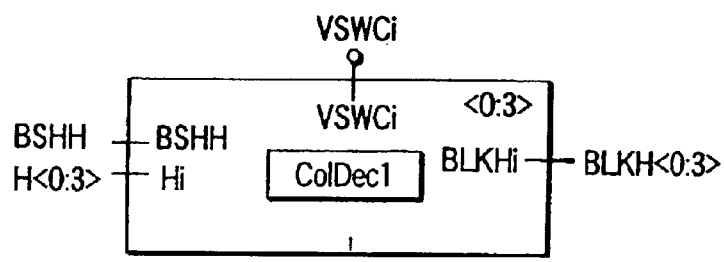
FIG. 35A is a block diagram showing a column decoder constituted by four column decoders shown in FIGS. 34A and 34B.
Figure 35B:
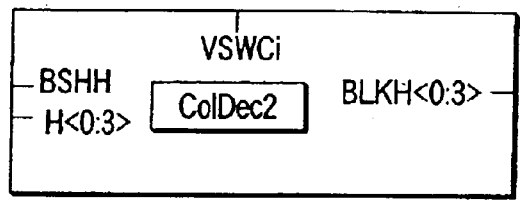
FIG. 35B is a symbolic view of the column decoder shown in FIG. 35A.

FIGS. 35A and 35B show a column decoder ColDec2. FIG. 35A is a block diagram, and FIG. 35B is a symbolic view. The column decoder ColDec2 is comprised of four column decoders ColDec1. In FIGS. 35A and 35B, a signal H <0:3> is obtained by level-converting a decode signal at a column address CA <3:4>.

Figure 36A:
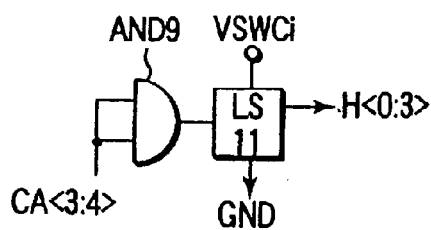
FIG. 36A is a circuit diagram showing an arrangement of the column decoder.
Figure 36B:
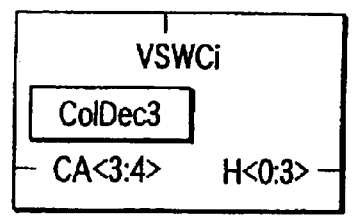
FIG. 36B is a symbolic view of the column decoder shown in FIG. 36A.

FIGS. 36A and 36B show an arrangement of a column decoder ColDec3. FIG. 36A is a circuit diagram, and FIG. 36B is a symbolic view. The column decoder ColDec3 is made up of an AND gate AND9 which receives the column address CA <3:4>, and a level shifter LS11 which receives an output signal from the AND gate AND9 and operates at the voltages VSWCi and GND. The column decoder ColDec3 generates a signal H <0:3>.

Figure 37A:
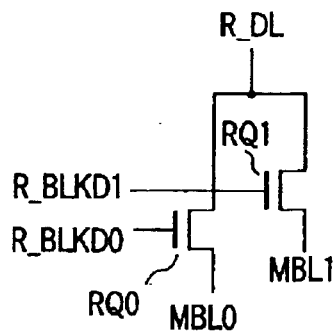
FIG. 37A is a circuit diagram showing a column gate which selectively connects a main bit-line and read-only data-line.
Figure 37B:
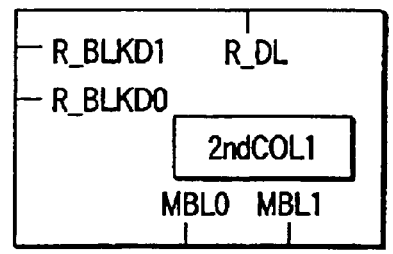
FIG. 37B is a symbolic view of the column gate shown in FIG. 37A.

Main bit-lines MBL0 and MBL1 are selectively connected to a read-only data-line R_DL via a column gate 2ndCOL1 as shown in FIGS. 37A and 37B. FIG. 37A is a circuit diagram, and FIG. 37B is a symbolic view. As shown in FIG. 37A, the column gate 2ndCOL1 comprises transistors RQ0 and RQ1. In the transistor RQ0, one end of the current path is connected to the main bit-line MBL0, and its other end is connected to the read-only data-line R_DL. The gate of the transistor RQ0 receives a read column gate selection signal R_BLKD0. In the transistor RQ1, one end of the current path is connected to the main bit-line MBL1, and its other end is connected to the read-only data-line R_DL. The gate of the transistor RQ1 receives a read column gate selection signal R_BLKD1.

Figure 38A:
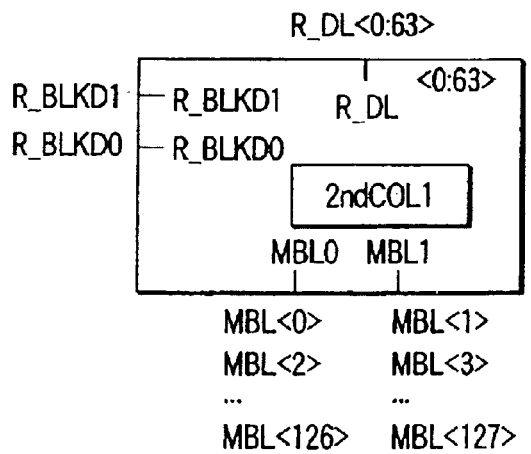
FIG. 38A is a block diagram showing a column gate having 64 column gates shown in FIGS. 37A and 37B.
Figure 38B:
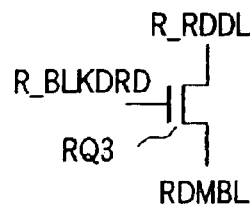
FIG. 38B is a circuit diagram for explaining the connection between the column redundancy main bit-line and column redundancy data-line of each bit.
Figure 38C:
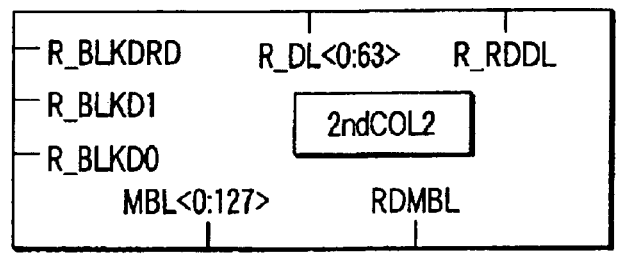
FIG. 38C is a symbolic view showing a column gate having 64 column gates shown in FIGS. 37A and 37V.

As shown in FIGS. 38A to 38C, when the page length is 4 words or 64 bits, decoding is done by a column gate 2ndCOL2 made up of 64 column gates 2ndCOL1 shown in FIGS. 37A and 37B. As shown in FIG. 38B, a column redundancy main bit-line RDMBL of each bit is connected to a column redundancy data-line R_RDDL via the current path of a transistor RQ3 whose gate receives a signal R_BLKDRD.

Figure 39A:
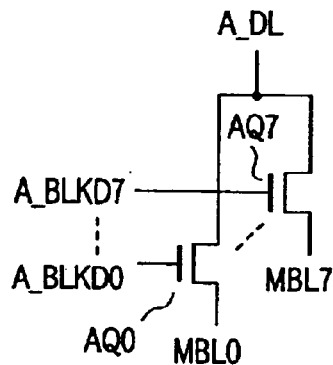
FIG. 39A is a circuit diagram showing a column gate which decodes a signal on the main bit-line in program or verify and selectively supplies the signal to an auto-only data-line.
Figure 39B:
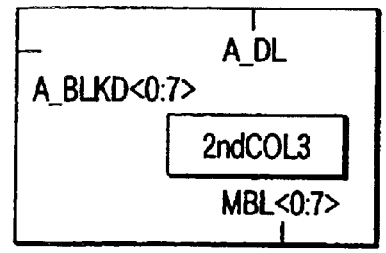
FIG. 39B is a symbolic view of the column gate shown in FIG. 39A.

FIGS. 39A and 39B show a column gate 2ndCOL3 which decodes signals on main bit-lines MBL0 to MBL7 in program or verify, and selectively supplies the signals to an auto-only data-line A_DL. FIG. 39A is a circuit diagram, and FIG. 39B is a symbolic view. As shown in FIG. 39A, the column gate 2ndCOL3 comprises transistors AQ0 to AQ7. In each of the transistors AQ0 to AQ7, one end of the current path is connected to a corresponding one of the main bit-lines MBL0 to MBL7, and its other end is connected to the auto-only data-line A_DL. The gate of each transistor receives a corresponding one of signals A_BLKD0 to A_BLKD7.

Figure 40A:
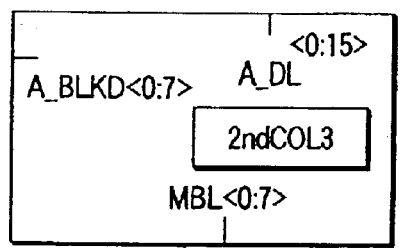
FIG. 40A is a block diagram showing a column gate formed using the column gate shown in FIGS. 39A and 39B.
Figure 40B:
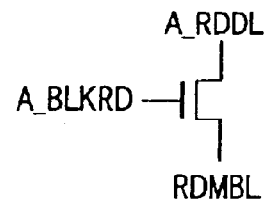
FIG. 40B is a circuit diagram for explaining the connection between the column redundancy main bit-line and A_RDDL of each bit.
Figure 40C:
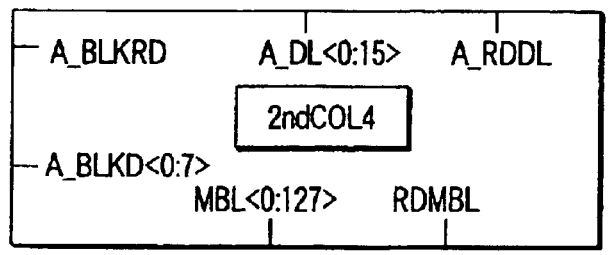
FIG. 40C is a symbolic view showing a column gate formed using the column gate shown in FIGS. 39A and 39B.

FIGS. 40A to 40C show a column gate 2ndCOL4 constituted by the column gate 2ndCOL3 shown in FIGS. 39A and 39B. FIG. 40A is a block diagram. FIG. 40B is a circuit diagram for explaining the connection between the column redundancy main bit-line of each bit and A_RDDL. FIG. 40C is a symbolic view.

Figure 41A:
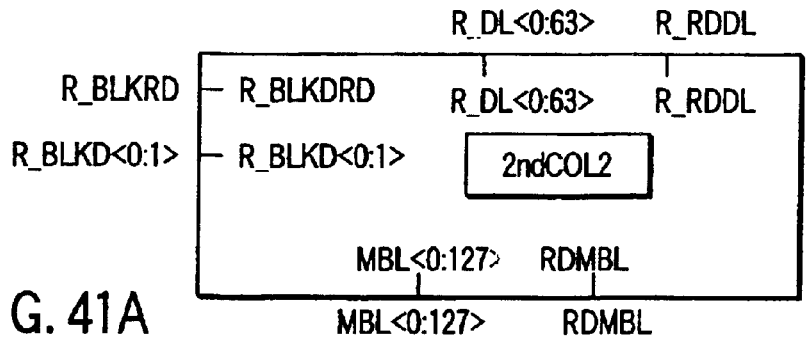
FIGS. 41A and 41B are block diagrams showing a column gate which selectively connects 128 main bit-lines and one redundancy main bit-line to 64+1 read data-lines and 16+1 auto data-lines.
Figure 41B:
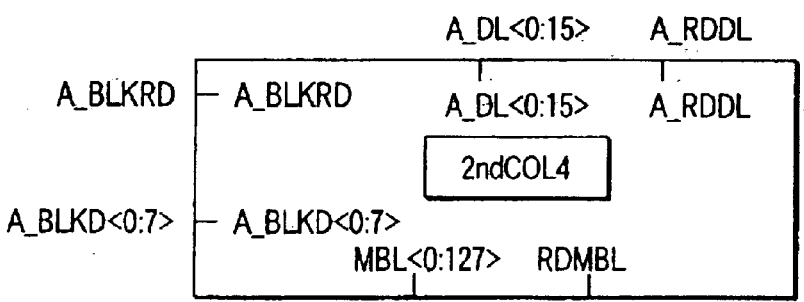
Figure 41C:
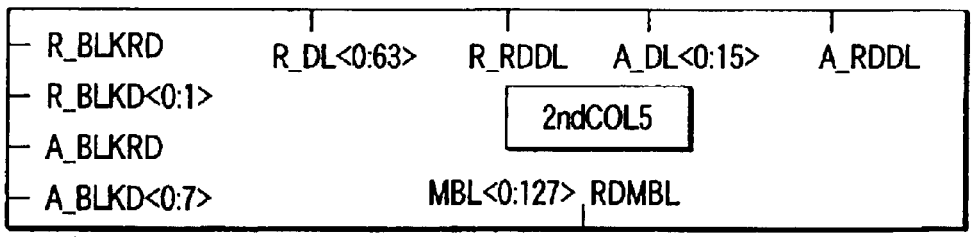
FIG. 41C is a symbolic view of the column gate shown in FIGS. 41A and 41B.

FIGS. 41A to 41C show a column gate 2ndCOL5 which selectively connects 128 main bit-lines MBL <0:127> and one column redundancy main bit-line RDMBL to 64+1 read data-lines and 16+1 auto data-lines. FIGS. 41A and 41B are block diagrams, and FIG. 41C is a symbolic view.

FIGS. 42A and 42B show a decoder McolDec1 which outputs a signal R_JHH. FIG. 42A is a circuit diagram, and FIG. 42B is a symbolic view. As shown in FIG. 42A, the decoder McolDec1 is made up of an AND gate AND10 which receives a read target bank signal R_BANKi and read-only block address signal R_BA <0:2>, and a level shifter LS12 which operates at the voltages VSWCi and GND. The signal R_JHH is given by the decode signals of the read target bank signal R_BANKi and read-only block address signal R_BA <0:2>.

FIGS. 43A and 43B show a decoder McolDec2 which outputs a read column gate selection signal R_BLKDi. FIG. 43A is a circuit diagram, and FIG. 43B is a symbolic view. The decoder McolDec2 is formed from an AND gate AND12 which operates at the voltages VSWCi and GND and receives a signal R_GDi and the signal R_JHH output from the decoder McolDec1 shown in FIGS. 42A and 42B. The decoder McolDec2 outputs the read column gate selection signal R_BLKDi.

FIGS. 44A and 44B show a decoder McolDec3 having three decoders McolDec2. FIG. 44A is a block diagram, and FIG. 44B is a symbolic view.

Similarly, FIGS. 45A and 45B, 46A and 46B, and 47A and 47B show auto column gate signal decoders McolDec4, McolDec5, and McolDec6, respectively. Although the input and output signals are different, the decoders McolDec4, McolDec5, and McolDec6 have basically the same arrangements as those of the decoders in FIGS. 42A and 42B, 43A and 43B, and 44A and 44B. More specifically, the decoder McolDec4 is made up of an AND gate AND13 and level shifter LS13, and the decoder McolDec5 is formed from an AND gate AND14. The decoder McolDec6 is constituted by nine decoders McolDec5.

Figure 48A:
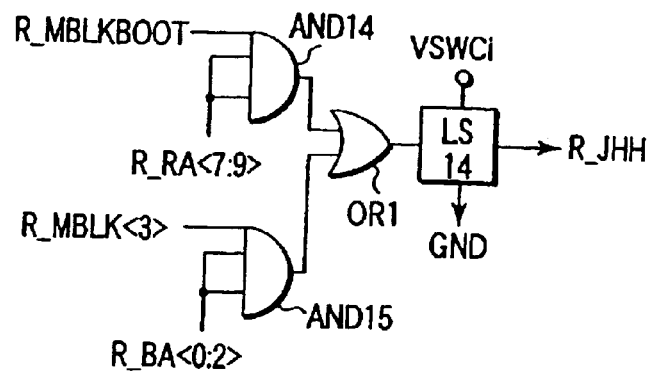
FIG. 48A is a circuit diagram showing a column gate activation signal decoder for a bank including a boot block.

FIGS. 48A and 48B, and 49A and 49B show column gate activation signal decoders McolDec1Boot and McolDec4Boot for a bank including a boot block. As shown in FIG. 48A, the decoder McolDec1Boot comprises an AND gate AND14 which receives signals R_MBLKBOOT and R_RA <7:9>, an AND gate AND15 which receives signals R_MBLK <3> and R_BA <0:2>, an OR gate OR1 which receives output signals from the AND gates AND14 and AND15, and a level shifter LS14 which operates at the voltages VSWCi and GND and level-shifts an output signal from the OR gate OR1. The decoder McolDec1Boot outputs a signal R_JHH from the level shifter LS14.

Figure 48B:
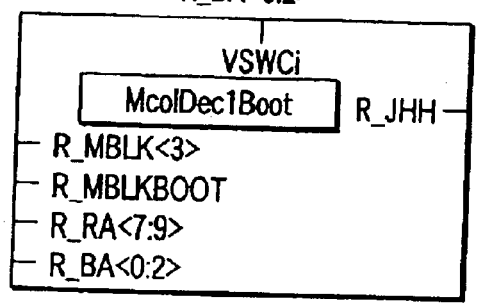
FIG. 48B is a symbolic view of the decoder shown in FIG. 48A.
Figure 49A:
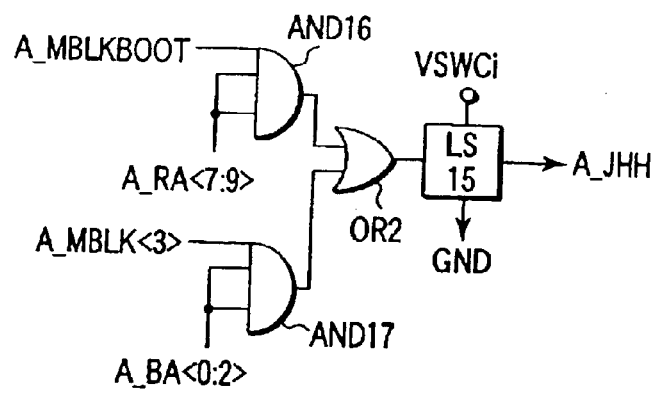
FIG. 49A is a circuit diagram showing another column gate activation signal decoder for a bank including a boot block.
Figure 49B:
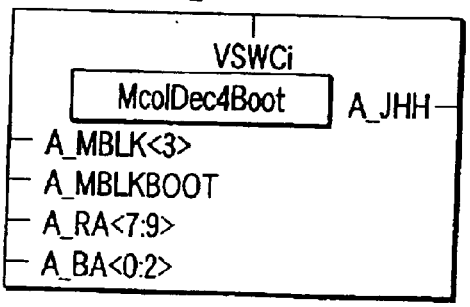
FIG. 49B is a symbolic view of the decoder shown in FIG. 49A.

As shown in FIG. 49A, the decoder McolDec4Boot comprises an AND gate AND16 which receives signals A_MBLKBOOT and A_RA <7:9>, an AND gate AND17 which receives signals A_MBLK <3> and A_BA <0:2>, an OR gate OR2 which receives output signals from the AND gates AND16 and AND17, and a level shifter LS15 which operates at the voltages VSWCi and GND and level-shifts an output signal from the OR gate OR2. The decoder McolDec4Boot outputs a signal A_JHH from the level shifter LS15. FIGS. 48B and 49B are symbolic views showing the decoders McolDec1Boot and McolDec4Boot.

Figures 50A, 50B:
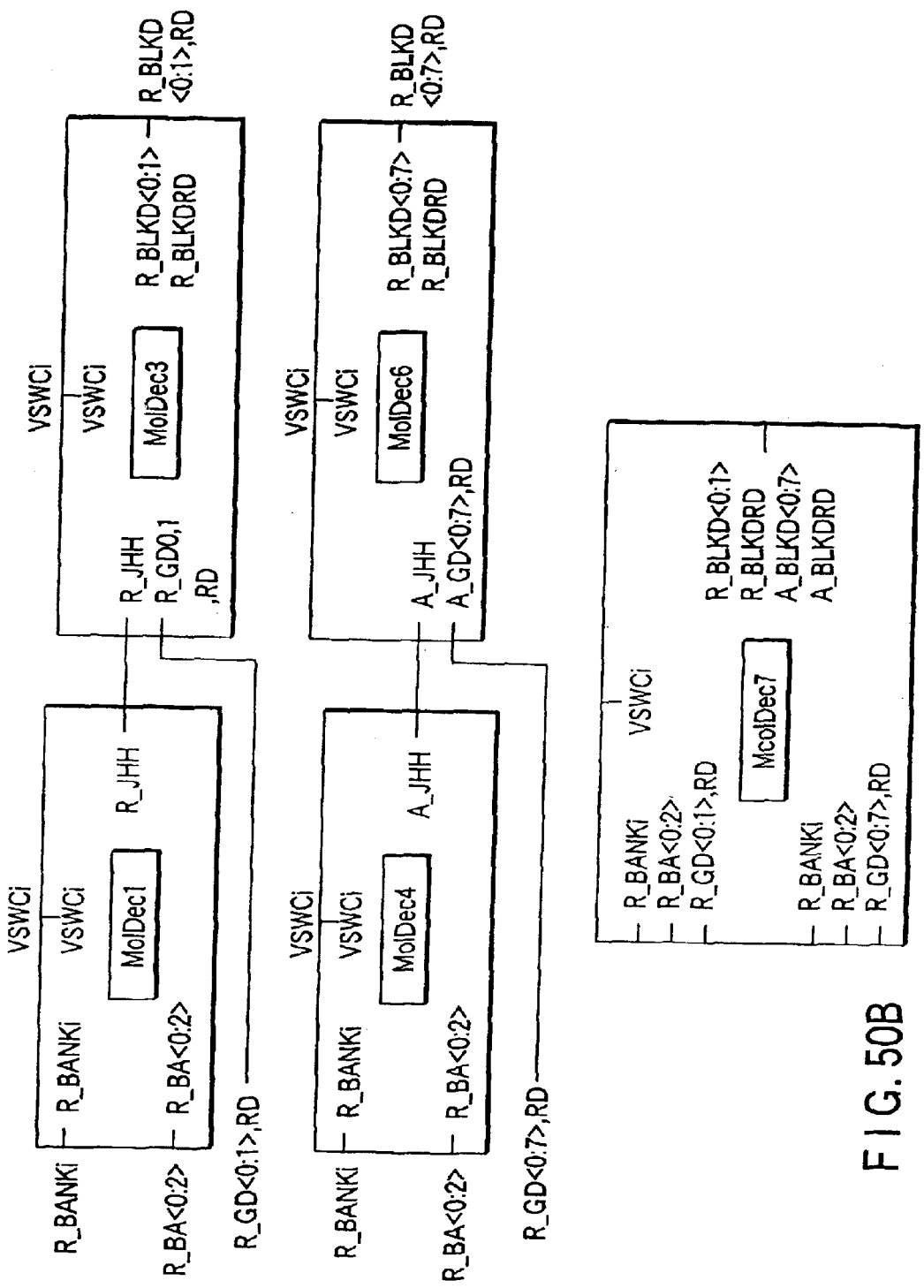
FIG. 50A is a block diagram showing a decoder which outputs signals R_BLKD <0:1>, R_BLKDRD, A_BLKD <0:7>, and A_BLKDRD.
FIG. 50B is a symbolic view of the decoder shown in FIG. 50A.

FIGS. 50A and 50B show a decoder McolDec7 which outputs signals R_BLKD <0:1>, R_BLKDRD, A_BLKD <0:7>, and A_BLKDRD. FIG. 50A is a block diagram showing the arrangement, and FIG. 50B is a symbolic view. As shown in FIG. 50A, the decoder McolDec7 is constituted by connecting the decoders McolDec1 and McolDec3 to each other and the decoders McolDec4 and McolDec6 to each other.

Figures 51A, 51B:
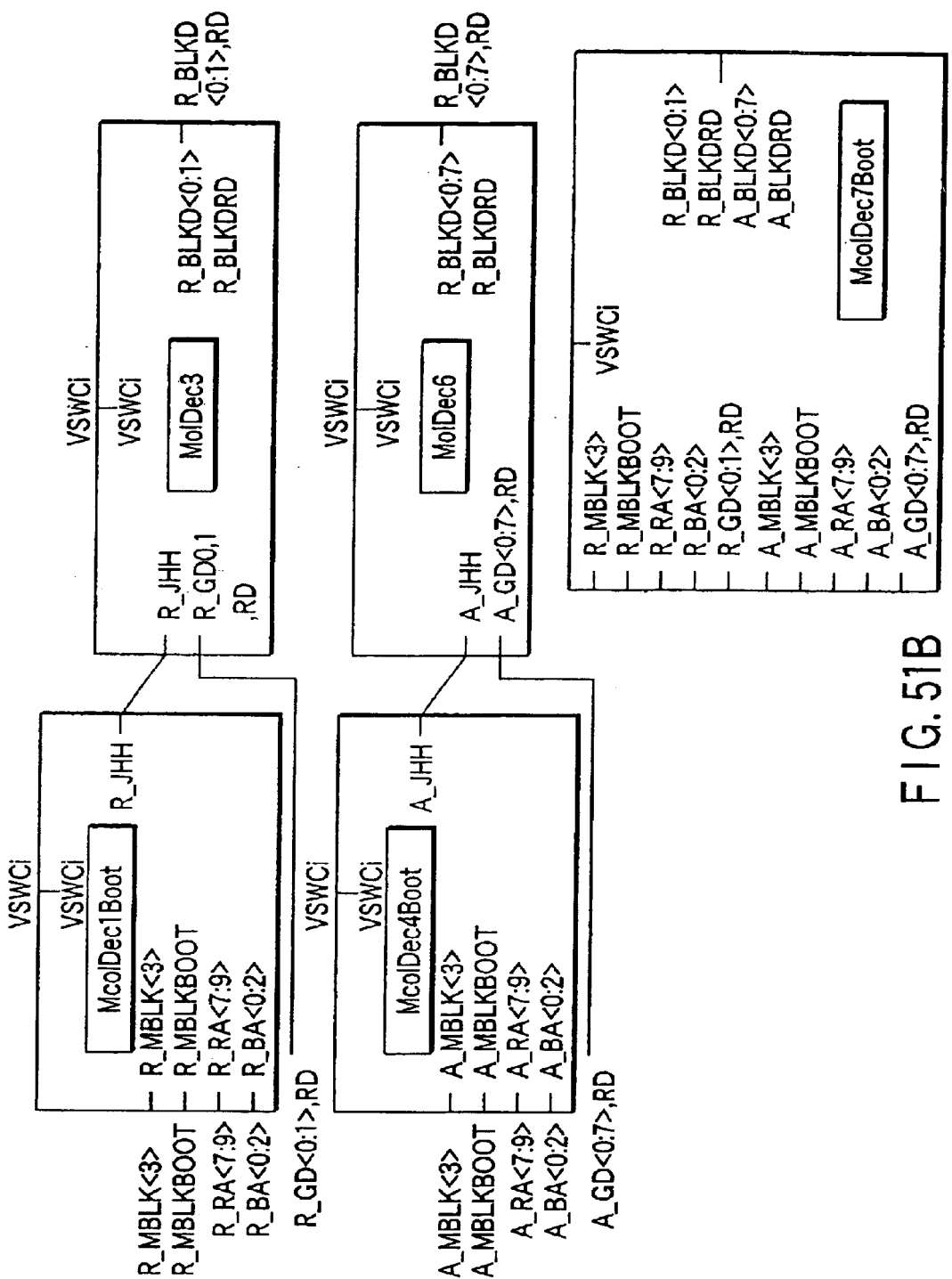
FIG. 51A is a block diagram showing a decoder which outputs a column gate signal for a bank including a boot block.
FIG. 51B is a symbolic view of the decoder shown in FIG. 51A.

FIGS. 51A and 51B are a decoder McolDec7Boot which outputs a column gate signal for a bank including a boot block. FIG. 51A is a block diagram showing the arrangement, and FIG. 51B is a symbolic view. As shown in FIG. 51A, the decoder McolDec7Boot is constituted by connecting the decoders McolDec1Boot and McolDec3 to each other and the decoders McolDec4Boot and McolDec6 to each other.

FIGS. 52A, 52B, 53A, and 53B show the connection between column gate signal outputs and decoder column gates for a bank including no boot block and a bank including a boot block. FIGS. 52A and 53A are block diagrams showing arrangements, and FIGS. 52B and 53B are symbolic views. As shown in FIG. 52A, the column decoder ColDec8 is formed by connecting the output terminal of the decoder McolDec7 and the input terminal of the decoder 2ndCOL5. As shown in FIG. 53A, a decoder ColDec8Boot is obtained by connecting the output terminal of the decoder McolDec7Boot and the input terminal of the decoder 2ndCOL5.

FIGS. 54A, 54B, 55A, 55B, and 56 show a global decoder ColGlobalDec for a column gate selection signal. FIGS. 54A, 54B, 55A, and 55B show circuits which generate respective decode signals. FIG. 56 is a symbolic view of the global decoder ColGlobalDec. FIG. 54A shows a circuit which generates a signal R_GD <0:1>. FIG. 54B shows a circuit which generates a signal R_GDRD. FIG. 55A shows a circuit which generates a signal A_GD <0:7>. FIG. 55B shows a circuit which generates a signal A_GDRD. These circuits comprise AND gates (AND18 to AND21) and level shifters (LS16 to LS19).

FIGS. 57A to 57C and FIGS. 58A to 58C show the connection between global column gate signal outputs and column decoders for a bank including no boot block and a bank including a boot block. Output signals R_GD <0:1>, R_GDRD, A_GD <0:7>, and A_GDRD from the global decoder ColGlobalDec shown in FIG. 57A are supplied to the column decoder ColDec8 shown in FIG. 57B. The column decoder ColDec8 drives the main bit-lines and redundancy main bit-lines MBL0 <0:127>, RDMBL0, . . . , MBL7 <0:127>, and RDMBL7. FIG. 57C is a symbolic view of a decoder ColDec9 formed from the global decoder ColGlobalDec and column decoder ColDec8.

Output signals R_GD <0:1>, R_GDRD, A_GD <0:7>, and A_GDRD from the global decoder ColGlobalDec shown in FIG. 58A are supplied to the column decoder ColDec8Boot shown in FIG. 58B. The column decoder ColDec8Boot drives the main bit-lines and redundancy main bit-lines MBL0 <0:127>, RDMBL0, . . . , MBL7 <0:127>, and RDMBL7. FIG. 58C is a symbolic view of a decoder ColDec9Boot formed from the global decoder ColGlobalDec and column decoder ColDec8Boot.

Figures 59A, 59B:
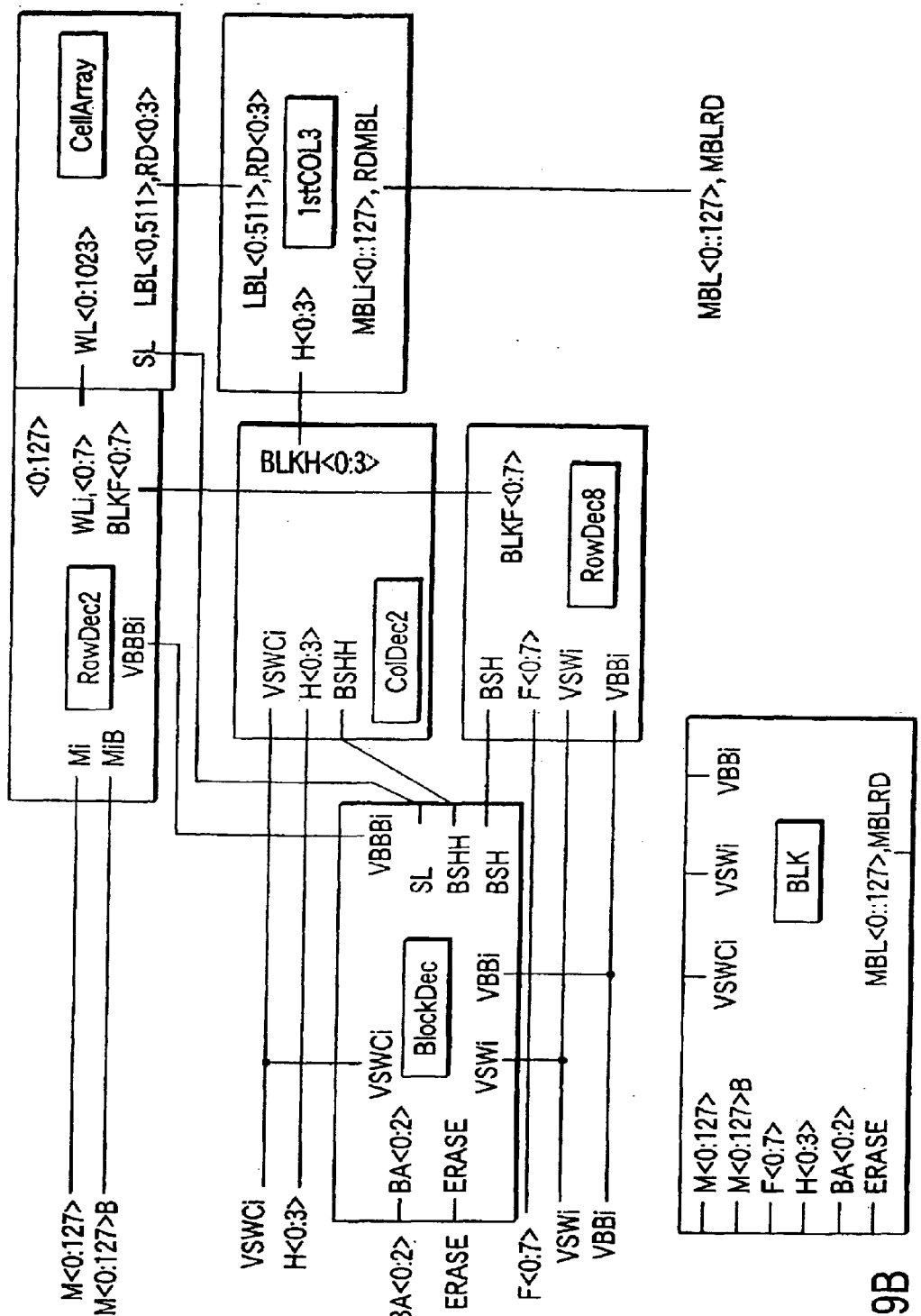
FIG. 59A is a block diagram showing a 512-Kbit block arrangement.
FIG. 59B is a symbolic view of the block arrangement shown in FIG. 59A.

FIGS. 59A and 59B show a 512-Kbit block arrangement. FIG. 59A is a block diagram showing the arrangement, and FIG. 59B is a symbolic view. As shown in FIG. 59A, a block BLK is comprised of the cell array CellArray, the column gate 1stCOL3 on the first stage, the decoder ColDec2 for the column gate 1stCOL3 on the first stage, the row decoders RowDec2 and RowDec8, and the block decoder BlockDec.

FIGS. 60A and 60B show a 4-Mbit core 4 MbCORE made up of eight 512-Kbit blocks. FIG. 60A is a block diagram showing the arrangement, and FIG. 60B is a symbolic view. These eight blocks share the voltages VSWCi, VSWi, and VBBi, and the signals Mi/MiB, Fi, and Hi. The main bit-line MBL <0:127> and MBLRD are independent every eight blocks.

FIGS. 61A and 61B show a boot block BootBLK. FIG. 61A is a block diagram showing the arrangement, and FIG. 61B is a symbolic view. The boot block BootBLK is different from the block BLK in that the number of word-lines is 16, the number of row decoders RowDec2 is 16, and the number of signal lines which transfer the pre-decode signal pair Mi/Mib is 16, which are ⅛.

Figures 62A, 62B:
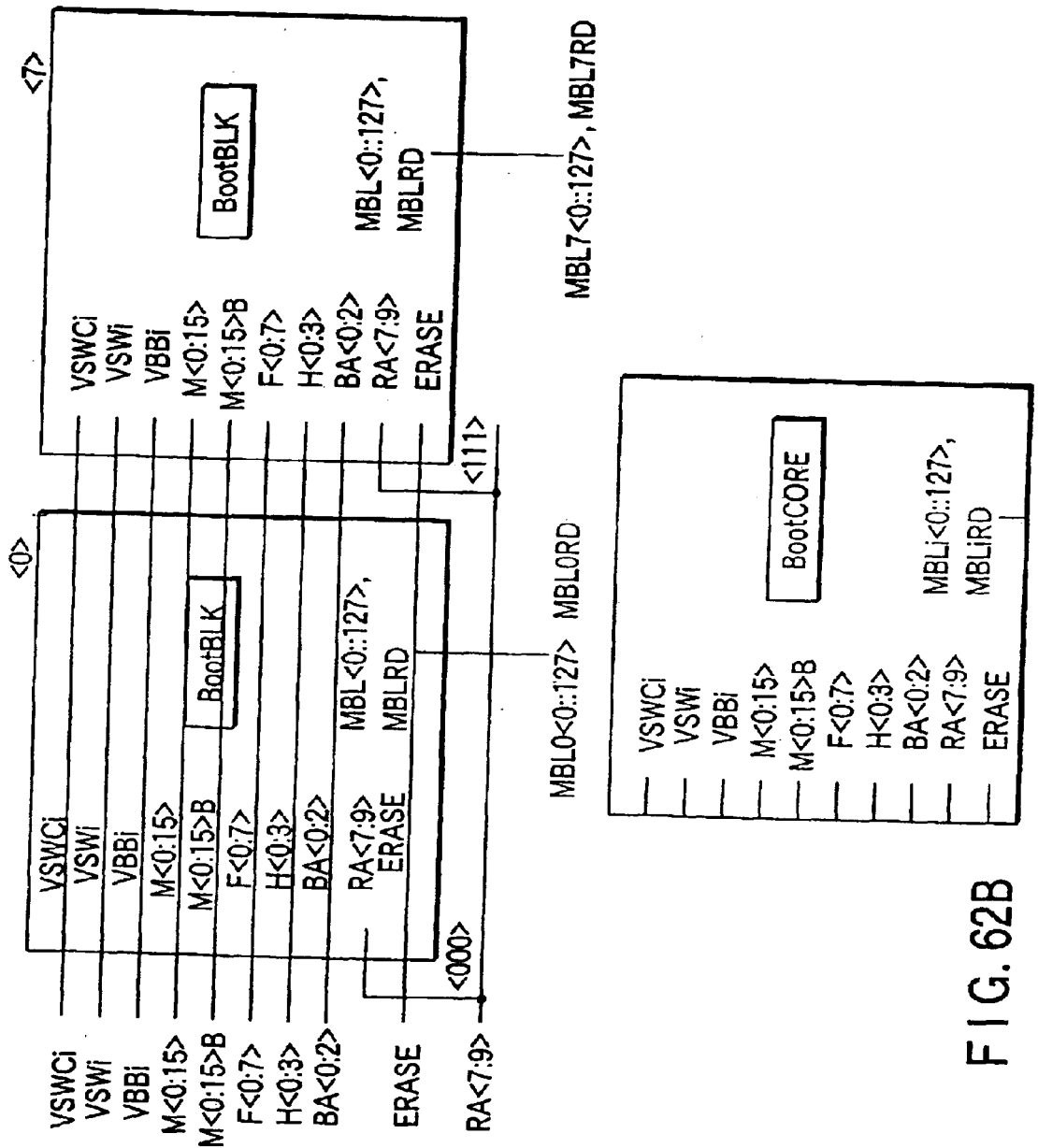
FIG. 62A is a block diagram showing the connection between eight boot blocks.
FIG. 62B is a symbolic view of the circuit shown in FIG. 62A.

FIGS. 62A and 62B show the connection between eight boot blocks BootBLK. These eight boot blocks BootBLK share the voltages VSWCi, VSWi, and VBBi, and the signals Mi/MiB, Fi, and Hi. The main bit-line MBL <0:127> and MBLRD are independent every eight blocks.

Figure 63:
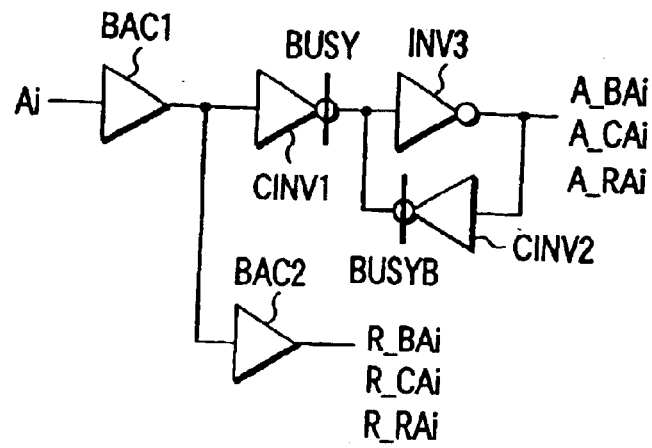
FIG. 63 is a circuit diagram showing an arrangement of an address buffer for the ith bit.

FIG. 63 is a circuit diagram showing an arrangement of an address buffer for the ith bit. This address buffer is constituted by buffer circuits BAC1 and BAC2, clocked inverters CINV1 and CINV2, and an inverter INV3. A signal BUSY changes to high level during execution of program or erase. Auto-addresses A_BA, RA, and CA do not receive any change in address pad Ai during auto-execution. R_BA, CA, and RA represent read addresses. An upper block address BA <3:4> is decoded into a main block address MBLK <0:3> whose timing is controlled by the signal BUSY or READE (this embodiment exemplifies a 16-Mbit flash memory).

Figure 64:
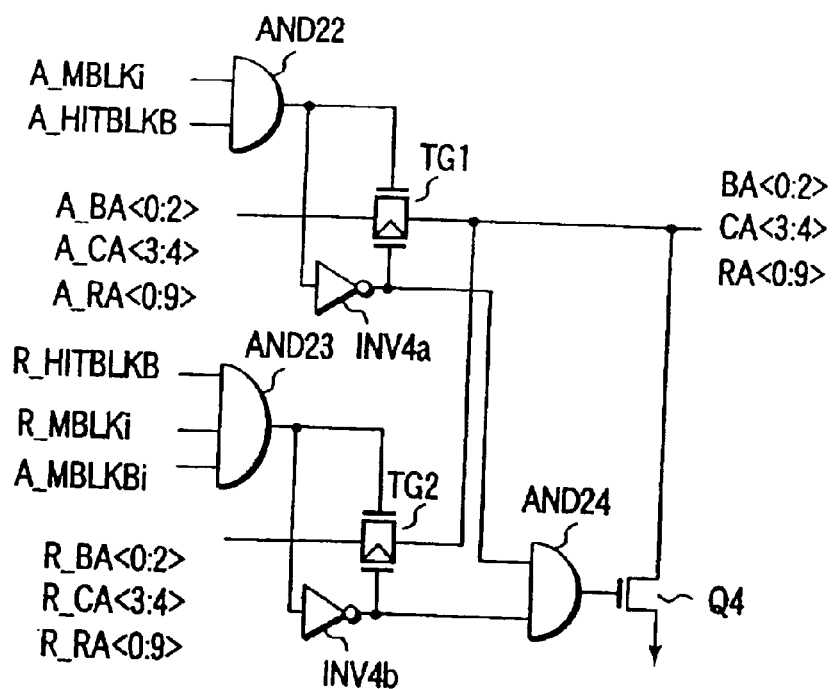
FIG. 64 is a circuit diagram showing an address switch.

FIG. 64 is a circuit diagram showing an address switch. This address switch is constituted by AND gates AND22, AND23, and AND24, transfer gates TG1 and TG2, inverters INV4a and INV4b, and an N-channel MOS transistor Q4. The address switch is arranged for each 4-Mbit core 4 MbCORE or boot core BootCORE. If a selected block is not replaced with a block redundancy, a signal A_HITBLKB or R_HITBLKB changes to high level, and the addresses BA, RA, and CA of a selected 4 MbCORE or BootCORE change to R_BA, RA, and CA for read. All the address signals of an unselected 4 MbCORE or BootCORE change to low level.

Figure 65:
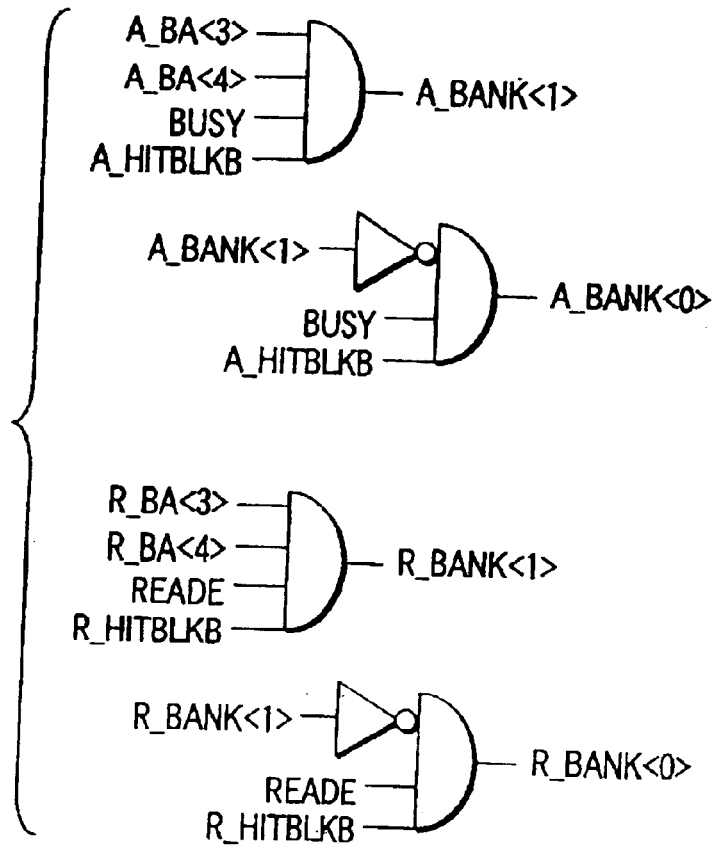
FIG. 65 is a circuit diagram showing an arrangement of a bank signal generation circuit.

FIG. 65 shows an arrangement of a bank signal generation circuit. This embodiment exemplifies a 2-bank arrangement. Upper 4 Mbits (BA <3>=BA <4>=H) belong to the first bank BANK1, and the remaining 12 Mbits belong to the second bank BANK0. Two signals BANK are prepared for auto-execution and read.

Figure 66A:
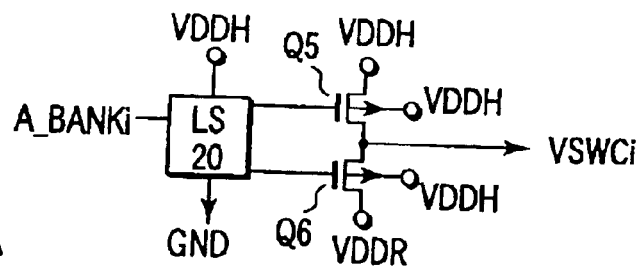
FIG. 66A is a circuit diagram showing an arrangement of a power switch.
Figure 66B:
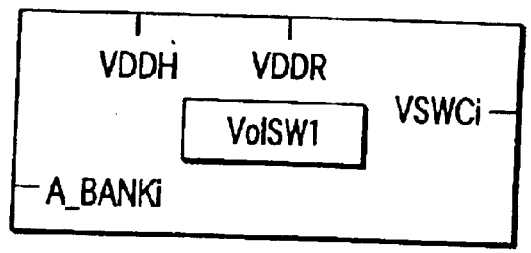
FIG. 66B is a symbolic view of the power switch shown in FIG. 66A.
Figure 67A:
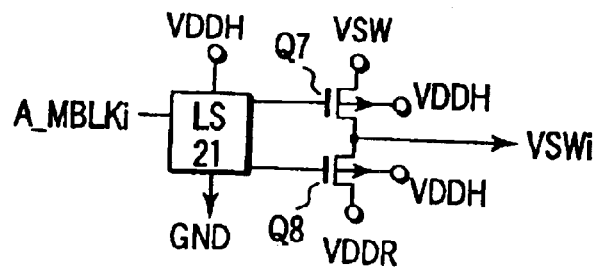
FIG. 67A is a circuit diagram showing an arrangement of another power switch.
Figure 67B:
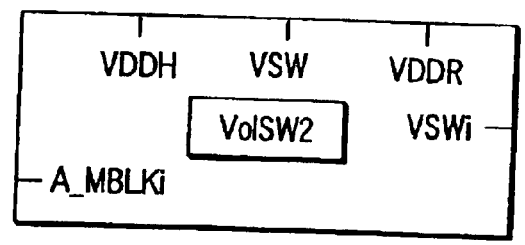
FIG. 67B is a symbolic view of the power switch shown in FIG. 67A.
Figure 68A:
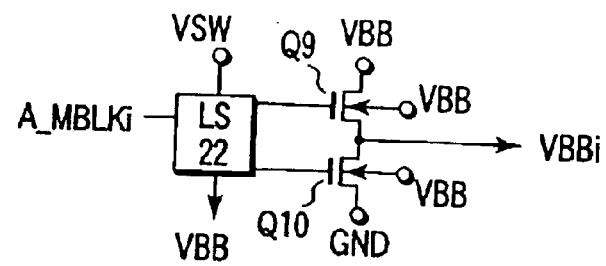
FIG. 68A is a circuit diagram showing an arrangement of still another power switch.
Figure 68B:
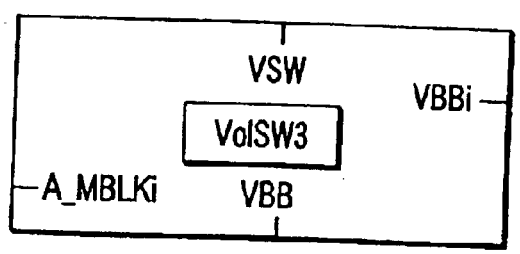
FIG. 68B is a symbolic view of the power switch shown in FIG. 68A.

FIGS. 66A and 66B, 67A and 67B, and 68A and 68B are power switches VolSW1, VolSW2, and VolSW3. FIGS. 66A, 67A, and 68A are circuit diagrams, and FIGS. 66B, 67B, and 68B are symbolic views. As shown in FIG. 66A, the power switch VolSW1 is made up of a level shifter LS20 and P-channel MOS transistors Q5 and Q6. As shown in FIG. 67A, the power switch VolSW2 is made up of a level shifter LS21 and P-channel MOS transistors Q7 and Q8. As shown in FIG. 68A, the power switch VolSW3 is made up of a level shifter LS22 and P-channel MOS transistors Q9 and Q10. A column power supply VSWC is switched every bank, whereas row power supplies VSW and VBB are switched every 4-Mbit core 4 MbCORE or boot core BootCORE.

Figure 69:
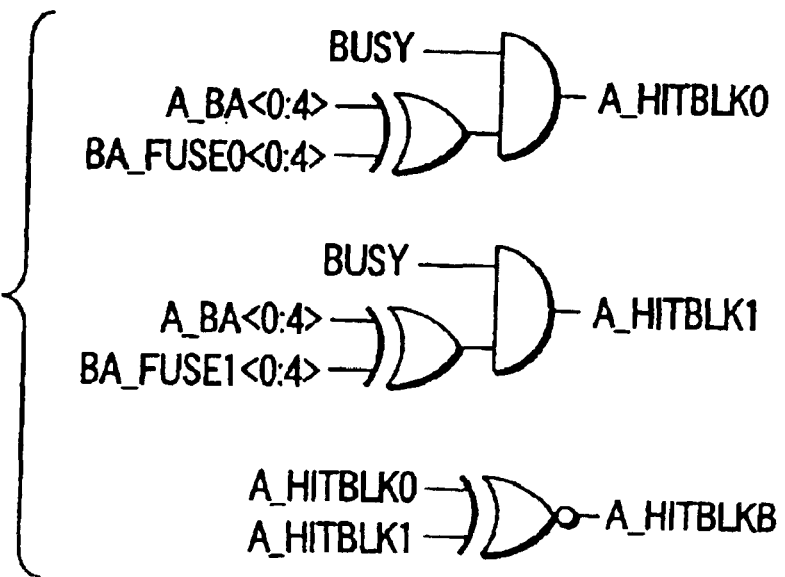
FIG. 69 is a circuit diagram showing an arrangement of a block redundancy control signal output circuit.
Figure 70:
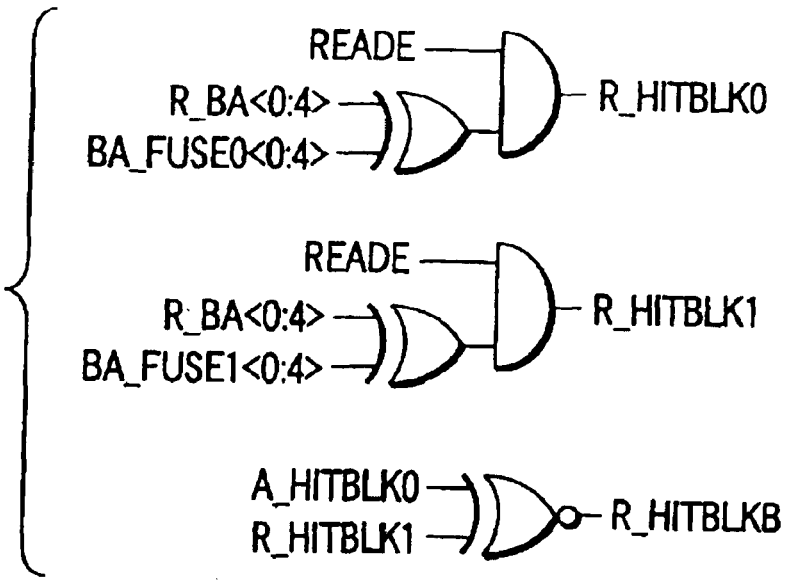
FIG. 70 is a circuit diagram showing another arrangement of the block redundancy control signal output circuit.

FIGS. 69 and 70 show arrangements of a block redundancy control signal output circuit. This embodiment exemplifies two redundancy blocks. When A_BA or R_BA coincides with redundancy address memory fuse data BA_FUSE0 <0:4> or BA_FUSE1 <0:4>, a signal HITBLK changes to high level. Also, two signals HITBLK are prepared for auto-execution and read.

Figure 71:
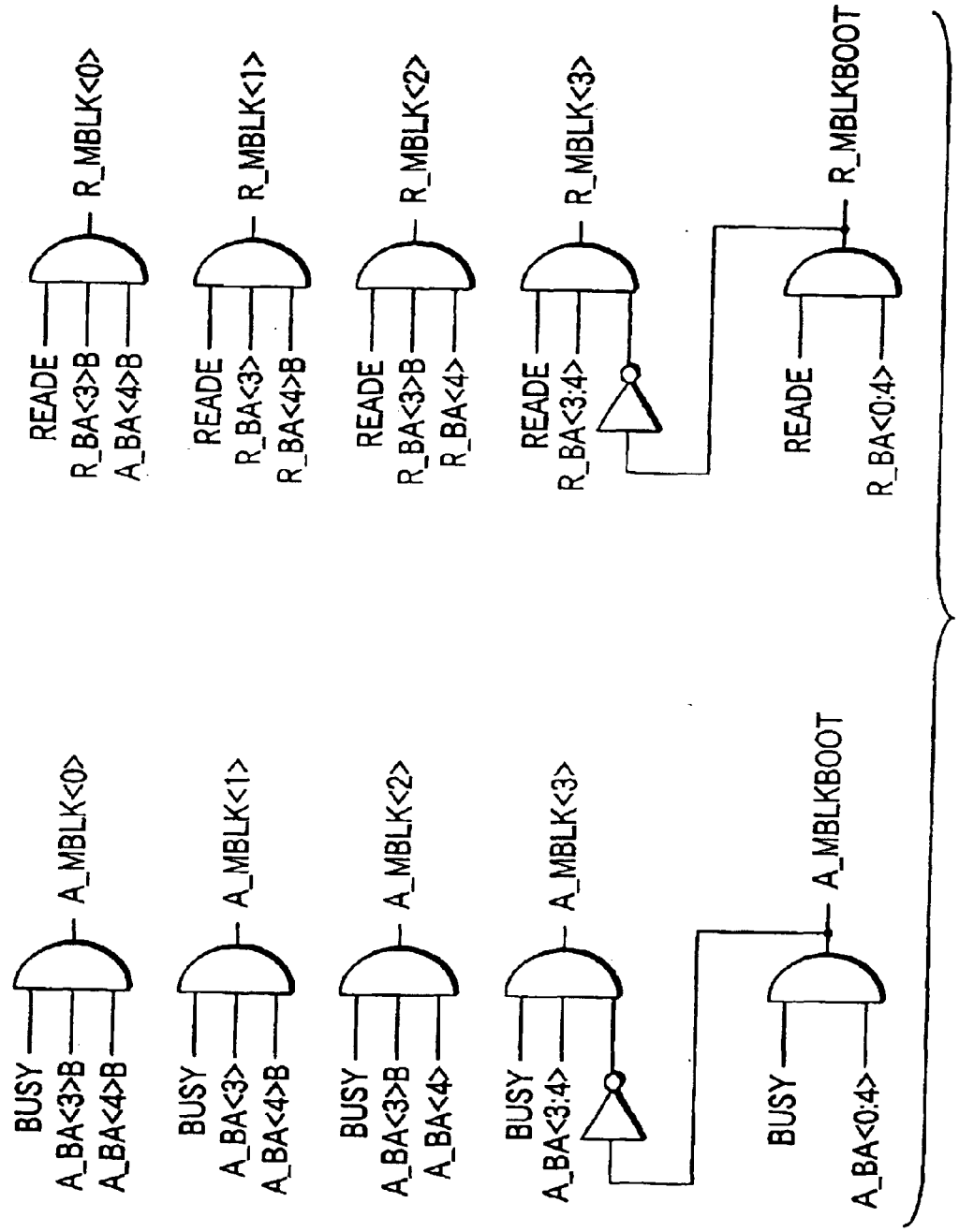

FIG. 71 shows a circuit which generates a main block address. A main block address signal MBLK output from this circuit acts as a signal which selects the 4-Mbit core 4 MbCORE or boot core BootCORE.

Figures 72A, 72B:
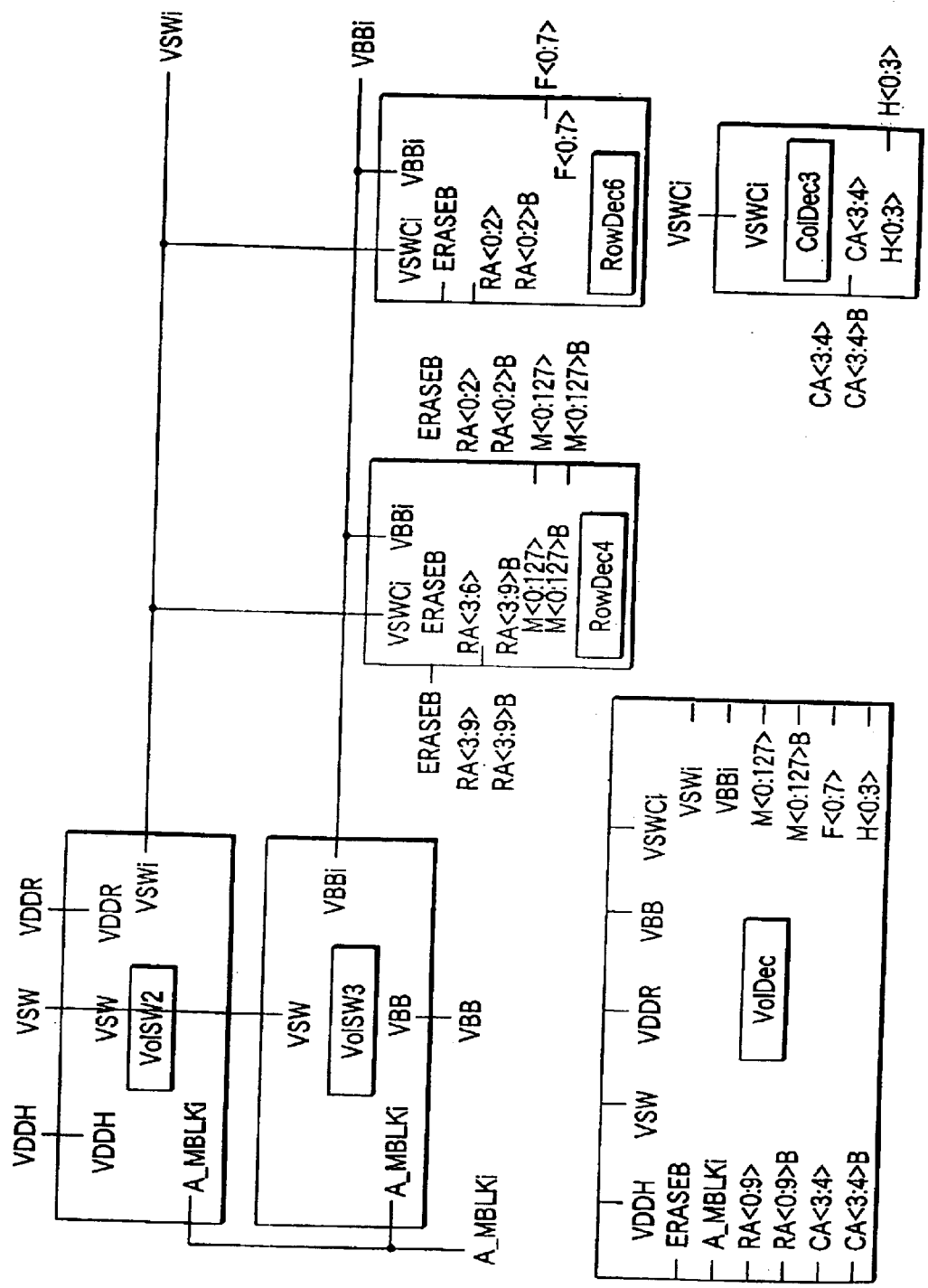

FIGS. 72A and 72B show an arrangement of the power switch & decoder VolDec arranged for each 4-Mbit core 4 MbCORE. As shown in FIG. 72A, the power switch & decoder VolDec comprises the power switches VolSW2 and VolSW3, row decoders RowDec4 and RowDec6, and column decoder ColDec3.

FIGS. 73A and 73B show a 4-Mbit power switch & decoder 4 MbCoreVolDec having the 4-Mbit core 4 MbCORE and power switch & decoder VolDec. FIG. 73A is a block diagram showing the arrangement, and FIG. 73B is a symbolic view. The power switch & decoder 4 MbCoreVolDec suppresses variations in the parasitic capacitance of the power supply regardless of selection/non-selection of a redundancy by changing the main body side address to a non-selection state and the main body power switch to a selection state when a block redundancy is selected.

As shown in FIG. 64, in the use of a block redundancy (HITBLK=H), all addresses input to the decoder are changed to a non-selection state and no voltage is applied to the memory cell. The power switches VolSW2 and VolSW3 shown in FIGS. 67A, 67B, 68A, and 68B are set in a selection state regardless of whether to execute redundancy replacement. This setting keeps the parasitic capacitances of the power supplies VSW and VBB as constant as possible. That is, when the power switch is changed to a non-selection state on the basis of redundancy information, the parasitic capacitance upon selecting a redundancy block corresponds to one block. To the contrary, the parasitic capacitance upon selecting no redundancy block corresponds to eight blocks. These parasitic capacitances exhibit a relatively large difference. A reprogram voltage is generated by a booster circuit, and the rise time greatly depends on the parasitic capacitance. A large change in parasitic capacitance depending on whether a redundancy is selected or not also greatly changes the rise time. As a result, the effective reprogram time changes, which means that reprogram conditions change depending on whether a redundancy block is selected or not.

If the power switch is changed to a selection state regardless of redundancy information, the parasitic capacitance upon selecting a redundancy block corresponds to nine blocks. The parasitic capacitance upon selecting no redundancy block corresponds to eight blocks. The difference between the parasitic capacitances is relatively small. Thus, reprogram conditions hardly change depending on whether a redundancy block is selected or not, and do not pose any characteristic problem.

This arrangement is almost free from variations in parasitic capacitance, and reprogram conditions are almost the same between the redundancy block cell and the main body cell.

FIGS. 74A and 74B show a boot core power switch & decoder VolDecBoot. FIG. 74A is a block diagram showing the arrangement, and FIG. 74B is a symbolic view. As shown in FIG. 74A, the boot core power switch & decoder VolDecBoot comprises the power switches VolSW2 and VolSW3, a boot block row decoder RowDec4Boot, the row decoder RowDec6, and the column decoder ColDec3.

Figure 75A:
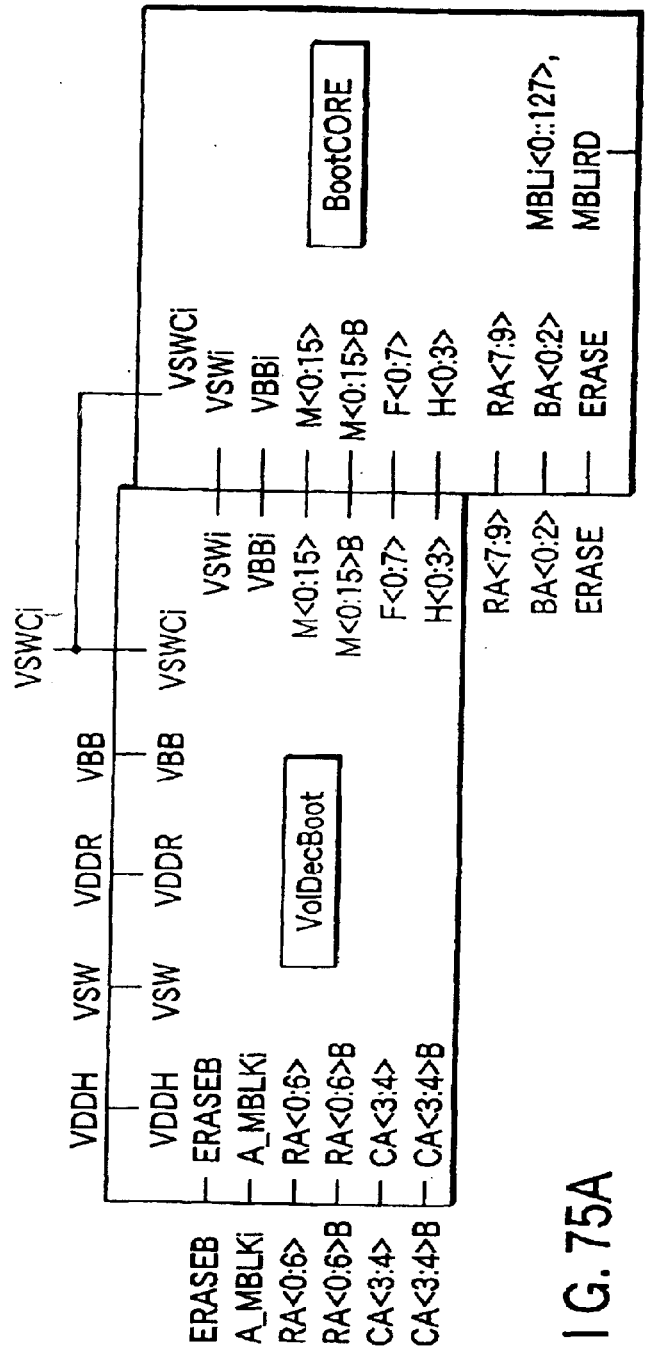
Figure 75B:
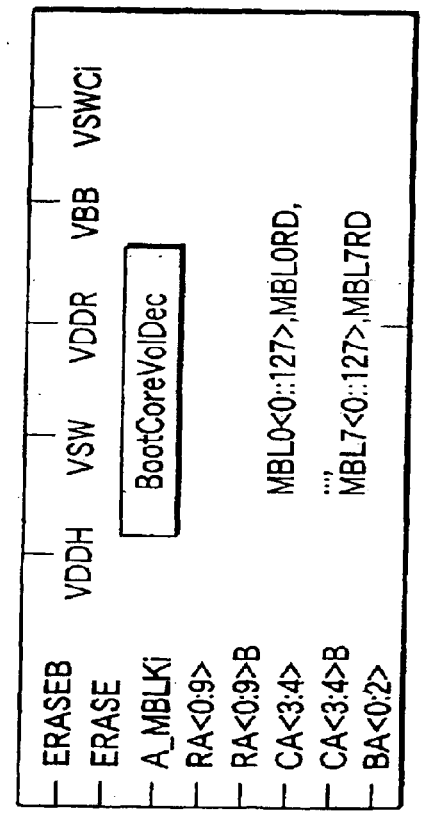

FIGS. 75A and 75B show a boot core power switch & decoder BootCoreVolDec made up of the boot core BootCORE and boot core power switch & decoder VolDecBoot. FIG. 75A is a block diagram showing the arrangement, and FIG. 75B is a symbolic view. In the boot core power switch & decoder BootCoreVolDec, as shown in FIG. 75A, an output signal from the boot core power switch & decoder VolDecBoot is supplied to the boot core BootCORE.

FIG. 76 shows the decoder arrangement of the bank BANK0. The bank BANK0 is constructed by the power switch VolSW1, 4-Mbit power switch & decoder 4 MbCoreVolDec, and decoder ColDec9.

FIG. 77 is a symbolic view of the decoder of the bank BANK0 shown in FIG. 76. FIG. 77 shows the core arrangement of the bank BANK0. In this example, one 4-Mbit portion and the boot portion share a main bit-line.

FIGS. 78A and 78B show a power switch & decoder Bank1CoreVolDec of the bank BANK1. FIG. 78A is a block diagram showing the arrangement, and FIG. 78B is a symbolic view. As shown in FIG. 78A, the power switch & decoder Bank1CoreVolDec of the bank BANK1 comprises the 4-Mbit power switch & decoder 4 MbCoreVolDec and boot core power switch & decoder BootCoreVolDec.

FIG. 79 shows the decoder arrangement of the bank BANK1. The bank BANK1 is constituted by the power switch VolSW1, power switch & decoder Bank1CoreVolDec, and boot decoder ColDec9Boot.

FIG. 80 is a symbolic view of the decoder of the bank BANK1 shown in FIG. 79. FIG. 80 shows the core arrangement of the bank BANK1.

FIGS. 81A to 81C show a block redundancy column decoder. The column decoder comprises the global decoder ColGlobalDec shown in FIG. 81A, the decoder ColDec8 shown in FIG. 81B, and the block redundancy decoder ColDec9BLKRD shown in FIG. 81C.

On the main body side, the global decoder ColGlobalDec is arranged for eight blocks. By contrast, the redundancy block is arranged for a 512-Kbit block so as to enable replacement with an arbitrary block.

FIGS. 82A and 82B show the connection between the power switch & decoder VolDec of the redundancy block and the block BLK. FIG. 82A is a block diagram showing the arrangement, and FIG. 82B is a symbolic view of a connection circuit BLKRDVolDec.

FIG. 83 shows the arrangement of the decoder of the redundancy block. This decoder comprises the power switch VolSW1 shown in FIGS. 66A and 66B, the connection circuit BLKRDVolDec between the power switch & decoder VolDec of the redundancy block and the block BLK shown in FIGS. 82A and 82B, and the block redundancy decoder ColDec9BLKRD.

In this way, the redundancy block has a dedicated power switch, row decoder, and column decoder.

FIG. 84 is a symbolic view of a decoder RDBLK of the redundancy block shown in FIG. 83.

FIGS. 85A to 85D are block diagrams showing the arrangement of a 16-Mbit flash memory core with a 4-Mbit+12-Mbit 2-bank structure having two redundancy blocks. In this case, 64+1 read data-lines and 16+1 auto data-lines are commonly connected between two redundancy blocks and two banks.

FIG. 86 is a symbolic view of a 16-Mbit core 16 MbCORE shown in FIGS. 85A to 85D.

FIG. 87 is a circuit diagram showing an arrangement of a column redundancy circuit. FIG. 87 shows two replaceable circuits. The auto circuit compares memory data at all block addresses and all column addresses, and when all the addresses coincide with each other, outputs a signal HITCOL. The read circuit compares all block addresses and a page address (other than lower 2 bits of 4 words/page in this embodiment) CA <2:4>, and when all the addresses coincide with each other, outputs a signal HITCOL. Of 4-bit fuse data R_IO_FUSE <0:3> which represents an I/O and is to be replaced with memory data CA_FUSE <0:1> at a column address CA <0:1> in the page, fuse data of a hit set are selected and sent to a sense amplifier data multiplexer (to be described later).

FIG. 88 shows a sense amplifier and a circuit which latches sensed data. The output terminal of a sense amplifier SA1 is connected to a latch circuit made up of clocked inverters CINV3 and CINV4 and an inverter INV5. For read, 65 latch circuits are arranged for blocks including redundancy blocks. A latch signal LAT is activated at a timing shown in FIG. 102 (to be described later).

FIG. 89 shows a sense amplifier for read and a sense amplifier for program and verify. A read sense amplifier Read S/A is constructed by 128 sense amplifier circuits Sense amp., 16 current converters, and one reference current converter. A verify sense amplifier Verify S/A is constructed by 16 sense amplifier circuits Sense amp. and two current converters.

A reference cell is shared between the read sense amplifier Read S/A and the verify sense amplifier Verify S/A. The reference cell is divided into read and verify sections by the reference current converter. The reference current converter is shared between eight sense amplifiers, and suppresses the area penalty even for a flash memory with a page mode.

The use of the read and program verify sense amplifiers with the above arrangement can prevent any decrease in the verify margin of the main body cell caused by variations in reference cell because the reference cell is shared between these sense amplifiers.

FIGS. 90 and 91 show circuits which latch column redundancy fuse data. The latch circuit shown in FIG. 90 is made up of clocked inverters CINV5 and CINV6 and an inverter INV6. The latch circuit shown in FIG. 91 is comprised of clocked inverters CINV7 and CINV8 and an inverter INV7. A latch signal FLAT is activated at a timing shown in FIG. 102 (to be described later).

FIG. 92 shows a circuit which generates a signal R_HITIOi for replacing I/O data designated by a signal R_IO_FS <0:3> with a signal SAORD by multiplexers shown in FIGS. 93 and 94 when outputting a word whose page offset address R_CA <0:1> and fuse data R_CA_FS <0:1> coincide with each other. This circuit comprises an exclusive OR gate EXOR, inverter INV8, and AND gate AND25. In this embodiment, only 1 bit in 4 words/page can be replaced. Using two each of signals R_CA_FS <0:1>, R_HITIO, and SAORD enables replacing 2 bits in the page.

The multiplexer shown in FIG. 93 is formed from an AND gate AND26. The multiplexer shown in FIG. 94 is made up of an inverter INV9, AND gates AND27 to AND30, N-channel MOS transistors MQ1 to MQ5, and a buffer BAC3.

FIG. 95 is a circuit diagram showing an arrangement of a data latch circuit which latches program data. The data latch circuit comprises clocked inverters CINV9 and CINV10 and an inverter INV10.

FIG. 96 is a circuit diagram showing an arrangement of a sense latch circuit which performs program or erase verify. The sense latch circuit comprises a sense amplifier SA2, clocked inverters CINV11 and CINV12, and an inverter INV11.

FIG. 97 is a circuit diagram showing an arrangement of a circuit which performs column redundancy in auto operation. This circuit comprises N-channel MOS transistors CQ1 and CQ2, an inverter INV12, and an AND gate AND31.

FIG. 98 is a circuit diagram showing a circuit which outputs an end signal PEND for designating the end of program when program data PDATAi and a verify result PSAOi completely coincide with each other. This circuit includes exclusive OR gates PEXOR0 to PEXOR16 and an AND gate AND32.

FIG. 99 is a circuit diagram showing a circuit which transfers target I/O data to PDATARD upon column redundancy replacement. This circuit comprises an inverter INV13 and NAND gates NAND1 and NAND2.

FIG. 100 is a circuit diagram showing an arrangement of a program load circuit connected to an auto data-line. This circuit includes a NOR gate NOR1, level shifter LS23, and N-channel MOS transistor PQ1. The data-line is set to float for program data PDATA "1" and receives a program voltage VDDP for program data PDATA "0".

FIG. 101 is a timing chart showing operation waveforms representing program operation. A bank including a selected address changes to a program-selected state. A word-line WL and bit-line BL change to a program bias state or program verify state.

FIG. 102 is a timing chart showing operation waveforms representing read operation. A bank in which program or erase is not in progress can be accessed. If read page addresses A2 to A19 are switched, a pulse-like address transition detection signal ATD is output depending on the transition. Page data is sensed by a sense amplifier, and 4-word data is latched by a pulse signal LAT generated from the signal ATD. One word designated by page addresses A0 and A1 is output from an I/O pad. No signal ATD is output by only subsequent A0/A1 switching. Latched data is multiplexed to output data from the I/O pad.

Table 2 shows the voltage values of internal power supplies in respective internal operations.

TABLE 2

|  | VDDR | VDDH | VDDP | VSW | VBB |
|---|---|---|---|---|---|
| Read | 5 V | 5 V | Vcc | 5 V | 0 V |
| Program | 5 V | 10 V | 5 V | 10 V | 0 V |
| Program verify | 5 V | 10 V | Vcc | 6.5 V | 0 V |
| Erase | 5 V | 10 V | Vcc | 2.5 V | −7.5 V |
| Erase Verify | 5 V | 10 V | Vcc | 3.5 V | −2 V |

A read word-line voltage VDDR maintains the same level in any operation state. VDDH is always 10 V except for the read mode, and generates VSW which gives a selection word-line level. VDDP generates 5 V only in program. VBB generates a word-line level in erase, and −2 V in erase verify.

Table 3 shows the bias relationship between selected and unselected word- and bit-lines in a selected block in respective operation states, and the bias relationship between the word- and bit-lines in an unselected block.

TABLE 3

|  | Selected | | | Unselected | | Unselected block | | |
| --- | --- | --- | --- | --- | --- | --- | --- | --- |
|  | WL | BL | Well | WL | BL | WL | BL | Well |
| Read | VDDR | 1 V | 0 V | 0 V | floating | 0 V | floating | 0 V |
| Program | VSW | VDDP | 0 V | 0 V | floating | 0 V | floating | 0 V |
| Program verify | VSW | 1 V | 0 V | 0 V | floating | 0 V | floating | 0 V |
| Erase | VBB | floating | VDDH | — | — | 0 V | floating | 0 V |
| Erase Verify | VSW | 1 V | 0 V | 0 V | floating | 0 V | floating | 0 V |

As has been described above, one aspect of the present invention can suppress the decoder area overhead of a nonvolatile semiconductor memory having a page mode (page read function) with a plurality of banks, thereby reducing the chip cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a first and second nonvolatile memory banks;
   a data-line for read and a data-line for program and verify which are arranged in a region between said first and second nonvolatile memory banks and selectively connected to bit-lines of said first and second nonvolatile memory banks, said data-line for read and said data-line for program and verify being shared between said first and second nonvolatile memory banks;
   a reference current generator configured to generate a first voltage dependent upon a current flowing through a reference cell;
   first current converters to which the first voltage is input, each configured to generate a second voltage,
   second current converters to which the first voltage is input, each configured to generate a third voltage,
   sense amplifiers for read, first terminals respectively connected to a data-line for read, and second terminals respectively applied with the second voltage each generated by said first current converters, each configured to output data of a selection memory cell comparing a voltage of the data-line for read with the second voltage;
   sense amplifiers for program and verify, first terminals respectively connected to data-line for program and verify, and second terminals respectively being applied with the third voltage generated by said second current converters, each configured to output program and verify data of the selection memory cell, comparing a voltage of the data-line for program and verify with the third voltage; and
   a program circuit connected to said data-line for program and verify.

2. A nonvolatile semiconductor memory comprising:
   a nonvolatile memory block matrix in which a plurality of nonvolatile memory blocks are arrayed in a matrix in X and Y directions, each of said plurality of nonvolatile memory blocks having a first nonvolatile memory element, a first word-line and a first bit-line connected to said first nonvolatile memory element, a first row decoder connected to said first word-line, a first column decoder connected to said first bit-line, and a block decoder connected to said first row decoder and said first column decoder;
   a second word-line connected to said first row decoder;
   a second bit-line connected to said first column decoder;
   a second row decoder connected to said second word-line;
   second and third column decoders connected to said second bit-line;
   a first data line connected to said second column decoder;
   a second data line connected to said third column decoder;
   a reference current generator configured to generate a first voltage dependent upon a current flowing through a reference cell;
   first current converters to which the first voltage is input, each configured to generate a second voltage;
   second current converters to which the first voltage is input, each configured to generate a third voltage;
   first sense amplifiers, first terminals respectively being connected to a first data-line, and second terminals respectively being applied with the second voltage each generated by said first current converters, configured to output first data of a selection memory cell comparing a voltage of the first data-line with the second voltage, and
   second sense amplifiers, first terminals respectively being connected to a second data-line, and second terminals respectively being applied with the third voltage generated by said second current converters, configured to output second data of the selection memory cell, comparing a voltage of the second data-line with the third voltage.

3. A nonvolatile semiconductor memory comprising:
   first and second nonvolatile memory banks, each of said first and second nonvolatile memory banks having a first word-line, a first row decoder connected to said first word-line, a first bit-line, a first redundancy bit-line, and first and second column decoders connected to said first bit-line and said first redundancy bit-line;
   nonvolatile memory block matrices which are respectively arranged in said first and second nonvolatile memory banks and have a plurality of nonvolatile memory blocks arrayed in a matrix in X and Y directions, each of said plurality of nonvolatile memory blocks having a first nonvolatile memory element, a first redundancy nonvolatile memory element, a second word-line and a second bit-line connected to said first nonvolatile memory element, a second word-line and a second redundancy bit-line connected to said first redundancy nonvolatile memory element, a second row decoder connected to said first and second word-lines, a third column decoder connected to said second bit-line and said second redundancy bit-line, and a block decoder connected to said second row decoder and said third column decoder;

a first data-line commonly connected to said first column decoder of said first nonvolatile memory bank and said first column decoder of said second nonvolatile memory bank;

a second data-line commonly connected to said second column decoder of said first nonvolatile memory bank and said second column decoder of said second nonvolatile memory bank;

a reference current generator configured to generate a first voltage dependent upon a current flowing through a reference cell;

first current converters to which the first voltage is input, each configured to generate a second voltage;

second current converters to which the first voltage is input, each configured to generate a third voltage, first sense amplifiers, first terminals respectively being connected to a first data-line, and second terminals respectively being applied with the second voltage each generated by said first current converters, configured to output first data of a selection memory cell comparing a voltage of the first data-line with the second voltage; and second sense amplifiers, first terminals respectively being connected to a second data-line, and second terminals respectively being applied with the third voltage generated by said second current converters, configured to output second data of the selection memory cell, comparing a voltage of the second data-line with the third voltage.

4. A semiconductor memory comprising:

a reference current generator configured to generate a first voltage dependent upon a current flowing through a reference cell;

first current converters to which the first voltage is input, each configured to generate a second voltage, second current converters to which the first voltage is input, each configured to generate a third voltage;

sense amplifiers for read, first terminals respectively being connected to a data-line for read, and second terminals respectively being applied with the second voltage each generated by said first current converters, configured to output data of a selection memory cell comparing a voltage of the a data-line for read with the second voltage; and sense amplifiers for verify, first terminals respectively being connected to verify data lines, and second terminals respectively being applied with the third voltage generated by said second current converters, configured to output verify data of the selection memory cell, comparing a voltage of the data-line for program and verify with the third voltage.

5. The semiconductor memory according to claim 4, wherein a number of the first current converters is smaller than that of the data-line for read.

6. The semiconductor memory according to claim 4, wherein a number of the second current converters is smaller than that of the data-line for verify.

7. The semiconductor memory according to claim 4, wherein a bias voltage is input to the reference current generator, and a drain voltage of a reference cell is dependent upon the bias voltage.

8. The semiconductor memory according to claim 7, wherein the bias voltage is input to the sense amplifiers for read, and a drain voltage of a memory cell is dependent upon the bias voltage.

9. The semiconductor memory according to claim 8, wherein the bias voltage is input to the first and second current converters.

10. The semiconductor memory according to claim 4, wherein a gate voltage of the reference cell is equal to the voltage of word-lines at a time of reading the memory cell.

* * * * *